(12) United States Patent
Strasser et al.

(10) Patent No.: US 9,361,029 B2
(45) Date of Patent: *Jun. 7, 2016

(54) SYSTEM, METHOD, AND APPARATUS FOR IMPROVING THE UTILITY OF STORAGE MEDIA

(71) Applicant: Longitude Enterprise Flash S.a.r.l., Luxembourg (LU)

(72) Inventors: John Strasser, Kaysville, UT (US); David Flynn, Sandy, UT (US); Jeremy Fillingim, Salt Lake City, UT (US); Robert Wood, Niwot, CO (US); Jea Hyun, Los Altos, CA (US); Hairong Sun, Superior, CO (US)

(73) Assignee: SANDISK TECHNOLOGIES, INC., Plano, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 14/611,088

(22) Filed: Jan. 30, 2015

(65) Prior Publication Data

US 2015/0149817 A1 May 28, 2015

Related U.S. Application Data

(63) Continuation of application No. 14/486,974, filed on Sep. 15, 2014, now Pat. No. 8,982,619, which is a continuation of application No. 14/106,566, filed on Dec. 13, 2013, now Pat. No. 8,873,286, which is a (Continued)

(51) Int. Cl.
*G06F 13/00* (2006.01)
*G06F 3/06* (2006.01)
(Continued)

(52) U.S. Cl.
CPC ............ *G06F 3/0614* (2013.01); *G06F 3/0629* (2013.01); *G06F 3/0679* (2013.01); *G06F 11/0793* (2013.01); *G06F 11/1068* (2013.01); *G06F 11/26* (2013.01); *G06F 12/0246* (2013.01); *G11C 11/56* (2013.01); *G11C 16/26* (2013.01); *G11C 16/28* (2013.01);
(Continued)

(58) Field of Classification Search
USPC ............. 365/185.03, 185.09, 185.11, 185.12, 365/185.17, 185.18, 185.24, 185.29, 365/185.33; 711/100, 102, 103, 104, 105, 711/114, 170
See application file for complete search history.

(56) References Cited

U.S. PATENT DOCUMENTS

2007/0189073 A1  8/2007  Aritome
2008/0316816 A1  12/2008  Lin
(Continued)

FOREIGN PATENT DOCUMENTS

JP     2004296040    3/2003
JP     2004062922    2/2004

*Primary Examiner* — Trong Phan
(74) *Attorney, Agent, or Firm* — Kunzler Law Group, PC

(57) ABSTRACT

One method for improving the utility of solid-state storage media within a solid state storage device includes referencing one or more storage media characteristics for a set of storage cells of the solid-state storage media. The method also includes determining a configuration parameter for the set of storage cells based on the one or more storage media characteristics. The method includes configuring the set of storage cells to use the determined configuration parameter. The configuration parameter includes a parameter of the set of storage cells modifiable by a module external to the solid-state storage device by way of an interface. The module external to the solid-state storage device includes a device driver executing on a host device.

24 Claims, 14 Drawing Sheets

Related U.S. Application Data continuation of application No. 13/719,045, filed on Dec. 18, 2012, now Pat. No. 8,661,184, which is a continuation-in-part of application No. 13/189,402, filed on Jul. 22, 2011, now Pat. No. 8,380,915, which is a continuation-in-part of application No. 13/015,458, filed on Jan. 27, 2011, now Pat. No. 8,315,092, and a continuation-in-part of application No. 13/175,637, filed on Jul. 1, 2011, now Pat. No. 8,266,503.

(60) Provisional application No. 61/298,861, filed on Jan. 27, 2010, provisional application No. 61/305,205, filed on Feb. 17, 2010.

(51) Int. Cl.
| | |
|---|---|
| *G06F 12/02* | (2006.01) |
| *G11C 11/56* | (2006.01) |
| *G11C 16/28* | (2006.01) |
| *G11C 29/02* | (2006.01) |
| *G11C 29/42* | (2006.01) |
| *G11C 16/34* | (2006.01) |
| *G11C 29/50* | (2006.01) |
| *G06F 11/10* | (2006.01) |
| *G11C 16/26* | (2006.01) |
| *G06F 11/26* | (2006.01) |
| *G06F 11/07* | (2006.01) |
| *G11C 16/00* | (2006.01) |
| *G11C 29/04* | (2006.01) |

(52) U.S. Cl.
CPC ........ *G11C16/3404* (2013.01); *G11C 16/3418* (2013.01); *G11C 29/02* (2013.01); *G11C 29/026* (2013.01); *G11C 29/028* (2013.01); *G11C 29/42* (2013.01); *G11C 29/50016* (2013.01); *G11C 16/00* (2013.01); *G11C 2029/0409* (2013.01)

(56) References Cited

U.S. PATENT DOCUMENTS

| | | |
|---|---|---|
| 2009/0282186 A1 | 11/2009 | Mokhlesi et al. |
| 2010/0161888 A1 | 6/2010 | Eggleston |
| 2012/0063231 A1 | 3/2012 | Wood et al. |
| 2013/0031430 A1 | 1/2013 | Sharon |
| 2013/0031431 A1 | 1/2013 | Sharon et al. |

700 ↘

702 ↘

| | Media Characteristics 704 | | | | |
|---|---|---|---|---|---|
| Storage Region 706 | P/E Cycle Count 704a | Read Count 704b | Retention Time 704c | Temperature 704d | Bit Error Rate 704e |
| LEB 0 | 1.0k | 2.0k | 20 min | 47°C | 1.2E-4 |
| LEB 1 | 1.2k | 4.1k | 50 min | 44°C | 1.5E-4 |
| LEB 2 | 0.7k | 0.5k | 100 min | 43°C | 1E-4 |
| LEB 3 | 1.5k | 2k | 40 min | 46°C | 2E-4 |
| LEB 4 | 2.0k | 3.5k | 100 min | 43°C | 2.5E-4 |
| ⋮ | ⋮ | ⋮ | ⋮ | ⋮ | ⋮ |
| LEB N | 0.8k | 1.3k | 10 min | 48°C | 9.7E-5 |

708 markers on each row

| | Configuration Parameters 804 | | |
|---|---|---|---|
| Storage Region 706 | Read Level R1 804a | Read Level R2 804b | Read Level R3 804c |
| LEB 0 | 01h | 01h | 02h |
| LEB 1 | 02h | 02h | 04h |
| LEB 2 | FEh | FEh | FCh |
| LEB 3 | 02h | 01h | 02h |
| LEB 4 | FDh | FDh | FAh |
| ⋮ | ⋮ | ⋮ | ⋮ |
| LEB N | 04h | 03h | 05h |

SYSTEM, METHOD, AND APPARATUS FOR IMPROVING THE UTILITY OF STORAGE MEDIA

CROSS-REFERENCE TO RELATED APPLICATIONS

This application is a continuation of and claims priority to U.S. patent application Ser. No. 14/486,974 entitled "MANAGING NON-VOLATILE MEDIA" and filed on Sep. 15, 2014 for John Strasser, et al., which issued as U.S. Pat. No. 8,982,619, which is a continuation of and claims priority to U.S. patent application Ser. No. 14/106,566 entitled 'MANAGING NON-VOLATILE" and filed on Dec. 13, 2013 for John Strasser, et al., which issued as U.S. Pat. No. 8,873,286, which is a continuation of and claims priority to U.S. application Ser. No. 13/719,045 entitled "MANAGING NON-VOLATILE MEDIA" and filed on Dec. 18, 2012 for Robert Wood, et al., which issued as U.S. Pat. No. 8,661,184, which is a continuation-in-part of and claims priority to U.S. patent application Ser. No. 13/189,402 entitled "APPARATUS, SYSTEM, AND METHOD FOR DETERMINING A CONFIGURATION PARAMETER FOR SOLID-STATE STORAGE MEDIA" and filed on Jul. 22, 2011 for Robert Wood, et al. which issued as U.S. Pat. No. 8,380,915, which claims priority to U.S. patent application Ser. No. 13/015,458 entitled "APPARATUS, SYSTEM, AND METHOD FOR DETERMINING A READ VOLTAGE THRESHOLD" and filed on Jan. 27, 2011 for John Strasser, et al. which issued as U.S. Pat. No. 8,315,092 and U.S. patent application Ser. No. 13/175,637 entitled "APPARATUS, SYSTEM, AND METHOD FOR USING MULTI-LEVEL CELL STORAGE IN A SINGLE-LEVEL CELL MODE" and filed on Jul. 1, 2011 for Robert Wood, et al. which issued as U.S. Pat. No. 8,266,503, each of which are incorporated herein by reference; U.S. patent application Ser. No. 13/015,458 claims priority to U.S. Provisional Patent Application No. 61/298,861 entitled "APPARATUS, SYSTEM, AND METHOD FOR DETERMINING A READ VOLTAGE THRESHOLD FOR SOLID-STATE STORAGE MEDIA" and filed on Jan. 27, 2010 for John Strasser, et al. and to U.S. Provisional Patent Application No. 61/305,205 entitled "APPARATUS, SYSTEM, AND METHOD FOR DETERMINING A READ VOLTAGE THRESHOLD FOR SOLID-STATE STORAGE MEDIA" and filed on Feb. 17, 2010 for John Strasser, et al., each of which are incorporated herein by reference.

TECHNICAL FIELD

The subject matter disclosed herein relates to non-volatile media and more particularly relates to configuration parameters for non-volatile media.

BACKGROUND

Many non-volatile storage devices distinguish between different binary values that a storage cell may store based on a read voltage level of the storage cell, based on a resistivity of the storage cell, or based on another configuration parameter of the storage cell. Non-volatile storage devices may use one or more read voltage thresholds, resistivity thresholds, or the like to separate discrete values that may be stored in a storage cell.

Stored values, read voltage levels, resistivity, or the like, however, can shift over time. For example, storage cell damage, storage cell leakage, temperature, and other disturbances to storage cells can alter for the state of storage cells, making different configuration parameters more optimal for the storage cells. The rate of leakage and other disturbances can also increase with age as storage cells are used over time. If the read voltage level or other configuration parameter of a storage cell shifts past a threshold for the storage cell, a data error occurs, as the value of the data read from the storage cell is different than the value of the data written to the storage cell.

SUMMARY

A method is presented to manage non-volatile media. In one embodiment, a method includes determining a configuration parameter for a set of storage cells of a solid state recording medium. A method, in a further embodiment, includes reading data from a set of storage cells using a determined configuration parameter. In certain embodiments, a method includes adjusting a configuration parameter based on read data.

An apparatus is presented to manage non-volatile media. In one embodiment, a configuration parameter module is configured to determine a read voltage threshold for one or more NAND flash storage cells. A storage cell configuration module, in certain embodiments, is configured to configure one or more storage cells to use a determined read voltage threshold. In a further embodiment, an adjustment module is configured to adjust a read voltage threshold based on closed loop feedback from one or more NAND flash storage cells.

Another apparatus is presented to manage non-volatile media. In one embodiment, an apparatus includes means for detecting an uncorrectable error in data read from a set of non-volatile memory cells. An apparatus, in a further embodiment, includes means for iteratively adjusting one or more read voltage thresholds for a set of memory cells and re-reading data from the set of memory cells until an uncorrectable error in the data is correctable.

References throughout this specification to features, advantages, or similar language do not imply that all of the features and advantages may be realized in any single embodiment but are to be understood to mean that a specific feature, advantage, or characteristic is included in at least one embodiment. The described features, advantages, and characteristics of the embodiments may be combined in any suitable manner and may be practiced without one or more of the specific features or advantages of a particular embodiment. In other instances, additional features and advantages may be recognized in certain embodiments that may not be present in all embodiments.

BRIEF DESCRIPTION OF THE DRAWINGS

In order that the advantages of the disclosure will be readily understood, a more particular description of the disclosure will be rendered by reference to specific embodiments that are illustrated in the appended drawings. Understanding that these drawings depict only typical embodiments and are not therefore to be considered to be limiting of its scope, the disclosure will be described and explained with additional specificity and detail through the use of the accompanying drawings, in which.

DETAILED DESCRIPTION

Figure 1:
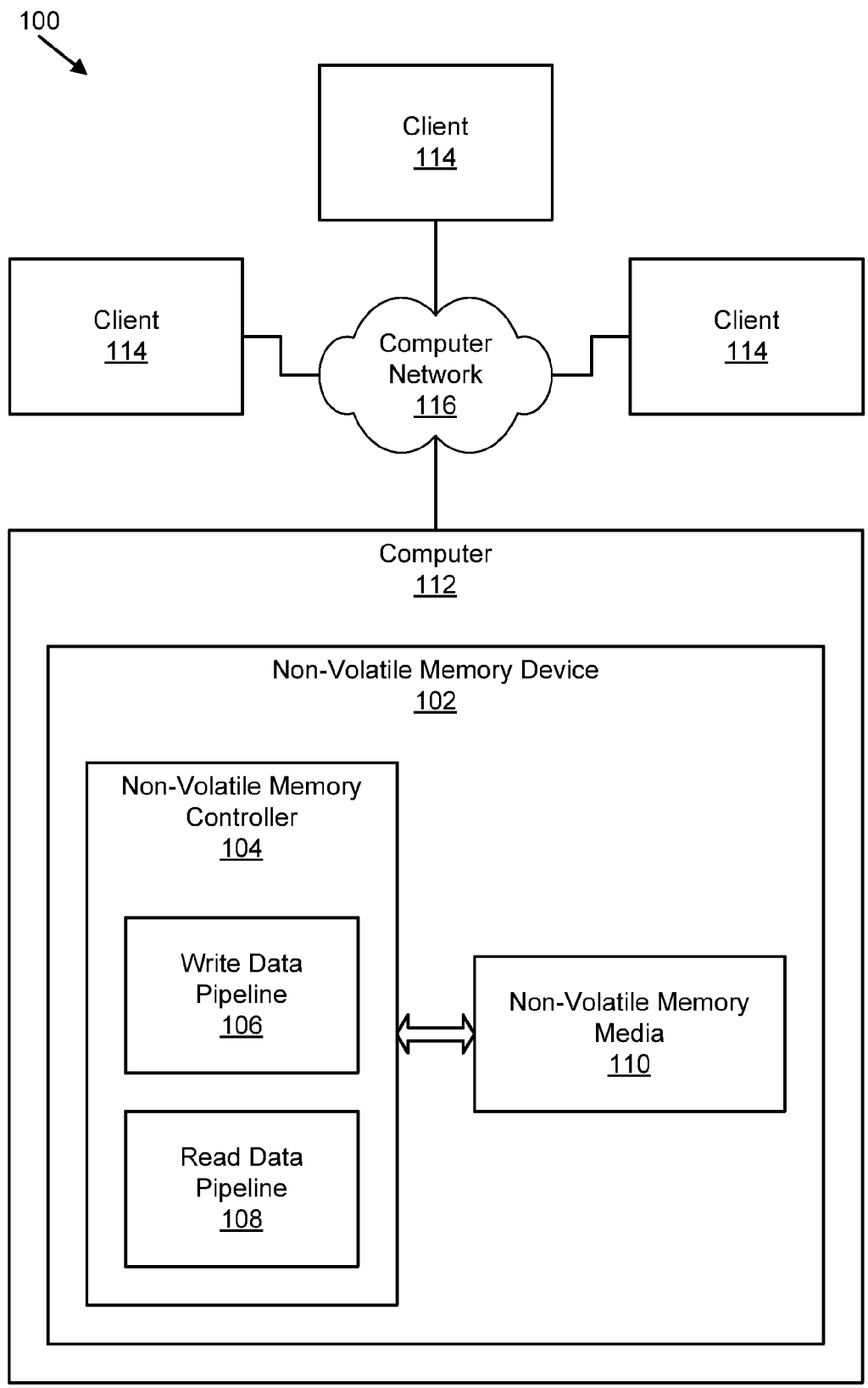
FIG. 1 is a schematic block diagram illustrating one embodiment of a system for managing a configuration parameter for non-volatile memory media.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus memory device. A computer readable medium may be embodied by a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the disclosure may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the disclosure. One skilled in the relevant art will recognize, however, that the disclosure may be practiced without one or more of the specific details, or with other methods, components, materials, and so forth. In other instances, well-known structures, materials, or operations are not shown or described in detail to avoid obscuring aspects of the disclosure.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Non-Volatile Memory System

FIG. 1 depicts one embodiment of a system 100 for managing non-volatile memory media 110. The system 100 includes a non-volatile memory device 102, a non-volatile memory controller 104, a write data pipeline 106, a read data pipeline 108, non-volatile memory media 110, a computer 112, a client 114, and a computer network 116, which are described below.

The system 100 includes at least one non-volatile memory device 102. In other embodiments, the system 100 includes two or more non-volatile memory devices 102. Each non-volatile memory device 102 may include non-volatile memory media 110. The non-volatile memory media may include solid-state storage media such as NAND flash memory, NOR flash memory, nano random access memory ("nano RAM or NRAM"), magneto-resistive RAM ("MRAM"), dynamic RAM ("DRAM"), phase change RAM ("PRAM"), racetrack memory, memristor memory, nanocrystal wire-based memory, silicon-oxide based sub-10 nanometer process memory, graphene memory, silicon-oxide-nitride-oxide-silicon ("SONOS") memory, resistive random-access memory ("RRAM"), programmable metallization cell ("PMC"), conductive-bridging RAM ("CBRAM"), or the like. In other embodiments, the non-volatile memory media 110 may comprise magnetic media, optical media, or another type of non-volatile media.

While the non-volatile memory media 110 is referred to herein as "memory media," in various embodiments, the non-volatile memory media 110 may more generally comprise a non-volatile recording media capable of recording data, which may be referred to as a non-volatile memory media, a non-volatile storage media, or the like. Further, the non-volatile memory device 102, in various embodiments, may comprise or be referred to as a non-volatile recording device, a non-volatile memory device, a non-volatile storage device, or the like. The non-volatile memory device 102 is described in more detail with respect to FIGS. 2, 3A, and 3B.

The non-volatile memory device 102 is depicted in a computer 112 connected to one or more clients 114 through a computer network 116. In one embodiment, the non-volatile memory device 102 is internal to the computer 112 and is connected using a system communications bus, such as a peripheral component interconnect express ("PCI-e") bus, a Serial Advanced Technology Attachment ("serial ATA") bus, or the like. In another embodiment, the non-volatile memory device 102 is external to the computer 112 and is connected using an external communications bus, such as a universal serial bus ("USB") connection, an Institute of Electrical and Electronics Engineers ("IEEE") 1394 bus ("FireWire"), or the like. In other embodiments, the non-volatile memory device 102 is connected to the computer 112 using a communications bus such as a peripheral component interconnect ("PCI") express bus using external electrical or optical bus extension or bus networking solution such as Infiniband or PCI Express Advanced Switching ("PCIe-AS"), or the like.

In various embodiments, the non-volatile memory device 102 may be in the form of a dual-inline memory module ("DIMM"), a daughter card, or a micro-module. In another embodiment, the non-volatile memory device 102 is an element within a rack-mounted blade. In another embodiment, the non-volatile memory device 102 is contained within a package that is integrated directly onto a higher level assembly (e.g., mother board, lap top, graphics processor). In another embodiment, individual components comprising the non-volatile memory device 102 are integrated directly onto a higher level assembly without intermediate packaging.

The non-volatile memory device 102 includes one or more non-volatile memory controllers 104, each may include a write data pipeline 106 and a read data pipeline 108, and each includes non-volatile memory media 110, which are described in more detail below with respect to FIGS. 2, 3A, and 3B. In general, the one or more non-volatile memory controllers 104 manage the non-volatile memory media 110, including determining configuration parameters for storage cells of the non-volatile memory media 110 and configuring the storage cells according to the configuration parameters.

As used herein, a configuration parameter for a set of storage cells or other non-volatile memory media 110 is a parameter that is modifiable by way of an interface. The interface may comprise a publicly known interface or a proprietary interface and may include use of particular command instructions and/or use of particular parameters, register settings, driver settings, controller settings, a particular set of command instruction sequences, or other differences from regular commands (general purpose commands) or settings used to interface with or manage the set of storage cells. Configuration parameters may relate to writing to, or programming, storage cells, reading from storage cells, erasing storage cells, managing storage cells, device driver or storage controller settings for storage cells, or the like. A configuration parameter for a set of storage cells may be associated with a device driver for the non-volatile memory device 102, with a non-volatile memory controller 104, or the like, and may relate to how the device driver and/or non-volatile memory controller 104 use, manage, and interact with the set of storage cells and/or the non-volatile memory media 110.

A configuration parameter, in certain embodiments, may include one or more storage thresholds, such as a read voltage threshold, a resistivity threshold, a programming threshold, an erase threshold, a hardware driver level threshold, a storage controller level threshold, or the like. The configuration parameter may be set once during initialization of the non-volatile memory media 110, dynamically with each command issued to the non-volatile memory media 110, or during operation of the non-volatile memory media 110 in response to triggers such as events or time intervals. The non-volatile memory controller 104, in one embodiment, proactively sets one or more configuration parameters for storage cells of the non-volatile memory media 110 to improve the utility of the non-volatile memory media 110, to reduce errors, and the like.

The system 100 includes one or more computers 112 connected to the non-volatile memory device 102. A computer 112 may be a host, a server, a storage controller of a storage area network ("SAN"), a workstation, a personal computer, a laptop computer, a handheld computer, a supercomputer, a computer cluster, a network switch, a router or appliance, a database or storage appliance, a data acquisition or data capture system, a diagnostic system, a test system, a robot, a portable electronic device, a wireless device, or the like. In another embodiment, a computer 112 may be a client and the non-volatile memory device 102 operates autonomously to service data requests sent from the computer 112. In this embodiment, the computer 112 and non-volatile memory device 102 may be connected using a computer network, system bus, or other communication means suitable for connection between a computer 112 and an autonomous non-volatile memory device 102.

In one embodiment, the system 100 includes one or more clients 114 connected to one or more computers 112 through one or more computer networks 116. A client 114 may be a host, a server, a storage controller of a SAN, a workstation, a personal computer, a laptop computer, a handheld computer, a supercomputer, a computer cluster, a network switch, a router or appliance, a database or storage appliance, a data acquisition or data capture system, a diagnostic system, a test system, a robot, a portable electronic device, a wireless device, or the like. The computer network 116 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 116 may also include a network from the IEEE 802 family of network technologies, such as Ethernet, token ring, WiFi, WiMax, and the like.

The computer network 116 may include servers, switches, routers, cabling, radios, and other equipment used to facilitate networking computers 112 and clients 114. In one embodiment, the system 100 includes multiple computers 112 that communicate as peers over a computer network 116. In another embodiment, the system 100 includes multiple non-volatile memory devices 102 that communicate as peers over a computer network 116. One of skill in the art will recognize other computer networks 116 comprising one or more computer networks 116 and related equipment with single or redundant connection between one or more clients 114 or other computer with one or more non-volatile memory devices 102 or one or more non-volatile memory devices 102 connected to one or more computers 112. In one embodiment, the system 100 includes two or more non-volatile memory devices 102 connected through the computer network 116 to a client 114 without a computer 112. The non-volatile memory controller 104, in certain embodiments, receives source data for storage in the non-volatile memory media 110 from a processor of the computer 112 and/or from a client 114 over one or more communications buses as described above.

Non-Volatile Memory Device

Figure 2:
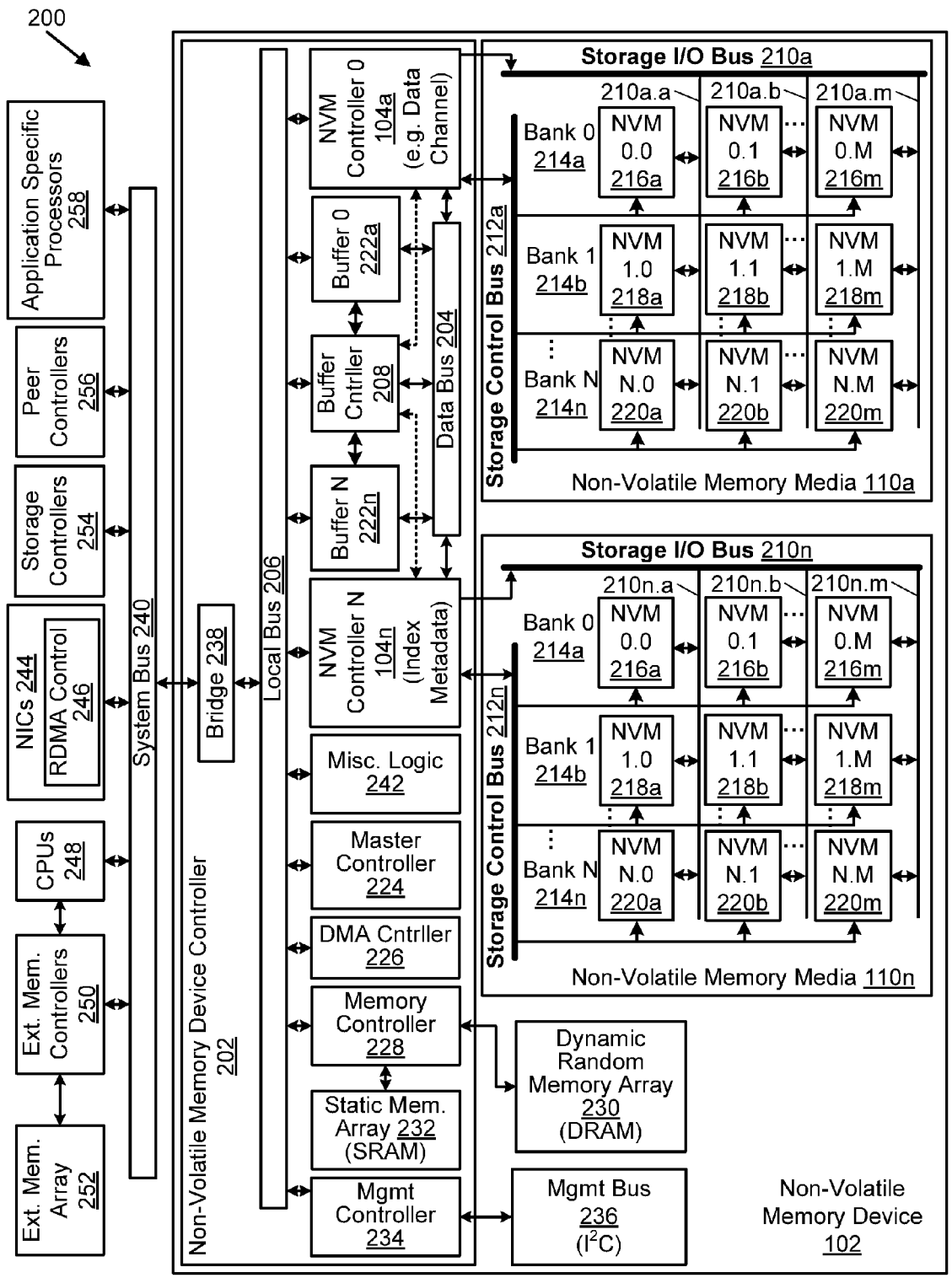
FIG. 2 is a schematic block diagram illustrating one embodiment of a non-volatile memory device controller for non-volatile memory media.

FIG. 2 depicts one embodiment 200 of a non-volatile memory device controller 202 that includes a write data pipeline 106 and a read data pipeline 108 in a non-volatile memory device 102. The non-volatile memory device controller 202 may be embodied as hardware, as software, or as a combination of hardware and software. The non-volatile memory device controller 202 may include a number of non-volatile memory controllers 0-N 104*a*-*n*, each controlling non-volatile memory media 110. In the depicted embodiment, two non-volatile memory controllers are shown: non-volatile memory controller 0 104*a* and non-volatile memory controller N 104*n*, and each controls non-volatile memory media 110*a*-*n*. In the depicted embodiment, non-volatile memory controller 0 104*a* controls a data channel so that the attached non-volatile memory media 110*a* stores data. Non-volatile memory controller N 104*n* controls an index metadata channel associated with the stored data and the associated non-volatile memory media 110*n* stores index metadata.

In an alternate embodiment, the non-volatile memory device controller 202 includes a single non-volatile memory controller 104*a* with a single non-volatile memory media 110*a*. In another embodiment, there are a plurality of non-volatile memory controllers 104*a*-*n* and associated non-volatile memory media 110*a*-*n*. In one embodiment, one or more non-volatile memory controllers 104*a*-104*n*-1, coupled to their associated non-volatile memory media 110*a*-110*n*-1, control data while at least one non-volatile memory controller 104*n*, coupled to its associated non-volatile memory media 110*n*, controls index metadata.

In one embodiment, at least one non-volatile memory controller 104 includes a field-programmable gate array ("FPGA") and controller functions are programmed into the FPGA. In a particular embodiment, the FPGA is a Xilinx® FPGA. In another embodiment, the non-volatile memory controller 104 comprises components specifically designed as a non-volatile memory controller 104, such as an application-specific integrated circuit ("ASIC") or custom logic solution. Each non-volatile memory controller 104 typically includes a write data pipeline 106 and a read data pipeline 108, which are describe further in relation to FIG. 3A. In another embodiment, at least one non-volatile memory controller 104 is made up of a combination FPGA, ASIC, and custom logic components. In certain embodiments, at least a portion of a non-volatile memory controller 104 is integrated with, part of, and/or in communication with a device driver executing on the computer 112, or the like.

Non-Volatile Memory

The non-volatile memory media 110 is an array of non-volatile memory elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the non-volatile memory media 110, data cannot be read from the non-volatile memory media 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A non-volatile memory element (e.g., NVM 0.0 216*a*) is typically configured as a chip (a package of one or more die) or a die on a circuit board. As depicted, a non-volatile memory element (e.g., 216*a*) operates independently or semi-independently of other non-volatile memory elements (e.g., 218*a*) even if these several elements are packaged together in a chip package, a stack of chip packages, or some other package element. As depicted, a row of non-volatile memory elements 216*a*, 216*b*, 216*m* is designated as a bank 214. As depicted, there may be "n" banks 214*a*-*n* and "m" non-volatile memory elements 216*a*-*m*, 218*a*-*m*, 220*a*-*m* per bank in an array of n×m non-volatile memory elements 216, 218, 220 in a non-volatile memory media 110. Of course different embodiments may include different values for n and m.

In one embodiment, the non-volatile memory media 110*a* includes twenty non-volatile memory elements 216, 218, 220 per bank 214 with eight banks 214. In one embodiment, the non-volatile memory media 110*a* includes twenty four non-volatile memory elements 216, 218, 220 per bank 214 with eight banks 214. In addition to the n×m storage elements 216, 218, 220, one or more additional columns (P) may also be addressed and operated in parallel with other non-volatile memory elements 216*a*, 216*b*, 216*m* for one or more rows. The added P columns in one embodiment, store parity data for the portions of an ECC chunk (e.g., an ECC codeword) that span m storage elements for a particular bank. In one embodiment, each non-volatile memory element 216, 218, 220 is comprised of single-level cell ("SLC") devices. In another embodiment, each non-volatile memory element 216, 218, 220 is comprised of multi-level cell ("MLC") devices.

In one embodiment, non-volatile memory elements that share a common storage I/O bus 210*a*-210*n* (e.g., 216*b*, 218*b*, 220*b*) are packaged together. In one embodiment, a non-volatile memory element 216, 218, 220 may have one or more die per chip with one or more chips stacked vertically and each die may be accessed independently. In another embodiment, a non-volatile memory element (e.g., NVM 0.0 216*a*) may have one or more virtual die per die and one or more die per chip and one or more chips stacked vertically and each virtual die may be accessed independently. In another embodiment, a non-volatile memory element NVM 0.0 216*a* may have one or more virtual die per die and one or more die per chip with some or all of the one or more die stacked vertically and each virtual die may be accessed independently.

In one embodiment, two die are stacked vertically with four stacks per group to form eight storage elements (e.g., NVM 0.0-NVM 8.0) 216a-220a, each in a separate bank 214a-n. In another embodiment, 24 storage elements (e.g., NVM 0.0-NVM 0.24) 216 form a logical bank 214a so that each of the eight logical banks has 24 storage elements (e.g., NVM 0.0-NVM 8.24) 216, 218, 220. Data is sent to the non-volatile memory media 110 over the storage I/O bus 210 to all storage elements of a particular group of storage elements (NVM 0.0-NVM 8.0) 216a, 218a, 220a. The one or more storage control buses 212a-212n are used to select a particular bank (e.g., Bank 0 214a) so that the data received over the storage I/O bus 210 connected to all banks 214 is written just to the selected bank 214a.

In certain embodiments, the storage control bus 212 and storage I/O bus 210 are used together by the non-volatile memory controller 104 to communicate addressing information, storage element command information, and data to be stored. Those of skill in the art recognize that this address, data, and command information may be communicated using one or the other of these buses 212, 210, or using separate buses for each type of control information. In one embodiment, addressing information, storage element command information, and storage data travel on the storage I/O bus 210 and the storage control bus 212 carries signals for activating a bank as well as identifying whether the data on the storage I/O bus 210 lines constitute addressing information, storage element command information, or storage data.

For example, a control signal on the storage control bus 212 such as "command enable" may indicate that the data on the storage I/O bus 210 lines is a storage element command such as program, erase, reset, read, and the like. A control signal on the storage control bus 212 such as "address enable" may indicate that the data on the storage I/O bus 210 lines is addressing information such as erase block identifier, page identifier, and optionally offset within the page within a particular storage element. Finally, an absence of a control signal on the storage control bus 212 for both "command enable" and "address enable" may indicate that the data on the storage I/O bus 210 lines is storage data that is to be stored on the storage element at a previously addressed erase block, physical page, and optionally offset within the page of a particular storage element.

In one embodiment, the storage I/O bus 210 is comprised of one or more independent I/O buses ("IIOBa-m" comprising 210a.a-m, 210n.a-m) wherein the non-volatile memory elements within each column share one of the independent I/O buses that accesses each non-volatile memory element 216, 218, 220 in parallel so that all banks 214 are accessed simultaneously. For example, one channel of the storage I/O bus 210 may access a first non-volatile memory element 216a, 218a, 220a of each bank 214a-n simultaneously. A second channel of the storage I/O bus 210 may access a second non-volatile memory element 216b, 218b, 220b of each bank 214a-n simultaneously. Each row of non-volatile memory element 216a, 216b, 216m is accessed simultaneously.

In one embodiment, where non-volatile memory elements 216, 218, 220 are multi-level (physically stacked), all physical levels of the non-volatile memory elements 216, 218, 220 are accessed simultaneously. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214a-n are independently selected using the storage control bus 212. In one embodiment, a bank 214 is selected using a chip enable or chip select. Where both chip select and chip enable are available, the storage control bus 212 may select one level of a multi-level non-volatile memory element 216, 218, 220. In other embodiments, other commands are used by the storage control bus 212 to individually select one level of a multi-level non-volatile memory element 216, 218, 220. Non-volatile memory elements 216, 218, 220 may also be selected through a combination of control and of address information transmitted on storage I/O bus 210 and the storage control bus 212.

In one embodiment, each non-volatile memory element 216, 218, 220 is partitioned into erase blocks and each erase block is partitioned into pages. An erase block on a non-volatile memory element 216, 218 220 may be called a physical erase block or "PEB." A typical page is 2000 bytes ("2 kB"). In one example, a non-volatile memory element (e.g., NVM 0.0) includes two registers and can program two pages so that a two-register non-volatile memory element 216, 218, 220 has a capacity of 4 kB. A bank 214 of 20 non-volatile memory elements 216a, 216b, 216m would then have an 80 kB capacity of pages accessed with the same address going out the channels of the storage I/O bus 210.

This group of pages in a bank 214 of non-volatile memory elements 216a, 216b, 216m of 80 kB may be called a logical page or virtual page. Similarly, a physical erase block of each storage element 216a-m of a bank 214a may be grouped to form a logical erase block ("LEB") or a virtual erase block. An LEB, in certain embodiments, is sized to fit within a bank 214a-m, with one PEB from each storage element 216a-m of a bank 214a forming an LEB, or the like. In other embodiments, an LEB may span banks 214a-n, and may comprise one or more PEBs 608a-m from multiple banks 602a-m. In one embodiment, an erase block (logical or physical) of pages within a non-volatile memory element 216, 218, 220 is erased when an erase command is received within a non-volatile memory element 216, 218, 220. Whereas the size and number of erase blocks, pages, planes, or other logical and physical divisions within a non-volatile memory element 216, 218, 220 are expected to change over time with advancements in technology, it is to be expected that many embodiments consistent with new configurations are possible and are consistent with the general description herein.

Typically, when a packet is written to a particular location within a non-volatile memory element 216, 218, 220, wherein the packet is intended to be written to a location within a particular page which is specific to a particular physical erase block of a particular storage element of a particular bank, a physical address is sent on the storage I/O bus 210 and followed by the packet. The physical address contains enough information for the non-volatile memory element 216, 218, 220 to direct the packet to the designated location within the page. Since all storage elements in a column of storage elements (e.g., NVM 0.0-NVM N.0 216a, 218a, 220a) are accessed simultaneously by the appropriate bus within the storage I/O bus 210a.a, to reach the proper page and to avoid writing the data packet to similarly addressed pages in the column of storage elements (NVM 0.0-NVM N.0 216a, 218a, 220a), the bank 214a that includes the non-volatile memory element NVM 0.0 216a with the correct page where the data packet is to be written is simultaneously selected by the storage control bus 212.

Similarly, satisfying a read command on the storage I/O bus 210 may require a substantially simultaneous signal on the storage control bus 212 to select a single bank 214a and the appropriate page within that bank 214a. In one embodiment, a read command reads an entire page, and because there are multiple non-volatile memory elements 216a, 216b, 216m in parallel in a bank 214, an entire logical page is read with a read command. However, the read command may be broken into subcommands, as will be explained below with respect to bank interleave. A logical page may also be accessed in a write operation.

An erase block erase command may be sent out to erase an erase block over the storage I/O bus 210 with a particular erase block address to erase a particular erase block. Typically, an erase block erase command may be sent over the parallel paths of the storage I/O bus 210 to erase a logical erase block, each with a particular erase block address to erase a particular erase block. Simultaneously a particular bank (e.g., Bank 0 214a) is selected over the storage control bus 212 to prevent erasure of similarly addressed erase blocks in all of the banks (Banks 1-N 214b-n). Alternatively, no particular bank (e.g., Bank 0 214a) is selected over the storage control bus 212 to enable erasure of similarly addressed erase blocks in all of the banks (Banks 1-N 214b-n) simultaneously. Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, packets are written sequentially to the non-volatile memory media 110. For example, packets are streamed to the storage write buffers of a bank 214a of storage elements 216 and when the buffers are full, the packets are programmed to a designated logical page. Packets then refill the storage write buffers and, when full, the packets are written to the next logical page. The next logical page may be in the same bank 214a or another bank (e.g., 214b). This process continues, logical page after logical page, typically until a logical erase block ("LEB") is filled. In another embodiment, the streaming may continue across logical erase block boundaries with the process continuing, logical erase block after logical erase block.

In a read, modify, write operation, data packets associated with requested data are located and read in a read operation. Data segments of the modified requested data that have been modified are not written to the location from which they are read. Instead, the modified data segments are again converted to data packets and then written sequentially to the next available location in the logical page currently being written. The index entries for the respective data packets are modified to point to the packets that contain the modified data segments. The entry or entries in the index for data packets associated with the same requested data that have not been modified will include pointers to original location of the unmodified data packets. Thus, if the original requested data is maintained, for example to maintain a previous version of the requested data, the original requested data will have pointers in the index to all data packets as originally written. The new requested data will have pointers in the index to some of the original data packets and pointers to the modified data packets in the logical page that is currently being written.

In a copy operation, the index includes an entry for the original requested data mapped to a number of packets stored in the non-volatile memory media 110. When a copy is made, a new copy of the requested data is created and a new entry is created in the index mapping the new copy of the requested data to the original packets. The new copy of the requested data is also written to the non-volatile memory media 110 with its location mapped to the new entry in the index. The new copy of the requested data packets may be used to identify the packets within the original requested data that are referenced in case changes have been made in the original requested data that have not been propagated to the copy of the requested data and the index is lost or corrupted.

Beneficially, sequentially writing packets facilitates a more even use of the non-volatile memory media 110 and allows the non-volatile memory device controller 202 to monitor storage hot spots and level usage of the various logical pages in the non-volatile memory media 110. Sequentially writing packets also facilitates a powerful, efficient garbage collection system, which is described in detail below. One of skill in the art will recognize other benefits of sequential storage of data packets.

In various embodiments, the non-volatile memory device controller 202 also includes a data bus 204, a local bus 206, a buffer controller 208, buffers 0-N 222a-n, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258. The components 244-258 connected to the system bus 240 may be located in the computer 112 or may be other devices.

Data Pipelines

Figure 3A:
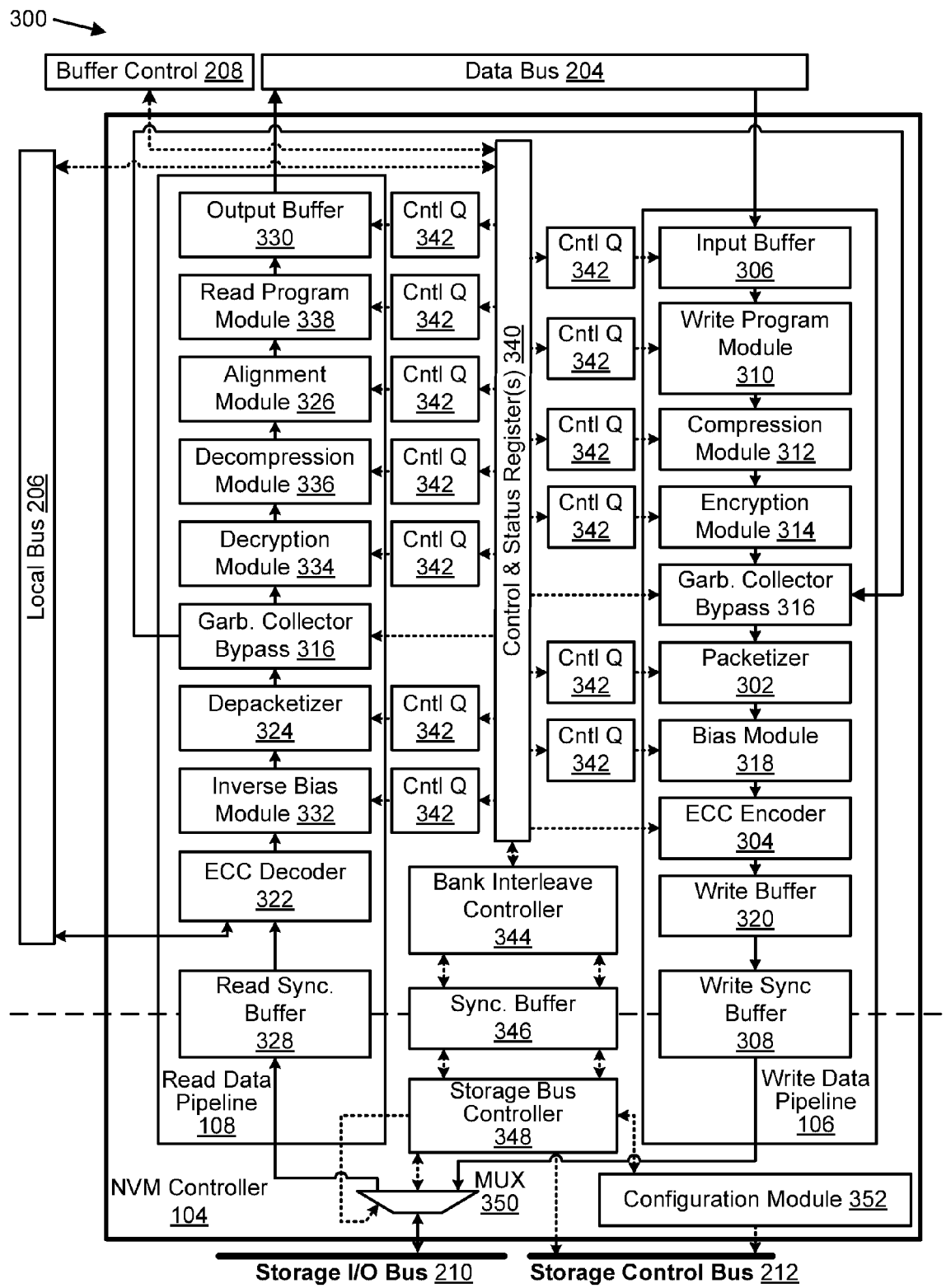
FIG. 3A is a schematic block diagram illustrating one embodiment of a non-volatile memory controller with a write data pipeline and a read data pipeline for non-volatile memory media.

FIG. 3A depicts one embodiment 300 of a non-volatile memory controller 104 with a write data pipeline 106 and a read data pipeline 108 in a non-volatile memory device 102. The embodiment 300 includes a data bus 204, a local bus 206, and buffer control 208, which are substantially similar to those described in relation to the non-volatile memory device controller 202 of FIG. 2. The write data pipeline 106 includes a packetizer 302 and an error-correcting code ("ECC") encoder 304. In other embodiments, the write data pipeline 106 includes an input buffer 306, a write synchronization buffer 308, a write program module 310, a compression module 312, an encryption module 314, a garbage collector bypass 316 (with a portion within the read data pipeline 108), a bias module 318, and a write buffer 320. The read data pipeline 108 includes a read synchronization buffer 328, an ECC decoder 322, a depacketizer 324, an alignment module 326, and an output buffer 330. In other embodiments, the read data pipeline 108 may include an inverse bias module 332, a portion of the garbage collector bypass 316, a decryption module 334, a decompression module 336, and a read program module 338.

The non-volatile memory controller 104 may also include control and status registers 340 and control queues 342, a bank interleave controller 344, a synchronization buffer 346, a storage bus controller 348, and a multiplexer ("MUX") 350. The non-volatile memory controller 104, in the depicted embodiment, includes a configuration module 352 that may be part of the write data pipeline 106 and/or part of the read data pipeline 108, or may be independent from the write data pipeline 106 and the read data pipeline 108. The components of the non-volatile memory controller 104 and associated write data pipeline 106 and read data pipeline 108 are described below. In other embodiments, synchronous nonvolatile memory media 110 may be used and synchronization buffers 308, 328 may be eliminated.

The write data pipeline 106 includes an ECC encoder 304 that that generates one or more error-correcting codes ("ECC") for the one or more packets received from the packetizer 302. The ECC encoder 304 typically uses an error correcting algorithm to generate ECC check bits which are stored with the one or more data packets. The ECC codes generated by the ECC encoder 304 together with the one or more data packets associated with the ECC codes comprise an ECC chunk/codeword. The ECC data stored with the one or more data packets is used to detect and to correct errors introduced into the data through transmission and storage. In one embodiment, packets are streamed into the ECC encoder 304 as un-encoded blocks of length N. A syndrome of length S is calculated, appended and output as an encoded block of length N+S. The value of N and S are dependent upon the characteristics of the algorithm which is selected to achieve specific performance, efficiency, and robustness metrics. In one embodiment, there is no fixed relationship between the ECC blocks and the packets; the packet may comprise more than one ECC block; the ECC block may comprise more than one packet; and a first packet may end anywhere within the ECC block and a second packet may begin after the end of the first packet within the same ECC block. In one embodiment, ECC algorithms are not dynamically modified. In one embodiment, the ECC data stored with the data packets is robust enough to correct errors in more than two bits.

Beneficially, using a robust ECC algorithm allowing more than single bit correction or even double bit correction allows the life of the non-volatile memory media 110 to be extended. For example, if flash memory is used as the storage medium in the non-volatile memory media 110, the flash memory may be written approximately 100,000 times without error per erase cycle. This usage limit may be extended using a robust ECC algorithm. Having the ECC encoder 304 and corresponding ECC decoder 322 onboard the non-volatile memory device 102, the non-volatile memory device 102 can internally correct errors and has a longer useful life than if a less robust ECC algorithm is used, such as single bit correction. However, in other embodiments the ECC encoder 304 may use a less robust algorithm and may correct single-bit or double-bit errors. In another embodiment, the non-volatile memory media 110 may comprise less reliable storage such as multi-level cell ("MLC") flash in order to increase capacity, which storage may not be sufficiently reliable without more robust ECC algorithms.

In one embodiment, the write data pipeline 106 also includes a bias module 318 that receives the one or more packets from the packetizer 302, either directly or indirectly. The bias module 318 biases the bits of the data packets toward a bias of storage cells of the non-volatile memory media 110. As used herein, a "bias" is a preference, probability, tendency, or desirability of values for bits within a set of bits to exhibit a specific data pattern. A bias may be a natural property, a designed attribute, a property of performing an operation on non-volatile memory media, or a random occurrence. Data itself may have a bias and non-volatile memory media may have a bias. A bias may be toward binary ones, toward binary zeroes, toward a balance of binary ones and zeroes, toward a certain binary value for certain bits, or the like.

For example, in one embodiment, end sections of data files may be padded with binary zeroes, causing the data packets that store the end sections to exhibit a bias toward binary zeroes, meaning that the data packets have more binary zeroes than binary ones. Other data packets may have more binary ones than zeroes, or a balance of binary ones and zeroes.

While data packets may each have an individual bias based on data within the packets, a bias of the storage cells of the non-volatile memory media 110 may be based on some benefit associated with the storage of a particular binary value or pattern, or some property of the storage cells. One example of a storage cell property, NAND flash storage cells presently are biased to all binary one values or almost all binary one values when provided by a manufacturer. In addition, performing an erase operation on the NAND flash storage cells sets the binary values in each storage cell to a binary one, such that programming of the storage cells comprises changing certain storage cells to a binary zero value. This bias to all binary one values or almost all binary one values when provided by a manufacturer or when erased represents one example of an empty state for storage cells of a non-volatile memory media 110.

Each of the storage elements 216, 218, 220, in one embodiment, store binary data in a plurality of storage cells that exhibit a bias. Each storage cell stores one or more binary bits, or values. Flash memory storage cells may be single-level cells ("SLC") that each store a single binary bit, or multi-level cells ("MLC") that each store two or more binary bits. Examples of storage cells include transistors, capacitors, magnetic elements, mechanical elements, optical elements, and the like. In flash memory, each storage cell is typically a floating-gate transistor. NRAM, MRAM, DRAM, PRAM, and other types of non-volatile memory may have other types of storage cells, and may store either a single binary bit or two or more binary bits per storage cell.

In one embodiment, the storage cells in the storage elements 216, 218, 220 in an empty or erased state store initial binary values. The initial binary values represent a bias for the storage cells. For example, the storage cells may have a physical, electrical, mechanical, or other quality that causes them to store a certain value by default. In another embodiment, the bias may be intentionally selected based on design considerations of the non-volatile memory media 110, on security considerations, on compatibility issues, or the like, and may not be based on a default property of the storage cells.

For example, in one embodiment, the storage cells of the storage elements 216, 218, 220 may each store a binary value of one upon delivery from a manufacturer, and may each be erased to a value of one prior to being programmed, or written to, as is typical with flash memory. In another embodiment, the storage cells of the storage elements 216, 218, 220 may be biased toward binary zeroes, toward a balance or equal amount of binary ones and zeroes, toward a certain binary value for a plurality of bits, toward a binary pattern, or the like.

In certain embodiments, a bias of one or more storage cells may be influenced by or based on a state of other storage cells physically adjacent to or otherwise in proximity to the one or more storage cells. For example, it may be desirable to bias data stored in storage cells to minimize inter-cell interference between the storage cells and other storage cells, or the like. Inter-cell interference can be caused by voltage differentials between physically adjacent storage cells and, in certain embodiments, biasing data to reduce or minimize the voltage differentials between storage cells based on a physical geometry of the storage cells can reduce inter-cell interference. In one embodiment, storage cells of the non-volatile memory media 110 may have a bias toward a binary pattern that satisfies a predefined voltage differential threshold between the storage cells and other physically adjacent storage cells, or the like.

In addition to local types of inter-cell interference, larger multi-cell structures, such as bit strings, word lines, or the like, may experience inter-cell interference. Certain stripes or other patterns in data, such as stripes of binary ones or of binary zeroes, may interfere with the accuracy or effectiveness of sense amplifiers and/or other management circuitry for these larger, multi-cell structures, and it may be advantageous to bias data away from such stripes or other patterns.

For certain types of storage cells, such as SLC flash memory, the voltage level of a storage cell and associated voltage differentials between storage cells may be based on a single bit value for each storage cell and biasing data may include biasing toward a binary pattern with minimal transitions between binary one values and binary zero values within a data packet and/or within a physical region of storage cells. For other types of storage cells, such as MLC flash memory, the voltage level of a storage cell and associated voltage differentials between storage cells may be based on groups of bits forming a sub-pattern or symbol, and biasing data may include biasing toward a binary pattern with minimal transitions between certain sub-patterns or symbols. One example of using sub-patterns or symbols includes binary or Gray-code mapping of multiple binary values to associated charge levels within MLC storage cells. The bits stored by a single MLC storage cell, in certain embodiments, may not have adjacent addresses, but may be stored on different physical pages, logical pages, or the like.

In one embodiment, the bias module 318 biases source data to reduce inter-cell interference as a separate step performed separately from, instead of, or in addition to other biasing techniques. For example, upon flipping, whitening, compressing, relocating, and/or otherwise biasing source data, separate blocks of source data may still exhibit patterns that cause inter-cell interference, and the bias module 318 may bias one or more of the separate blocks of source data toward a pattern that minimizes inter-cell interference, or the like.

The bias module 318 biases a packet by changing a bias of the packet to more closely match a bias of the storage cells of the non-volatile memory media 110. The bias module 318 biases the packets in a reversible manner, such that the inverse bias module 332 can convert the packets back to their original source data values with their original source biases. In one embodiment, the packets that the bias module 318 biases are sized for storage in a specific logical or physical storage region or division of the non-volatile memory media 110, such as an erase block, a virtual erase block, a page, a virtual page, an ECC chunk/codeword, a division within a page, or the like. In one embodiment, the bias module 318 selectively biases certain packets based on a bias of the packets, and may not bias other packets.

Those of skill in the art recognize that the bias module 318 may, alternatively, operate on one or more data segments that form a subset of a data packet. Similarly, the inverse bias module 332 may operate on data segments as well. Alternatively, or in addition, in one embodiment, the data packet (or data packet subsets such as a data segment) may be sized based on a size of a storage region in the non-volatile memory media 110, a size of a bus or buffer, a size of a pipeline 106, 108, a number of extra bits available for storage of an indicator, or the like.

By biasing data packets toward the bias of the storage cells, the bias module 318 increases performance and endurance of the non-volatile memory media 110 and the non-volatile memory device 102. For example, biasing packets to more closely match the bias of the storage cells decreases write times and erase times because fewer actual storage cells must be changed to execute the operation. It also increases the writable life of the storage cells because fewer operations that are executed on a storage cell mean that the storage cell will last longer before wear begins to affect the storage cell performance/reliability. In certain embodiments, biasing data packets may decrease power consumption or have other additional benefits. Because, in one embodiment, the storage cells store initial binary values that satisfy a bias just prior to being programmed or written to, the closer that the data packets match the bias of the storage cells, the fewer the number of storage cells that are changed to store the data packets, and the more storage cells that remain in a biased state.

As depicted, the bias module 318 biases the one or more packets prior to sending the packets to the ECC encoder 304. Depending on the method that the bias module 318 uses to bias the packets, and on other design considerations, in a further embodiment, the bias module 318 may receive data subsequent to the ECC encoder 304 in the write data pipeline 106, or be placed elsewhere in the write data pipeline 106. For example, in certain embodiments, it may be beneficial to keep ECC data separate from data that the bias module 318 biases, while in other embodiments it may be beneficial for the bias module 318 to bias data that includes ECC data from the ECC encoder 304.

In one embodiment, the bias module 318 biases one or more data segments prior to sending the data segments to the ECC encoder 304. The data segment may be a grouping of bits smaller than a data packet in one embodiment. In such an embodiment, the data segment may comprise the width in bits/bytes of the write data pipeline 106. Similarly, the inverse bias module 332 may convert biased data segments back to their original source state after they are read. Biasing and inverse biasing a data segment may facilitate use of the bias module 318 and the inverse bias module 332 in a write data pipeline 106 and a read data pipeline 108 because the data segment may be sized to match the size (bus width) of data streaming through the pipelines 106,108.

In another embodiment, the bias module 318 may be integrated with another element of the write data pipeline 106, such as the compression module 312, the encryption module 314, the ECC encoder 304, or the like. The bias module 318 and corresponding inverse bias module 332 transparently increase the performance of the non-volatile memory media 110 as the bias module 318 biases data packets before they are written and the inverse bias module 332 converts the biased data packets back to their original source state after they are read. In certain embodiments, the order of the stages 302-320 may be altered from the depicted order. There are other workable alterations to the order of the stages 302-320 based on particular user requirements, or the like.

The read data pipeline 108 includes an ECC decoder 322 that determines if a data error exists in ECC blocks a requested packet received from the non-volatile memory media 110 by using ECC stored with each ECC block of the requested packet. The ECC decoder 322 then corrects any errors in the requested packet if any error exists and the errors are correctable using the ECC. For example, if the ECC can detect an error in six bits but can only correct three bit errors, the ECC decoder 322 corrects ECC blocks of the requested packet with up to three bits in error. The ECC decoder 322 corrects the bits in error by changing the bits in error to the correct one or zero state so that the requested data packet is identical to when it was written to the non-volatile memory media 110 and the ECC was generated for the packet.

In certain embodiments, the ECC decoder 322 may provide error information for correctable errors to the configuration module 352, described below, such as locations of the bits in error, values for the bits in error, and/or other error information. For example, the ECC decoder 322 may provide an error bias to the configuration module 352, indicating one or more bits of a data set that are in error, or the like. An error bias, as used herein, is a representation of one or more detected bit errors in a data set. In one embodiment, an error bias includes a location or position of a detected bit error in a data set. In another embodiment, an error bias includes a value for a detected bit error. A value for a detected error may include an error corrected value of a bit in error, an error value of the bit in error, or the like. For example, in one embodiment, the ECC decoder 322 may provide the configuration module 352 with an uncorrected data set and an error bias indicating locations of detected bit errors and the configuration module 352 may determine a known bias by inverting or flipping the bits in those locations. In another embodiment, for example, the ECC decoder 322 may provide the configuration module 352 with an error corrected data set and an error bias indicating locations of detected bit errors and the configuration module 352 may determine a read bias by inverting or flipping the bits in those locations.

If the ECC decoder 322 determines that the requested packets contains more bits in error than the ECC can correct, the ECC decoder 322 cannot correct the errors in the corrupted ECC blocks of the requested packet and sends an interrupt. In one embodiment, the ECC decoder 322 sends an interrupt with a message indicating that the requested packet is in error. The message may include information that the ECC decoder 322 cannot correct the errors or the inability of the ECC decoder 322 to correct the errors may be implied. In another embodiment, the ECC decoder 322 sends the corrupted ECC blocks of the requested packet with the interrupt and/or the message.

In one embodiment, a corrupted ECC block or portion of a corrupted ECC block of the requested packet that cannot be corrected by the ECC decoder 322 is read by the master controller 224, corrected, and returned to the ECC decoder 322 for further processing by the read data pipeline 108. In one embodiment, a corrupted ECC block or portion of a corrupted ECC block of the requested packet is sent to the device requesting the data. The requesting device 155 may correct the ECC block or replace the data using another copy, such as a backup or mirror copy, and then may use the replacement data of the requested data packet or return it to the read data pipeline 108. The requesting device 155 may use header information in the requested packet in error to identify data required to replace the corrupted requested packet or to replace the data structure to which the packet belongs. In another embodiment, the non-volatile memory controller 104 stores data using some type of RAID and is able to recover the corrupted data. In another embodiment, the ECC decoder 322 sends an interrupt and/or message and the receiving device fails the read operation associated with the requested data packet. One of skill in the art will recognize other options and actions to be taken as a result of the ECC decoder 322 determining that one or more ECC blocks of the requested packet are corrupted and that the ECC decoder 322 cannot correct the errors.

In one embodiment, the non-volatile memory controller 104 includes a configuration module 352 that sets and adjusts configuration parameters for the non-volatile memory media 110, such as read voltage thresholds and the like. In a further embodiment, the configuration module 352 may be integrated with the non-volatile memory media 110 such that it operates independently from the read data pipeline 108 and/or the write data pipeline 106. In certain embodiments, as described in greater detail below with regard to the proactive configuration module 424 of FIG. 4 and FIG. 5, the configuration module 352 proactively determines one or more configuration parameters for storage cells of the non-volatile memory media 110 based on media characteristics for the storage cells in an open loop manner, with little or no feedback from the storage cells. In the depicted embodiment, the configuration module 352 is in communication with the storage control bus 212 and the storage bus controller 348 to configure storage cells of the non-volatile memory media 110 to use various configuration parameters. In another embodiment, the configuration module 352 manages configuration parameters and/or settings for the non-volatile memory controller 104 and or for the non-volatile memory device 102.

In other embodiments, the configuration module 352 may receive a data set from the non-volatile memory media 110, either directly or indirectly, to determine configuration parameters for corresponding storage cells in a closed loop manner, with read data sets as feedback from the storage cells. In certain embodiments, the configuration module 352 may receive one or more requested biased packets from the ECC decoder 322. In a further embodiment, the configuration module 352 may receive a data set from the read synchronization buffer 328, directly from the storage I/O bus 210, from the inverse bias module 332, or otherwise. The configuration module 352 is described in greater detail with regard to FIG. 4. Another embodiment, where the configuration module 352 receives input from both the ECC decoder 322 and the inverse bias module 332 is described below with regard to FIG. 3B.

In general, the configuration module 352 sets and adjusts one or more configuration parameters for one or more storage cells from the non-volatile memory media 110, such as setting and adjusting read voltage thresholds, resistivity thresholds, programming thresholds, erase thresholds, or the like. A read voltage threshold is a voltage level that separates discrete values stored in the storage cells of the non-volatile memory media 110. Different non-volatile memory technologies may use different thresholds other than voltages to distinguish between discrete states. Phase change RAM or PRAM, for example, stores data in chalcogenide glass that has different electrical resistivity in different states. For PRAM, the configuration module 352 may determine, set, and/or adjust resistivity thresholds that distinguish between discrete storage states. One of skill in the art, in light of this disclosure, will recognize that the configuration module 352 may determine, set, and adjust resistivity thresholds or other configuration parameters in a substantially similar manner to that described herein with regard to read voltage thresholds.

For SLC storage cells that store a single binary value, the read voltage threshold is the boundary between a binary one state and a binary zero state. For example, in one embodiment, a storage cell with a read voltage level above the read voltage threshold stores a binary one while a storage cell with a read voltage level below the read voltage threshold stores a binary zero. Other types of storage cells, such as MLC storage cells, may have multiple read voltage thresholds, to distinguish between more than two discrete states.

For example, in one embodiment, MLC storage cells that store two bits may have three read voltage thresholds, separating binary values of 11, 01, 00, and 10. The three example read voltage thresholds may be x volts, y volts, and z volts, described in greater detail below with regard to the read voltage thresholds 662 of FIG. 6C. If the voltage read from a storage cell falls between Vmin and x volts, a binary 11 state is indicated. In certain embodiments, Vmin may be a negative voltage. If the voltage read from a storage cell falls between x volts and y volts, a binary 01 state is indicated. If the voltage read from a storage cell falls between y volts and z volts, a binary 00 state is indicated. If the voltage read from a storage cell falls between z volts and Vmax volts, a binary 10 state is indicated.

The voltages for Vmin, Vmax, x, y, z may vary based on the manufacturer of the storage cells. Read voltages, for example, may range between −3.5 and 5.8 volts, or between another predefined range of voltages. Similarly, the order of binary state changes 11, 01, 00, and 10 relative to read voltage thresholds may vary based on the encoding type used, such as a Gray code encoding type, a binary code encoding type, or the like. One example encoding type is described below with regard to FIG. 6C. As described in greater detail with regard to FIG. 6C, although a single MLC storage cell stores multiple bits, bits from a single storage cell may not have adjacent addresses, and may be included in different physical pages, logical pages, or the like. Accordingly, in various embodiments, the configuration module 352 may manage configuration parameters, such as read voltage thresholds or other storage thresholds, at various granularities, such as per abode/storage state, per page (logical or physical), per erase block (logical or physical), per set of pages, per ECC chunk/codeword, per wordline, per chip, per die, per die plane, or the like.

In certain embodiments, instead of referring to a boundary between discrete values, a read voltage threshold comprises a range of voltages (a maximum and a minimum) that indicate a value. A voltage threshold that is a range can be adjusted by changing the boundary at either end, or at both ends, of the range. The read voltage thresholds or other configuration parameters for the non-volatile memory media 110, in one embodiment, are initially set at a default level that may be defined by a manufacturer. Often such configuration parameter default levels are set to accommodate a large range of general purpose uses of the non-volatile memory media 110. Advantageously, embodiments of the configuration module 352 allow the non-volatile memory media 110 to be used most optimally based on more specific use characteristics. The configuration module 352, in certain embodiments, overrides the default level for one or more configuration parameters, setting the one or more configuration parameters to a different level based on media characteristics of the non-volatile memory media 110. The configuration module 352 may set the configuration parameters to a level that decreases the amount of errors that the non-volatile memory media 110 encounters when compared to the default level, to a level that increases the amount of errors that may be detected and corrected when compared to the default level, to a level that increases the number of input/output operations per second ("IOPS") of the non-volatile memory media 110 when compared to the default level, to a level that increases the usable life of the non-volatile memory media 110 when compared to the default level, and/or that otherwise improves the utility of the non-volatile memory media 110 when compared to the default level.

The read voltage levels of storage cells, and other configuration parameters, can also shift over time, due to leakage and other disturbances of the non-volatile memory media 110. The rate of leakage can also increase with the wear and age of the non-volatile memory media 110. If the read voltage level of a storage cell shifts past the read voltage threshold, a data error occurs, as the value of the data read from the storage cell is different than the value of the data written to the storage cell. The configuration module 352, in one embodiment, adjusts a read voltage threshold or other configuration parameter for one or more storage cells from the non-volatile memory media 110 to compensate for shifts in the read voltage levels of the storage cells. By proactively and/or dynamically adjusting read voltage thresholds, the configuration module 352 can increase the retention rate for and/or the reliability of data stored in the non-volatile memory media 110 and extend the useable lifetime of the non-volatile memory media 110 itself, improving the utility of the non-volatile memory media 110.

The configuration module 352, in one embodiment, uses a known bias of the data set or packet from the non-volatile memory media 110 to adjust the read voltage threshold or other configuration parameter. As described above with regard to the bias module 318, a bias is a preference, probability, tendency, or desirability of values for bits within a set of bits to exhibit a specific data pattern. A bias may be a natural property, a designed attribute, a property of performing an operation on non-volatile memory media, or a random occurrence. A bias may be toward binary ones, toward binary zeroes, toward a balance of binary ones and zeroes, toward a certain binary value for certain bits, toward a specific ratio of binary ones and binary zeroes, toward a binary pattern, or the like.

In one embodiment, the data set or packet that the configuration module 352 receives has a known bias. The data set or packet has a known bias for one of at least three reasons. First, the data set or packet may have a known bias because the bias module 318 biased the data set or packet when the data set or packet was written. In one embodiment, the bias module 318 and/or the inverse bias module 332 cooperate with the configuration module 352, communicating the known bias to the configuration module 352. Second, the data set or packet may have a known bias because the data set or packet is read from a virgin, unwritten region of the non-volatile memory media 110. For example, in one embodiment, virgin, unwritten regions of the non-volatile memory media 110 may typically have a known bias of exclusively binary ones or exclusively binary zeroes in an unwritten state. Third, the data set or packet may have a known bias because the ECC decoder 322 has corrected the data set or packet and has determined the original, correct values of one or more bits of the data set that were in error. The correct values for the bits in the data set comprise this known bias. A deviation from the known bias caused by errors in the data set is an error bias.

The configuration module 352, in one embodiment, determines that a read bias for the data set or packet deviates from the known bias, and determines a direction of deviation for the data set based on a difference between the read bias and the known bias. In a further embodiment, the configuration module 352 adjusts the read voltage threshold, or another read threshold such as a resistivity threshold, for storage cells corresponding to the data set based on the direction of deviation. For example, in one embodiment, the configuration module 352 may lower the read voltage threshold from the previous read voltage threshold to a new read voltage threshold for the storage cells if the data set has more binary zeroes than expected based on the known bias. For MLC storage cells, in one embodiment, a data set may include data from different addresses, different pages, or the like so that the data set includes all data that the associated storage cells store. The configuration module 352 may base a read voltage threshold adjustment on known characteristics of the storage cells, such as an encoding type used for the storage cells, based on a physical and/or electrical architecture of the storage cells, or the like. In a further embodiment, the configuration module 352 may transform, translate, or combine data from different addresses or pages to facilitate a determination of a known bias, a read bias, and/or a deviation from a known bias for MLC storage cells. In another embodiment, for MLC storage cells, the configuration module 352 may adjust a read voltage threshold for the MLC storage cells based on a subset of the data stored by the MLC storage cells.

The configuration module 352, in one embodiment, may request that the data set be re-read with the new read voltage threshold. The configuration module 352 may determine whether the re-read data set has a read bias that deviates from the known bias, and may iteratively adjust the read voltage threshold to a new read voltage threshold until the read bias of the data set no longer deviates from the known bias more than a threshold amount (which may be zero), until the ECC decoder 322 can correct errors in the data set, or the like. In one embodiment, the configuration module 352 stores the new read voltage threshold such that the new read voltage threshold is persistent for subsequent data reads from the non-volatile memory media 110. In a further embodiment, the non-volatile memory media 110 stores the new read voltage threshold for subsequent data reads.

The configuration module 352, in one embodiment, may monitor the read bias of each packet read and compare the bias of the packet or other data set to the known bias in response to a read request. In a further embodiment, the configuration module 352 may monitor the read bias of each packet read and may compare the bias of the data set or packet to the known bias in response to a data error, such as, for example, an uncorrectable bit error that the ECC decoder 322 cannot correct, or the like. In a further embodiment, the configuration module 352 may not monitor the read bias of each packet read and may determine and compare the bias of the data set or packet to the known bias exclusively in response to a data error. As described below with regard to the proactive configuration module 424 of FIGS. 4 and 5, in certain embodiments, the configuration module 352 sets or adjusts a read voltage threshold or other configuration parameter proactively, based on media characteristics instead of, or in addition to, adjustments based on read data sets or packets.

In one embodiment, the non-volatile memory controller 104 may read data in a data packet from multiple channels, storage elements, die, chips, physical erase blocks ("PEBs"), groupings of storage cells, or the like within the non-volatile memory media 110, each of which may have independent read voltage thresholds. The manufacturer of the channels, storage elements, die, chips, and/or grouping of storage cells may make the read voltage thresholds for each channel, storage element, die, chip, and/or grouping of storage cells independently adjustable by the non-volatile memory controller 104. Alternatively, or in addition, the manufacturer of the channels, storage elements, die, chips, and/or grouping of storage cells may make the read voltage thresholds for groups of channels, groups of storage elements, groups of die, groups of chips, and/or groups of groupings of storage cells adjustable by the non-volatile memory controller 104 as separate groups.

In one embodiment, the ECC encoder 304 creates independent ECC checkbits for each channel, storage element, die, chip, PEB, or other grouping of storage cells. The ECC checkbits are stored with the data on a particular grouping of storage cells rather than being distributed across multiple groupings. If ECC checkbits are created and stored independently for each grouping of storage cells, the configuration module 352, in response to a data error, may use the ECC checkbits and the known architecture for how an ECC checkbits are written to the groupings of storage cells to determine in which grouping of storage cells the data error occurred, and adjust the read voltage thresholds of those groupings. If ECC checkbits for the data packet are stored across multiple groupings of storage cells, the configuration module 352 may separately check the read biases of data sets from each grouping of storage cells and adjust one or more of the corresponding read voltage thresholds. An array of storage elements with multiple channels is described in greater detail with regard to FIGS. 6A and 6B.

In one embodiment, the read data pipeline 108 includes an inverse bias module 332 that receives one or more requested biased packets from the ECC decoder 322, either directly or indirectly, and converts the one or more requested packets back to their original source form by reversing the biasing process of the bias module 318 prior to sending the one or more requested packets to the depacketizer 324. In one embodiment, the inverse bias module 332 may use one or more indicators stored by the bias module 318 to convert the biased packets back to their original source data. In certain embodiments, the inverse bias module 332 may provide a known bias, a read bias, and/or a deviation from a known bias for a packet or other data set to the configuration module 352, as described below with regard to FIG. 3B.

In a further embodiment, the inverse bias module 332 converts the biased packets back to their original source data without using an indicator. Instead of using an indicator, the inverse bias module 332 may implement an algorithm that is the inverse operation of the bias module 318. This algorithm may inverse the bias for each data packet received and/or a select number of data packets received. In the depicted embodiment, the inverse bias module 332 is located between the ECC decoder 322 and the depacketizer 324. In a further embodiment, the inverse bias module 332 may be located elsewhere in the read data pipeline 108, based on the location of the bias module 318 in the write data pipeline 106.

As with the write data pipeline 106, the stages of the read data pipeline 108 may be rearranged and other orders of stages within the read data pipeline 108 are possible. The non-volatile memory controller 104 includes control and status registers 340 and corresponding control queues 342. The control and status registers 340 and control queues 342 facilitate control and sequencing commands and subcommands associated with data processed in the write and read data pipelines 106, 108. For example, a data segment in the packetizer 302 may have one or more corresponding control commands or instructions in a control queue 342 associated with the ECC encoder 304. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342.

The non-volatile memory controller 104 and or non-volatile memory device 102 may also include a bank interleave controller 344, a synchronization buffer 346, a storage bus controller 348, and a multiplexer ("MUX") 350.

Configuring Storage Cells

Figure 3B:
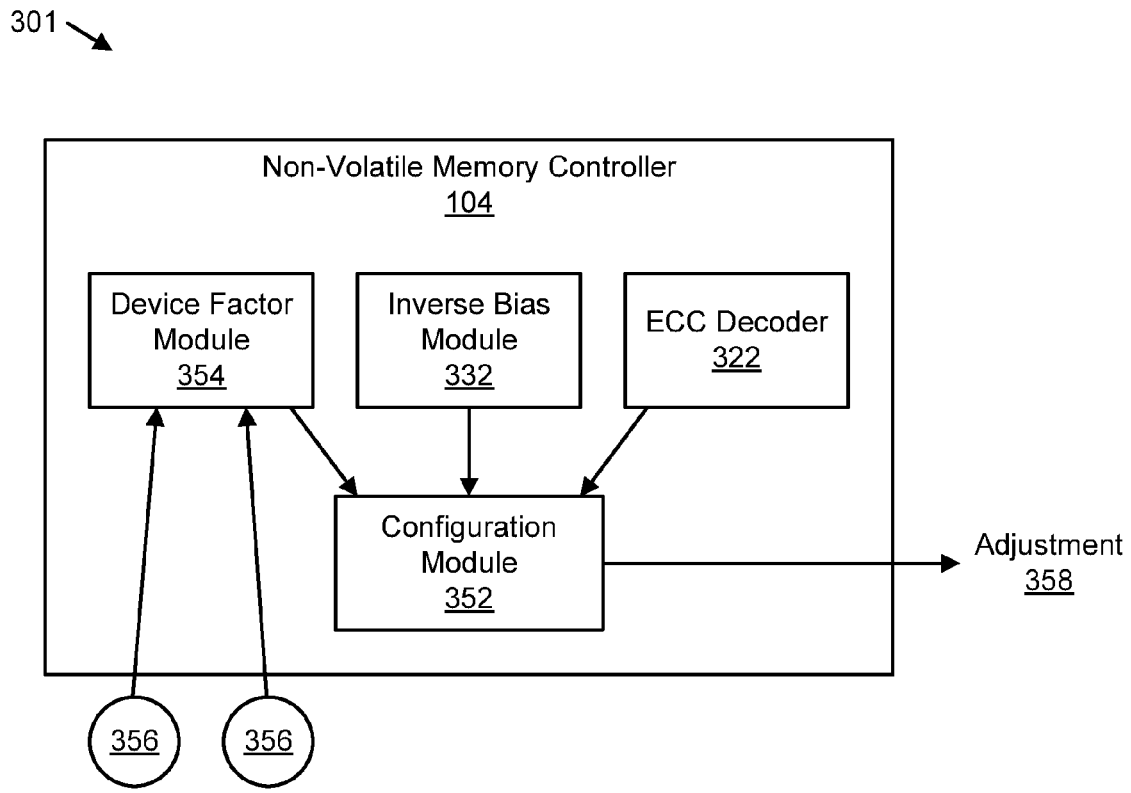
FIG. 3B is a schematic block diagram illustrating another embodiment of a non-volatile memory controller.

FIG. 3B is a schematic block diagram illustrating another embodiment 301 of a non-volatile memory controller 104. In the depicted embodiment 301, the non-volatile memory controller 104 includes a device factor module 354, the inverse bias module 332, the ECC decoder 322, and the configuration module 352. Although not depicted in FIG. 3B, the non-volatile memory controller 104 of the embodiment illustrated in FIG. 3B may also, in certain embodiments, include one or more additional modules or other elements from the non-volatile memory controller 104 depicted in FIG. 3A, as described above.

In the depicted embodiment 301, the configuration module 352 receives inputs from the inverse bias module 332, the ECC decoder 322, and the device factor module 354 and the configuration module 352 determines a configuration parameter adjustment 358 based on the inputs. In other embodiments, the configuration module 352 may receive inputs from just the inverse bias module 332, from just the ECC decoder 322, from just the device factor module 354, or from a different combination of the inverse bias module 332, the ECC decoder 322, and/or the device factor module 354.

The inverse bias module 332, in one embodiment, provides a known bias and/or an actual read bias of a data set to the configuration module 352. The inverse bias module 332 may provide the known bias as an expected bias based on a reversible biasing algorithm that the bias module 318 applies to data written to the non-volatile memory media 110. The expected bias, in certain embodiments, may be an exact bias, where the bias module 318 uses a reversible biasing algorithm that biases data to exactly match a bias. For example, the bias module 318 may add padding data to a data set so that the data set has an exact balance of binary ones and binary zeroes, or the like, and the known bias may be exact.

In another embodiment, the inverse bias module 332 may provide the expected bias as a range, a distribution, an average, an estimate, or the like based on the reversible biasing algorithm that the bias module 318 applies to data. For example, the inverse bias module 332 may measure or learn an expected bias over time as the inverse bias module 332 applies an inverse biasing algorithm to data read from the non-volatile memory media 110. In one embodiment, the expected bias may be mathematically or otherwise derived from the reversible biasing algorithm of the bias module 318 as a range or distribution of possible or likely biases.

For example, where the bias module 318 biases data toward a balance of one half binary ones and one half binary zeroes, which may also be referred to as a direct current ("DC") balance, a range of actual biases for biased data may range between about forty-six percent binary ones and fifty-four percent binary ones, or the like. The known bias and the read bias of the data set, in other embodiments, may also be based on multi-bit symbols or patterns of bits instead of being based exclusively on individual binary ones and zeroes, or the like. While the inverse bias module 332, in the depicted embodiment 301, provides input to the configuration module 352, in certain embodiments, the bias module 318 may provide an expected bias to the configuration module 352 as a known bias, the known bias may be hard coded or programmed into the configuration module 352, or the like.

In one embodiment, the inverse bias module 332 provides a read bias of a data set read from the non-volatile memory media 110 to the configuration module 352. For example, as the inverse bias module 332 converts biased data packets or other data sets back to their original source form by reversing the biasing process of the bias module 318, the inverse bias module 332 may determine, measure, or detect the read bias of the data packets or other data sets. The inverse bias module 332 may determine a read bias prior to, during, or after reversing the biasing process, depending on the biasing process used. In certain embodiments, if the inverse bias module 332 determines that a read bias of a data set deviates from the known/expected bias of the data set, the inverse bias module 332 may provide the data set to the configuration module 352 to make a configuration parameter adjustment 358 to storage cells of the data set so that the data set may be re-read. In other embodiments, as described above with regard to FIG. 3A, the configuration module 352 may adjust a read voltage threshold for a data set before the inverse bias module 332 receives the data set. Other arrangements of the configuration module 352, the inverse bias module 332, and the ECC decoder 322 may also be used.

The ECC decoder 322, in one embodiment, provides a known bias and/or a read bias for a data set to the configuration module 352. The ECC decoder 322 may provide a known bias for a data set having a correct state of bits for the data set. For example, once the ECC decoder 322 has corrected one or more correctable bit errors in a data set, the ECC decoder 322 may provide the error corrected state of the bits of the data set to the configuration module 352 as a known bias with which the data set was written to the non-volatile memory media 110. The ECC decoder 322, in a further embodiment, may provide the read bias for a data set as an error bias that indicates one or more bits of a data set that were in error when the data set was read from the non-volatile memory media 110.

Because the ECC decoder 322, for correctable errors, determines the exact, original, correct values of bits (known bias) of a data set and an exact location of bits in error (error bias) of the data set the configuration module 352 can determine an exact deviation of the data set from the known bias. For this reason, in certain embodiments, the configuration module 352 may make more precise configuration parameter adjustments 358 using a known bias and an error bias from the ECC decoder 322, when available, than using an expected bias and a read bias from the inverse bias module 332.

The configuration module 352, in one embodiment, uses a known bias and/or an error bias for a data set from the ECC decoder 322 in response to one or more correctable bit errors in the data set. In a further embodiment, the configuration module 352 uses an expected bias that is based on a reversible biasing algorithm as a known bias. In certain embodiments, the expected bias is used as the known bias in response to one or more uncorrectable bit errors in the data set. An error bias from the ECC decoder 322 may not be available to the configuration module 352 for uncorrectable bit errors because the uncorrectable bit error condition makes the bias undefined. For uncorrectable bit errors in a data set, in certain embodiments, the read bias of the data set may deviate from the known, expected bias for the data set more than for correctable bit errors, because of the greater severity of the errors. Due to the greater magnitude of deviation of the read bias of a data set from the known, expected bias of the data set for uncorrectable bit errors, the bias information from the inverse bias module 332 may provide a better indicator of a direction for a configuration parameter adjustment 358 for uncorrectable bit errors than for correctable bit errors.

The device factor module 354, in one embodiment, provides one or more statistics for the non-volatile memory device 102 to the configuration module 352. The configuration module 352, in certain embodiments, may make a configuration parameter adjustment 358 based on the one or more statistics, may supplement information from the inverse bias module 332 and/or the ECC decoder 322 with the one or more statistics, or the like. The one or more statistics for the non-volatile memory device 102, in one embodiment, include statistics that may affect read voltages or other configuration parameters of storage cells of the non-volatile memory device 102. For example, in certain embodiments, the one or more statistics may include a temperature for the non-volatile memory device 102, an error rate for the non-volatile memory device 102 (such as an uncorrectable bit error rate "UBER," a raw bit error rate "RBER," or the like), a program/erase cycle count for the non-volatile memory device 102, a storage request latency for the non-volatile memory device 102 (such as an average, maximum, or other storage request execution latency), an age of the non-volatile memory device 102, and/or other statistics or characteristics.

In the depicted embodiment 301, the device factor module 354 receives input from one or more sensors 356. The one or more sensors 356 each detect a statistic or characteristic for the non-volatile memory device 102, such as temperature, moisture, movement, and/or other statistics. For example, in various embodiments, the one or more sensors 356 may include a temperature sensor, a moisture sensor, an accelerometer, and/or another type of sensor for the non-volatile memory device 102. In one embodiment, the device factor module 354 and/or the configuration module 352 may receive one or more statistics for the non-volatile memory device 102 from one or more other modules or elements. For example, the device factor module 354 and/or the configuration module 352 may receive an error rate for the non-volatile memory device 102, such as a UBER, a RBER, or the like, from the ECC decoder 322.

The configuration module 352, in various embodiments, may base a configuration parameter adjustment 358 on a single input or on a combination of inputs from the inverse bias module 332, the ECC decoder 322, and/or the device factor module 354. In certain embodiments, one or more inputs from the inverse bias module 332, the ECC decoder 322, and/or the device factor module 354 may not be available for a data set. For example, the ECC decoder 322 may not provide an error bias and a known bias for a data set with an uncorrectable bit error, the inverse bias module 332 may not provide a known, expected bias or a read bias for a data set during a learning period while the inverse bias module 332 is determining an expected bias, the device factor module 354 may not provide one or more statistics during an initial startup period, or the like.

In one embodiment, the configuration module 352 bases a configuration parameter adjustment 358 on a best available input according to a predefined hierarchy or ranking of inputs. For example, the configuration module 352 may base a configuration parameter adjustment 358 on a known bias and error bias from the ECC decoder 322 if available; on a known, expected bias and a read bias from the inverse bias module 332 if input from the ECC decoder 322 is not available; and on one or more statistics from the device factor module 354 if input from both the ECC decoder 322 and the inverse bias module 332 is unavailable.

In a further embodiment, the configuration module 352 may make a random configuration parameter adjustment 358, in response to a data error or the like, if input from each of the inverse bias module 332, the ECC decoder 322, and the device factor module 354 is unavailable. For example, the configuration module 352 may try a configuration parameter adjustment 358 in one direction, re-read the data set and check for errors, and try a configuration parameter adjustment 358 in the other direction if the error persists.

In another embodiment, the configuration module 352 may base a configuration parameter adjustment 358 on multiple inputs by combining the inputs from the inverse bias module 332, the ECC decoder 322, and/or the device factor module 354. The configuration module 352 may scale the inputs, weight the inputs, convert the inputs to common units, or the like to facilitate combination of the inputs. For example, the configuration module 352, in one embodiment, may convert each of the inputs to individual preliminary threshold adjustments, and then sum the preliminary threshold adjustments to provide a configuration parameter adjustment 358. The configuration module 352, in the example, may weight each preliminary threshold adjustment based on a predefined hierarchy or ranking of the associated inputs. For example, if a known bias and an error bias from the ECC decoder 322 indicates a configuration parameter adjustment 358 in one direction and the known, expected bias and the read bias from the inverse bias module 332 indicates a configuration parameter adjustment 358 in the other direction, the input with greater weight or priority in the predefined hierarchy or ranking will dictate the direction of the configuration parameter adjustment 358.

Figure 4:
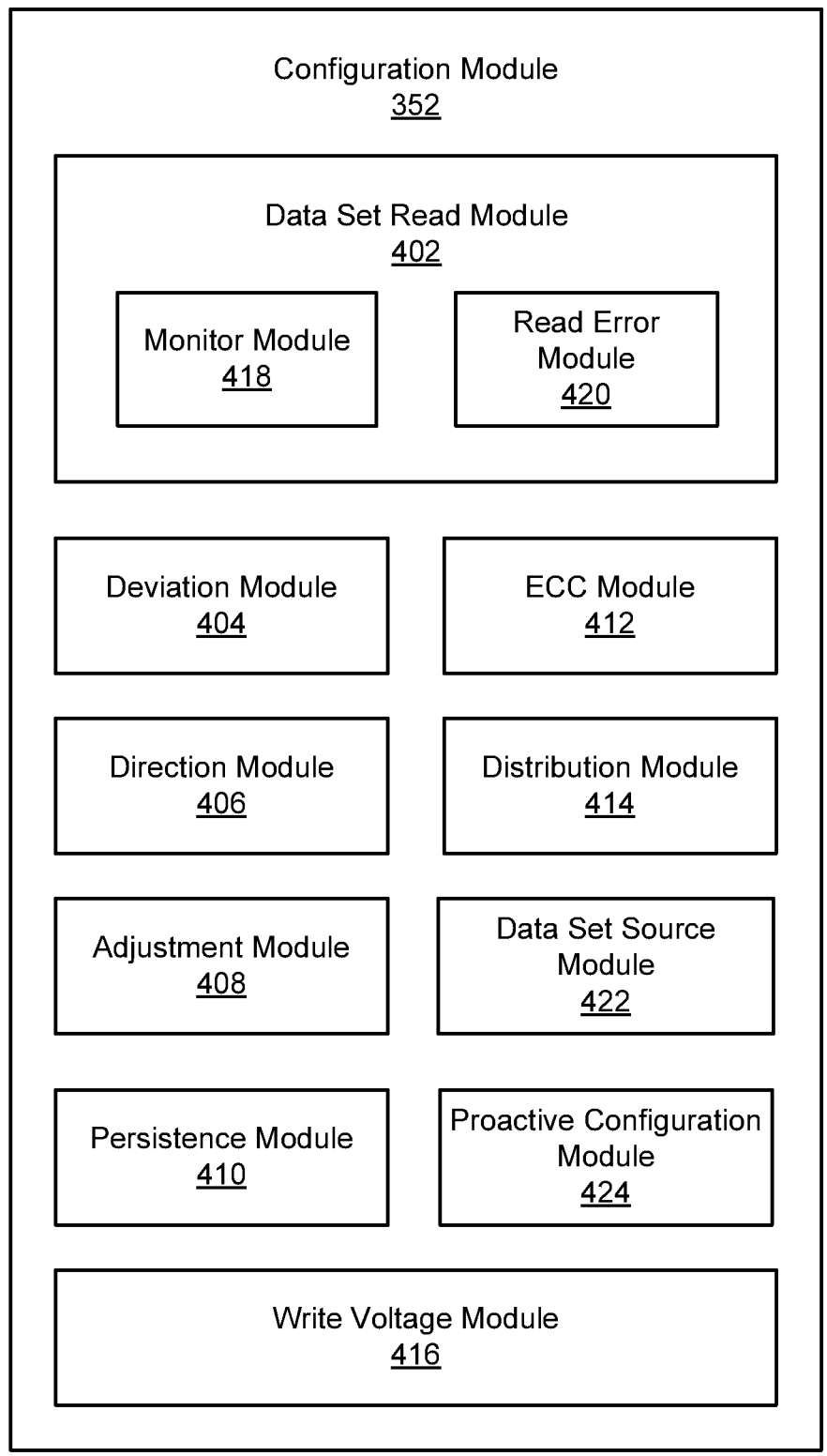
FIG. 4 is a schematic block diagram illustrating one embodiment of a configuration module.

FIG. 4 depicts one embodiment of a configuration module 352. In the depicted embodiment, the configuration module 352 includes a data set read module 402, a deviation module 404, a direction module 406, an adjustment module 408, a persistence module 410, an ECC module 412, a distribution module 414, a data set source module 422, a proactive configuration module 424, and a write voltage module 416. The write voltage module 416 may be integrated with the configuration module 352 or separate from the configuration module 352. As described above with regard to the configuration module 352 of FIG. 3A and FIG. 3B, the configuration module 352 may be part of the write data pipeline 106, part of the read data pipeline 108, part of the non-volatile memory media 110, or the like, such that the configuration module 352 may adjust a read voltage threshold and/or another configuration parameter for one or more storage cells of the non-volatile memory media 110. While specific embodiments are described using a read voltage threshold as an example configuration parameter, the configuration module 352 may similarly determine and adjust other configuration parameters.

The configuration module 352, in one embodiment, sets configuration parameters proactively with an open loop model using the proactive configuration module 424. In another embodiment, the configuration module 352 sets configuration parameters reactively with a closed loop model using the data set read module 402, the deviation module 404, the direction module 406, and/or the adjustment module 408. In certain embodiments, the configuration module 352 may make several layers or phases of adjustments to configuration parameters, determining configuration parameters proactively using the proactive configuration module 424 and adjusting the configuration parameters reactively as the data set read module 402 reads data sets from the non-volatile memory media 110.

In one embodiment, the data set read module 402 reads a data set from storage cells of the non-volatile memory media 110. The data set read module 402 may read the data set either directly or indirectly from the non-volatile memory media 110. For example, in one embodiment, the data set read module 402 may receive the data set from another module or element in the read data pipeline 108, the non-volatile memory media 110, or the like.

In one embodiment, the data set read module 402 reads the data set in response to a testing operation and the data set may be a sample data set read as part of the testing operation. In a further embodiment, the data set read module 402 reads the data set in response to a read request from a client and the data set may be a data set that the client requested. The data set, in one embodiment, may be a full packet, a portion of a packet, or the like. In another embodiment, a size of the data set may be set by the test operation, by a read request from a client or the like. In a further embodiment, the data set may be raw data from the non-volatile memory media 110, independent of packets or other data structures.

The data set, in a further embodiment, was originally stored in the storage cells with a known bias. For example, the data set may be from a packet that the bias module 318 biased, may be from storage cells of the non-volatile memory media 110 that are in a virgin state, storing default data or other data programmed to the non-volatile memory media 110 with a known bias for example by a manufacturer of the non-volatile memory media 110, or the like.

In one embodiment, the data set may be sized relative to a biasing scheme that the bias module 318 employs to bias packets. For example, in one embodiment, the data set may be sized based on the period of a deterministic sequence, such as a pseudorandom binary sequence that the bias module 318 uses to bias packets. The closer the size of the data set is to an integer multiple of the period of the pseudorandom binary sequence, the more likely it is that the bias of the resulting data set will match the known bias. In a further embodiment, the bias module 318 may guarantee that a data set of a predefined size has a bias that does not deviate from the known bias by more than a threshold amount. The threshold amount may range from zero to a given integer value or percentage value.

As described above, a bias is a preference, probability, or tendency of values for bits within a set of bits to exhibit a specific data pattern. In one embodiment, the known bias is a known ratio of binary ones and binary zeroes within a set of bits or groupings of sets of bits. The known ratio, in one embodiment, may be expressed as a proportion or percentage between zero and one, a ratio of zero representing a bias of exclusively one value and a ratio of one representing a bias of exclusively the other value. In one embodiment, the known ratio is greater than zero and less than one, meaning that the known ratio is offset between a ratio of exclusively one binary value and a ratio of exclusively the opposite binary. If the known ratio is greater than zero and less than one, a deviation in the read bias of the data set may occur in either direction from the known ratio and still remain detectable by the configuration module 352.

In the depicted embodiment, the data set read module 402 includes a monitor module 418 and a read error module 420. The data set read module 402, in one embodiment, may read the data set using the monitor module 418 and/or the read error module 420. In one embodiment, the monitor module 418 monitors data sets that are read from the non-volatile memory media 110 in response to read requests from a computer 112 or other client 114. The monitor module 418 may monitor each data set that is read from the non-volatile memory media 110 or may select certain data sets that are read from the non-volatile memory media 110, at predefined intervals, in response to a command or directive from a storage client, or the like. By using the monitor module 418 to monitor data sets that are read from the non-volatile memory media 110, the configuration module 352 may adjust read voltage thresholds for the non-volatile memory media 110 dynamically, preventing uncorrectable data errors from occurring.

In one embodiment, the read error module 420 reads the data set in response to a data error identified in the data set. For example, the ECC decoder 322 or another module may determine that a data error has occurred. In one embodiment, the data error is an uncorrectable bit error that the ECC decoder 322 does not have enough information to correct. Specifically, the ECC decoder 322, in one embodiment, is configured to detect and correct up to a certain number of bits (# of Bits in Error—#BER) in error in a data set. When the number of bits in error exceeds the #BER, the ECC decoder 322 may signal an uncorrectable data error, an uncorrectable bit error, or the like.

The data error may occur due to a shift in a voltage level retained in one or more storage cells of the non-volatile memory media 110. This retained voltage level of a storage cell is referred to herein as a read voltage level. The read error module 420, in one embodiment, reads the data set as part of a testing operation. The configuration module 352 may conduct the testing operation in response to the data error, in response to a scheduled maintenance operation, in response to an initial calibration operation, or the like. The data set used by the read error module 420 may come from a client-requested packet, or may be sample data read as part of the testing operation.

In certain embodiments, the data set read module 402, when reading a data set of sample data in response to a testing operation, periodically, during monitoring, or the like, may size the sample data set to fit within excess read bandwidth of the non-volatile memory media 110. By sizing sample data to fit within excess read bandwidth of the non-volatile memory media 110, in one embodiment, reading the sample data may not affect a read bandwidth for servicing read requests to the non-volatile memory media 110 or a read throughput of the non-volatile memory media 110. In one embodiment, the data set read module 402 may read a data set from the non-volatile memory media 110 with a greater amount of data than is requested by a read request to provide a greater sample size of bits for the configuration module 352 to use to determine an adjustment to a read voltage threshold, or the like. A sample size that is greater than an amount of data requested, in certain embodiments, may improve the accuracy of a read voltage threshold adjustment.

For example, if a user application requests 512 bytes of data, and the non-volatile memory media 110 can read 800 bytes of data in a read request at substantially the same speed as 512 bytes of data, in one embodiment, the data set read module 402 may read a data set of 800 bytes for adjusting a read voltage threshold, and provide the requested 512 bytes (a subset of the 800 byte data set) to the user application without affecting the read time of the operation. In one embodiment, the data set read module 402 sets a minimum data set request size and retrieves at least the minimum data set request size amount of data for each read request, even if the read request is for less than the minimum data set request size. The minimum data set request size, in certain embodiments, may be selected to fit within a boundary of one or more ECC chunks/codewords, one or more pages, one or more erase blocks, within excess bandwidth of the non-volatile memory media 110, or the like. In one embodiment, the minimum data set request size may be selected based on an architecture or geometry of the non-volatile memory media 110, the read data pipeline 108, or the like.

In one embodiment, the deviation module 404 determines that a read bias for a data set deviates from a known bias with which the data set was originally stored. The read bias of the data set deviates from the known bias when there is a difference between the read bias and the known bias. In one embodiment, where the known bias is exact, such as where the known bias includes error corrected bit values or where the bias module 318 biases to an exact bias, the deviation module 404 may determine that any difference between a read bias and the known bias comprises a deviation from the known bias. In other embodiments, the known bias may include an average bias, an estimated bias, a distribution of biases, a range of biases, or the like. The deviation module 404, in these embodiments, may determine that a read bias outside of a range or distribution of known biases, at least a predefined deviation threshold away from a known bias, or the like deviates from the known bias.

In one embodiment, the difference between the read bias of the data set and the known bias may be a difference in the ratios of binary ones and binary zeroes. In other embodiments, the difference between the bias of the data set and the known bias may be a difference in a binary pattern, a difference in multi-bit binary symbols, or the like. As described above with regard to FIG. 3B, in various embodiments, the deviation module 404 may receive an original, known bias and/or a read bias for a data set from the ECC decoder 322, from the inverse bias module 332, or the like.

The deviation module 404, in one embodiment, determines whether the read bias of the data set deviates from the known bias by comparing the read bias to the known bias. The deviation module 404 may compare the read bias to the known bias by counting the number of binary ones and the number of binary zeroes in the data set to determine the ratio of binary ones and binary zeroes in the data set and comparing that ratio to a ratio of the known bias. In a further embodiment, the deviation module 404 may search for and/or count the occurrences of an expected pattern or other expected attribute of the known bias and compare the results of a similar search and/or count in the data set to the expected attribute. In certain embodiments, the ECC decoder 322 indicates to the deviation module 404 that the read bias of the data set deviates from the known bias by providing an error bias for the data set to the configuration module 352, or the like.

In embodiments where the known bias includes a pattern of bits, multi-bit binary symbols, or the like, the deviation module 404 may perform a transform on bits of the data set, may analyze a subset of bits of the data set, or the like to determine whether the read bias of the data set deviates from the known bias. For example, the deviation module 404 may perform a transform based on an encoding type used for storage cells of the non-volatile memory media 110, such as a Gray code encoding type, a binary code encoding type, or the like. The transform, in certain embodiments, may be based on a physical and/or electrical architecture of the storage cells of the non-volatile memory media 110.

For example, as described below with regard to FIG. 6C, a multi-level storage cell stores at least a most significant bit ("MSB") and a least significant bit ("LSB"). In certain embodiments, the MSB and the LSB, though part of the same physical multi-level storage cell, may be assigned to different pages of the non-volatile memory media 110. In certain embodiments, a plurality of the multi-level storage cells are organized on the non-volatile memory media 110 (such as NAND flash for example) as a physical page. In certain non-volatile memory media 110, a physical page is the smallest unit that can be written to the non-volatile memory media 110. In such embodiments, a multi-level storage cell may be associated with a page pair. A page pair is a pair of pages (upper and lower) that are associated with a single set of physical multi-level storage cells. For example, a multi-level storage cell may be associated with a page pair that includes an upper page and a lower page. An upper page may be associated with the MSBs, and the lower page may be associated with the LSBs, or vice versa.

Thus, the MSB and LSB in the same multi-level storage cell may have different addresses in the storage device 102. In certain embodiments, the upper page includes the MSBs of a plurality of multi-level storage cells, and the lower page includes the LSBs of the same multi-level storage cells. Writes directed to the upper page may therefore cause changes only in the MSBs of the associated multi-level storage cells, while writes directed to the lower page cause changes only in the LSBs of the associated multi-level storage cells.

As described in greater detail below with regard to FIG. 6C, in certain embodiments, the data set read module 402 may read a data set that includes only a subset of the bits stored by a grouping of multi-level storage cells, and the deviation module 404 may determine whether or not the read bias of the data set deviates from the known bias based on the subset of the bits. For example, a data set may include only data values from LSBs (lower pages), only values from MSBs (upper pages), or the like. In another embodiment, the deviation module 404 may determine whether or not a read bias of a data set deviates from a known bias based at least partially on an encoding type used for storage cells of the non-volatile memory media 110, a physical and/or electrical architecture of the storage cells of the non-volatile memory media 110, or the like. In other embodiments, the deviation module 404 may perform a transform on a data set that may combine data from different pages to include both LSB and MSB bits in a single data set, to coordinate LSB and MSB bits and/or pages from different data sets, or the like.

The deviation module 404, in one embodiment, checks the read bias of each data set that the data set read module 402 reads. For example, if the data set read module 402 uses the monitor module 418, the deviation module 404 may monitor the read biases of data sets regularly as they are read from the non-volatile memory media 110. The monitor module 418, in one embodiment, may compare read biases of each data set that is requested by a client. In a further embodiment, the monitor module 418 may check read biases of requested data sets for example at regular intervals, and/or in response to a command, or the like. In another embodiment, if the data set read module 402 uses the read error module 420, the deviation module 404 may check the read bias of a data set in response to a data error, as part of a testing operation, or the like.

In one embodiment, the direction module 406 determines a direction of deviation for the data set. The direction of deviation, in one embodiment, is a difference between the read bias of the data set and the known bias. The direction or difference may be represented as a value, a sign (e.g., positive or negative), a relationship (e.g., greater than, less than), a direction (e.g., up, down), or the like. The direction module 406, in certain embodiments, may determine a direction of deviation based on an encoding type used for storage cells of the non-volatile memory media 110, based on a physical and/or electrical architecture of the storage cells of the non-volatile memory media 110, or the like. For example, the direction module 406 may examine the bias deviation in the data set to determine a direction of deviation based on a media type (2-bit MLC, 3-bit MLC, n-bit-MLC), which page of a multi-phase programming model was read, an encoding type for the non-volatile memory media 110 (such as a Gray code encoding type, a binary code encoding type, or the like), and/or a magnitude of the determined deviation.

The direction module 406, in one embodiment, may determine the direction by subtracting a ratio, proportion, or other representation of the known bias from a representation of the read bias of the data set. For example, in one embodiment, the direction module 406 may subtract the proportion of binary ones, zeroes, multi-bit binary symbols, or the like that are expected based on the known bias from the proportion of binary ones, zeroes, multi-bit binary symbols, or the like that are in the data set. Depending on whether ratios of binary ones are compared or ratios of binary zeroes are compared and whether a high voltage represents a binary one or a binary zero, or other specific architectures of the storage cells, the direction module 406 may invert the difference or perform another transform to determine the direction.

In embodiments where an error bias from the ECC decoder 322 is available, the direction module 406 may determine the direction of deviation based on one or more bits of the data set that are in error, as indicated by the error bias. In other embodiments, as described above with regard to FIG. 3B, the direction module 406 may combine directions based on input from the inverse bias module 332, the ECC decoder 322, and/or the device factor module 354 to determine a direction of deviation, or the like.

In one embodiment, a binary zero is represented by a voltage below the read voltage threshold and a binary one is represented by a voltage above the read voltage threshold. In one example, a data set is stored with a known bias of 0.5, representing that the expected bias of the data set should be one half binary ones, or DC balanced. In this example, the data set is read from the storage cells and the data set has a read bias of 0.7, meaning that seventy percent of the data bits are binary ones. To determine the direction, in one embodiment, the direction module 406 subtracts the expected bias, 0.5, from the read bias of the data set, 0.7, for a direction of 0.2. The direction may be the entire result (e.g., "0.2"), the sign of the result (e.g., "positive"), a relationship (e.g., "greater than"), a direction, (e.g., "up"), or another indicator that represents the difference between the expected bias of 0.5 and the read bias of 0.7.

In another example, if the read bias of the data set is 0.3, meaning that thirty percent of the data bits are binary ones, the direction module 406, in one embodiment, would subtract the expected bias, 0.5, from the read bias of the data set, 0.3, for a difference of −0.2. In this example, the direction would be the opposite of the first example, "−0.2," "negative," "less then," "down," or the like.

Because the expected bias is known, comparing a read bias relative the known bias indicates that certain bits which should have satisfied the known bias presently do not, which may be due to a data error or due to changes in the voltage level stored in the storage cells after they were written. In addition, determining that the difference is positive or negative indicates whether the read voltage should be increased or decreased such that a re-read of the data set will result in a read bias that is the same as, or comes closer to the known bias. In one embodiment, the configuration module 352 adjusts the read voltage level in the same direction as the direction indicated by the direction module 406.

Advantageously, having an indication as to which direction to adjust the read voltage threshold provides a significant reduction in time and resources needed to identify a new adjusted read voltage level. If the direction in which to make a read voltage threshold was unknown, identifying a new read voltage threshold may require a labor and time intensive process of trial and error as different possible read voltage thresholds are set and then tested and then adjusted as needed. The process may be used to find a read voltage threshold that results in a re-read of the data packet substantially matching the known bias.

In one embodiment, the adjustment module 408 adjusts a read voltage threshold for the storage cells of the non-volatile memory media 110 based on the direction of deviation that the direction module 406 determines. The adjustment module 408, in one embodiment, may adjust the read voltage threshold in the direction of deviation, away from the direction of deviation, or the like. For example, in one embodiment, the adjustment module 408 may raise the read voltage threshold from a previous read voltage threshold in response to the direction module 406 detecting more binary ones than expected in the known bias and lower the read voltage threshold in response to fewer binary ones than expected. While the relative directions may change based on characteristics of the storage cells of the non-volatile memory media 110 and the storage scheme employed, the adjustment module 408 adjusts the read voltage threshold to correct or compensate for the difference determined by the direction module 406.

In a further embodiment, the adjustment module 408 determines an amount to adjust the read voltage threshold based on an amplitude of the direction or amplitude of the difference determined by the direction module 406. In another embodiment, the adjustment module 408 may scale or otherwise adjust the amplitude from the direction module 406 and adjust the read voltage threshold the adjusted amount. For example, the adjustment module 408, in one embodiment, may adjust the read voltage threshold by several adjustment levels in a single adjustment, based on the amplitude of the direction. In a further embodiment, the adjustment module 408 may select an amount to adjust the read voltage threshold based on additional factors such as age, amount of wear, usage history, error history, or other aspects of the non-volatile memory media 110. As described above with regard to FIG. 3B, in certain embodiments, the adjustment module 408 may make a read voltage threshold adjustment based on one or more statistics for the non-volatile memory device 102 that the configuration module 352 receives from the device factor module 354.

In another embodiment, the adjustment module 408 uses a search algorithm to determine the read voltage threshold based on the direction of deviation. For example, the range of voltages in the direction of deviation from the current read voltage threshold may be the search space for the search algorithm. The adjustment module 408, in one embodiment, may use a linear search, a binary search, or the like to determine the read voltage threshold. To check each step as part of the search algorithm, the data set read module 402 may re-read the data set in response to each adjustment, and the deviation module 404 may re-determine whether the read bias of the re-read data set deviates from the known bias. The direction module 406 may re-determine a direction of deviation for the re-read data set to further the search. The adjustment module 408 may iteratively readjust the read voltage threshold based on the re-determined direction of deviation until the deviation module 404 determines that the read bias of a re-read data set does not deviate from the known bias, or until each of the read voltage threshold level has been tested, and/or until the data set can be corrected using ECC checkbits, or the like.

In one embodiment, the adjustment module 408 stops readjusting a read voltage threshold once a retry threshold is satisfied. For example, if the ECC decoder 322 cannot correct a data error and/or if the read bias for the data set continues to deviate from the known bias when a retry threshold for the data set is satisfied, the adjustment module 408 may cease making adjustments to the read voltage threshold. The retry threshold may be selected based on a set of possible read voltage threshold levels, or the like. In one embodiment, a retry threshold sets a number of times which the adjustment module 408 may adjust a read voltage threshold. In another embodiment, a retry threshold may set an amount of time in which the adjustment module 408 may make read voltage threshold adjustments. The non-volatile memory controller 104, in certain embodiments, may take further remedial action in response to the retry threshold being satisfied, such as retiring the storage cells associated with the data set, logically replacing the storage cells associated with the data set, or the like.

In one embodiment, the adjustment module 408 does not adjust a read voltage threshold, even if the deviation module 404 determines that the read bias of a data set deviates from the known bias, a data error has occurred, a retry threshold has not been met, or the like. The adjustment module 408, in certain embodiments, may selectively adjust a read voltage threshold based on one or more risk factors associated with an adjustment to a grouping of storage cells. For example, risk factors may include an error rate for the grouping of storage cells (such as an UBER or the like), an erase cycle count for the grouping of storage cells, a storage request latency for the grouping of storage cells (such as an average, maximum, or other storage request execution latency), an age of the grouping of storage cells, a number of previous adjustments to a read voltage threshold of the grouping of storage cells, and/or other potential risk factors. In one embodiment, the adjustment module 408 may cancel or delay an adjustment to a read voltage threshold in response to one or more risk factors satisfying a risk threshold. In a further embodiment, the non-volatile memory controller 104 may take further remedial action in response to one or more risk factors satisfying a risk threshold.

The adjustment module 408, in one embodiment, adjusts the read voltage threshold using a procedure or command provided by a manufacturer of the non-volatile memory media 110. For example, in one embodiment, the adjustment module 408 may adjust the read voltage threshold by writing a value to a settings register of the non-volatile memory media 110, sending a read voltage threshold parameter to the non-volatile memory media 110, or otherwise communicating an adjustment to a read voltage threshold to the non-volatile memory media 110. The adjustment module 408 may communicate the adjustment as an absolute value of a read voltage threshold, an amount to adjust the read voltage threshold, or the like. In a further embodiment, the non-volatile memory media 110 provides a plurality of discrete levels (e.g., between 2 and 15 different levels) to which the read voltage threshold may be adjusted. In other embodiments, the magnitude of a read voltage threshold adjustment may be defined or recommended by a manufacturer or vendor of the non-volatile memory media 110.

The adjustment module 408, in one embodiment, adjusts the read voltage threshold individually for a die, chip, PEB, or other discrete segment of the non-volatile memory media 110. The adjustment module 408, in a further embodiment, adjusts multiple read voltage thresholds for each storage cell. For example, in one embodiment, the storage cells of the non-volatile memory media 110 are MLC storage cells, with multiple read voltage thresholds per cell (e.g., a 2 bit MLC storage cell may have three distinct read voltage thresholds). The adjustment module 408 may move each of the multiple read voltage thresholds together or it may move them independently.

In embodiments where the storage cells have multiple read voltage thresholds, each read voltage threshold is separated by a separation distance. In one embodiment, the separation distances are uniform between each read voltage threshold. In a further embodiment, the adjustment module 408 adjusts the multiple read voltage thresholds with a single command or procedure and the separation distances between the multiple read voltage thresholds scale with the adjustment. For example, in one embodiment, the separation distances between read voltage thresholds may increase with larger read voltage thresholds and decrease with lower read voltage thresholds. Scaling the separation distances between read voltage thresholds upon adjustment, in one embodiment, provides a more even distribution of read voltage thresholds, so that the ranges of voltages at the ends of the ranges are not reduced or enlarged while middle ranges remain the same.

In one embodiment, the persistence module 410 stores a state of the read voltage threshold. The persistence module 410, in one embodiment, is part of the non-volatile memory controller 104. The persistence module 410, in another embodiment, may send the read voltage threshold to the non-volatile memory media 110 with each read operation. In a further embodiment, the persistence module 410 is part of the non-volatile memory media 110, causing the non-volatile memory media 110 to retain adjustments to the read voltage thresholds that the adjustment module 408 makes. The persistence module 410, in one embodiment, stores multiple read voltage thresholds, each read voltage threshold for a different segment or grouping of storage cells of the non-volatile memory media 110.

In one embodiment, a manufacturer of the non-volatile memory media 110 provides a command or procedure to adjust a read voltage threshold for a predefined grouping of storage cells, such as a chip, physical erase block, physical page, or a die. In a further embodiment, the persistence module 410 stores read voltage thresholds for sub-groupings of storage cells that are smaller than the predefined groupings of storage cells for which the adjustment module 408 can make adjustments using the manufacturer provided command or procedure. The adjustment module 408 may then, in another embodiment, readjust the read voltage threshold when a data set is read from a sub-grouping based on the read voltage thresholds that the persistence module 410 stores. Examples of sub-groupings may include PEBs, pages, ECC chunks/codewords, or other physical or logical divisions of a grouping of storage cells.

For example, in response to a read request for a data set from a first sub-grouping of storage cells, the adjustment module 408 may adjust the read voltage threshold of the entire grouping of storage cells to a level that the persistence module 410 stores for the first sub-grouping. In response to a read request for a data set from a second sub-grouping, in one embodiment, the adjustment module 408 may readjust the read voltage threshold for the entire grouping to a level that the persistence module 410 stores for the second sub-grouping. This allows the configuration module 352 to adjust the read voltage thresholds for the non-volatile memory media 110 at a finer scope than may be provided for in commands or procedures available for the non-volatile memory media 110. For example, a manufacturer may provide a command, procedure, or methodology for adjusting a read voltage threshold for a die, chip, or other grouping of storage cells and the adjustment module 408 may adjust read voltage thresholds for individual PEBs or other sub-groupings in accordance with that command procedure or methodology.

In one embodiment, the configuration module 352 processes the data set in response to an uncorrectable (meaning herein uncorrectable by the ECC decoder 322, as discussed herein a correction may be possible after an adjustment of the read voltage threshold) data error, as described above, and adjusts the read voltage threshold one or more times until the data error is no longer uncorrectable and can be repaired using ECC checkbits for the data set. In one embodiment, the ECC module 412 cooperates with the ECC decoder 322 to determine whether or not the ECC decoder 322 can correct an error in the data set. Alternatively, the configuration module 352 cooperates with the ECC decoder 322 to determine whether or not the ECC decoder 322 can correct an error in the data set.

The configuration module 352, in one embodiment, repeats the processing steps described above until the ECC module 412 determines that the ECC decoder 322 can correct the error. For example, in a further embodiment, the data set read module 402, the deviation module 404, the direction module 406, and the adjustment module 408 may repeatedly read the data set, determine that the read bias for the data set deviates from the known bias, determine the direction of deviation for the data set, and adjust the read voltage threshold as described above until the ECC module 412 determines that the ECC decoder 322 can correct the error.

Figure 6A:
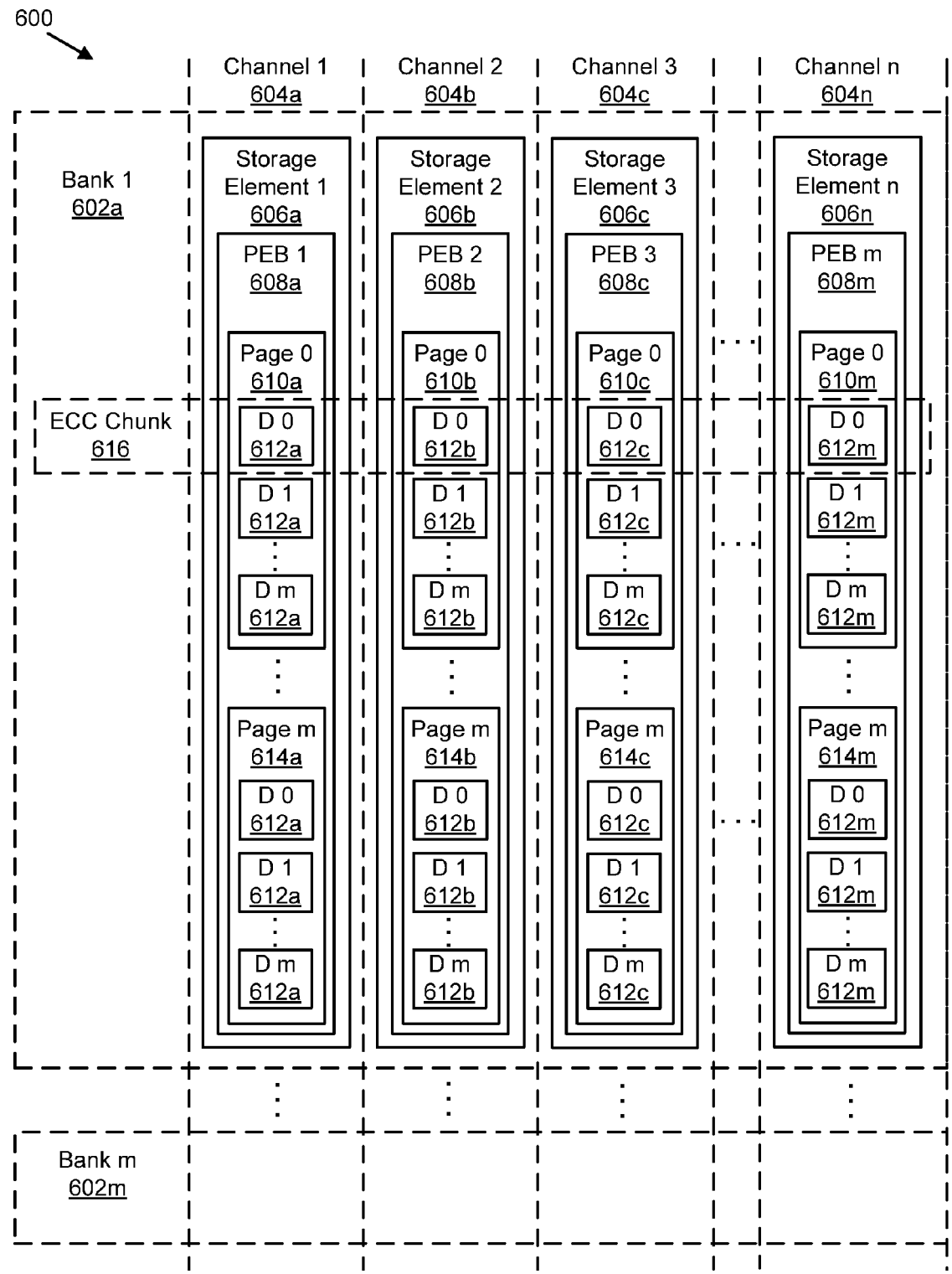
FIG. 6A is a schematic block diagram illustrating one embodiment of an array of storage elements of non-volatile memory media.
Figure 6B:
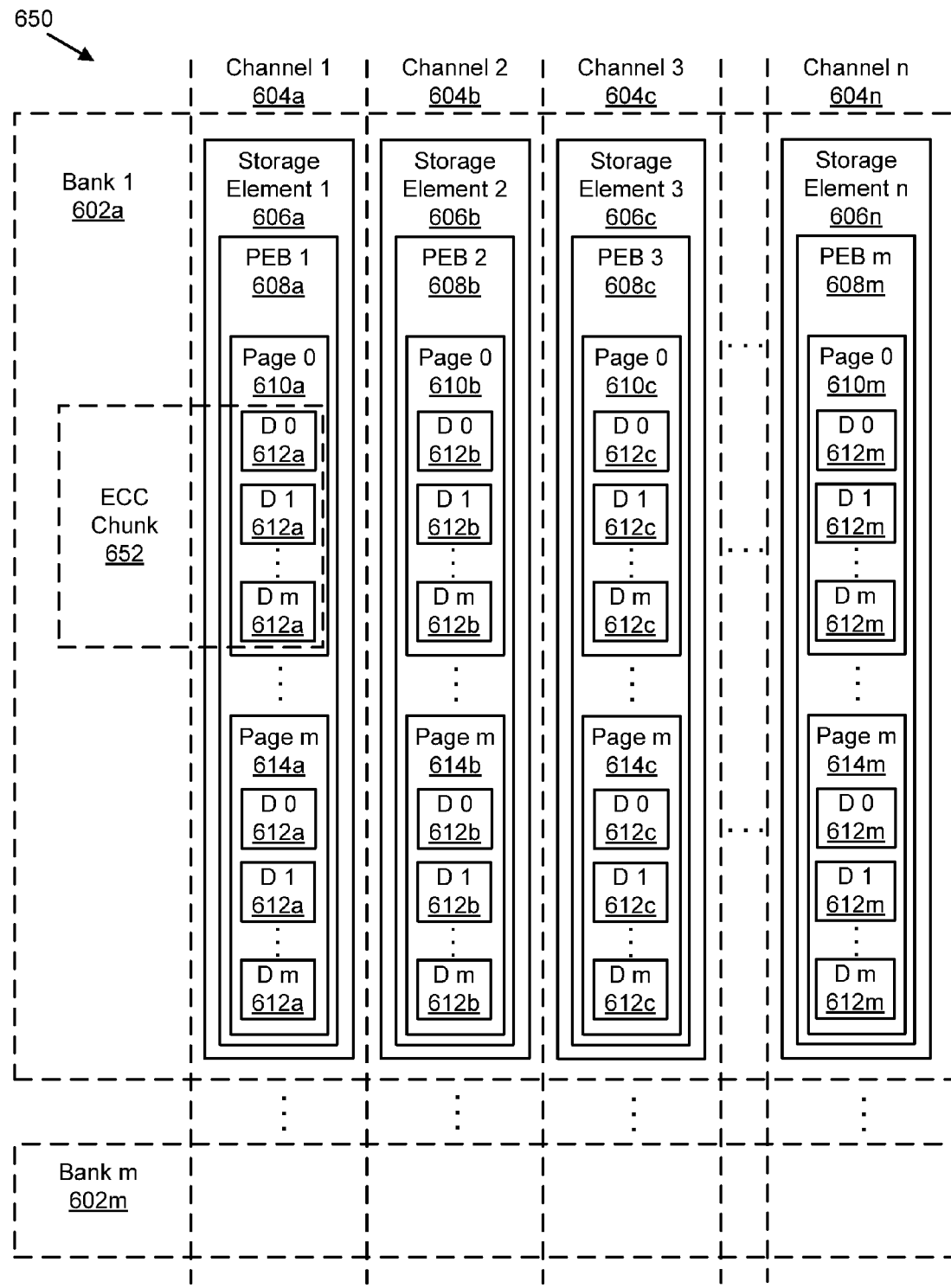
FIG. 6B is a schematic block diagram illustrating another embodiment of an array of storage elements of non-volatile memory media.

As described in greater detail with regard to FIGS. 6A and 6B, in one embodiment, a data set may be stored across several die, chips, channels, storage elements, PEBs, or other grouping of storage cells. ECC checkbits, in one embodiment, may be calculated and stored independently for each grouping of storage cells. In another embodiment, the ECC checkbits, stored together with each grouping of storage cells, for example as part of an ECC chunk/codeword.

In a further embodiment, the ECC module 412 uses ECC checkbits to determine in which die, chip, channel, storage element, PEB, or other grouping of storage cells of the non-volatile memory media 110 an uncorrectable error has occurred. The ECC module 412, in one embodiment, verifies data sets of each grouping of storage cells using ECC checkbits to determine which particular grouping from a set of groupings of storage cells have uncorrectable errors. The configuration module 352, in one embodiment, adjusts one or more read voltage thresholds in the particular groupings of storage cells with an uncorrectable error.

In one embodiment, the distribution module 414 determines that the read bias of the data set is within an expected distribution of the known bias, and that no additional adjustments of the read voltage threshold should be made. In a further embodiment, the data set read module 402, the deviation module 404, the direction module 406, and the adjustment module 408 continue to re-read the data set with a new read voltage threshold, re-determine that the read bias for the data set deviates from the known bias, re-determine the direction of deviation for the data set, and readjust the read voltage threshold until the distribution module 414 determines that the read bias of the data set is within the expected distribution.

The distribution module 414, in one embodiment, may cooperate with or be integrated with the deviation module 404. In one embodiment, the configuration module 352 uses either the ECC module 412 or the distribution module 414 to determine when adjustment of the read voltage threshold should be made or is complete. In a further embodiment, the distribution module 414 compares read biases of data sets from several die, chips, channels, storage elements, PEBs, or other grouping of storage cells of the non-volatile memory media 110 to the distribution of the known bias to determine in which grouping of storage cells an error has occurred, and the configuration module 352 adjusts one or more read voltage thresholds in a grouping of storage cells with an error.

In one embodiment, the ECC module 412 and/or the distribution module 414 cooperate with the data set source module 422. The data set source module 422, in one embodiment, determines from which specific grouping of storage cells the data set was read. For example, the data set source module 422 may determine which die, chip, channel, storage element, PEB, or other grouping of storage cells is the source of the data set. In one embodiment, the data set source module 422 determines from which specific grouping of storage cells the data was read in response to the deviation module 404, the ECC module 412, and/or the distribution module 414 determining that the data set has a read bias that deviates from a known bias, has a data error, or the like.

In one embodiment, the data set source module 422 determines from which specific grouping of storage cells the data set was read based on a position of the data set within a sequence of data sets. For example, in one embodiment, the non-volatile memory media 110 may comprise a plurality of groupings of storage cells, and each grouping of storage cells may be read in parallel during a read operation. The data set source module 422, in one embodiment, may use known information about how the write data pipeline 106 and/or the read data pipeline 108 processes data, and known information about the plurality of groupings of storage cells, to determine from which grouping of storage cells the data set was read.

For example, in one embodiment the write data pipeline 106 and the read data pipeline 108 may each have a 64 bit (8 byte) data path, the non-volatile memory media 110 may comprise a 24 die wide array, and 8 bytes may be read in parallel from each of the 24 die during a read operation, for a total of 192 bytes per read operation. Based on this information, the data set source module 422, in one embodiment, can determine from which die or other grouping of storage cells, a data set was read based on the position of an 8 byte data set within the 192 bytes.

The data set source module 422, in a further embodiment, may count or otherwise track the number of data sets processed as part of a read operation to determine the position of the data set in the sequence of data sets. For example, 8 bytes may be read in sequence from the 24 die starting with a first die, thus if the ECC module 412 and/or the distribution module 414 detects a read bias deviation or a data error during operations on the fifth 8 byte set of data, the data set source module 422 identifies that this 8 byte set of data came from the fifth die of the 24 die.

By using the position of the data set in a sequence of data sets and other known information, the data set source module 422, in one embodiment, can determine the grouping of storage cells from which the data set was read without using an identifier or other external information. Identifying the die, chip, channel, PEB, or other grouping of storage cells that exhibit the read bias difference permits prompt remedial actions to be taken such as changing the read voltage threshold, logical swapping of the grouping of storage cells with a reserved grouping, and other forms of remedial action.

In one embodiment, the proactive configuration module 424 manages the non-volatile memory media 110 by proactively setting and adjusting configuration parameters for storage cells of the non-volatile memory media 110. By determining configuration parameters proactively before an error occurs, the proactive configuration module 424 may prevent certain errors from occurring, without the performance penalty of retrying reads or performing other remedial measures for the prevented errors. The proactive configuration module 424, in certain embodiments, optimizes configuration parameters for a use case of the non-volatile memory device 102 to optimize storage cells for the use case instead of using default parameters.

As described above, a configuration parameter is a parameter of a set of storage cells that is modifiable by way of an interface, such as a read threshold, a write or program threshold, an erase threshold, or the like. An interface for modifying a configuration parameter may include a programmable data register, a command interface of a control bus for the non-volatile memory media 110, an API of a device driver of the non-volatile memory device 102, a control parameter for the non-volatile memory controller 104, or the like.

The proactive configuration module 424 references one or more media characteristics for a set of storage cells to determine a configuration parameter for the set of storage cells. A media characteristic is a statistic, heuristic, mathematical model, transform, or other descriptor associated with an attribute of the non-volatile memory media 110. A media characteristic for a set of storage cells may be substantially static or may be dynamic and change over time.

A media characteristic, in one embodiment, includes or relates to a make, a model, a manufacturer, a product version, or the like for the non-volatile memory device 102 and/or for the non-volatile memory media 110. In another embodiment, a media characteristic describes an attribute or statistic for a set of particular storage cells, such as a program/erase cycle count for the set of storage cells, a read count for the set of storage cells, a retention time since a previous write for the set of storage cells, a dwell time for the set of storage cells such as a logical or physical erase block (e.g., a time between a program of an erase block and an erase of the erase block), an average of multiple previous dwell times for the set of storage cells, an error statistic for the set of storage cells, or the like. A media characteristic, in a further embodiment, may include or relate to an environmental condition or a use of the non-volatile memory device 102 and/or of the non-volatile memory media 110, such as a temperature, a use case (e.g., a cache use case, an archival use case, a server use case, an enterprise use case, a consumer use case, etc.), or the like.

The proactive configuration module 424, in response to determining a configuration parameter for a set of storage cells, configures the set of storage cells to use the determined configuration parameter. The proactive configuration module 424 may periodically update media characteristics for a set of storage cells, update a configuration parameter for the set of storage cells, and reconfigure the set of storage cells to use the updated configuration parameter. The proactive configuration module 424 may configure storage cells with configuration parameters during execution of input/output operations, during a startup operation, in response to a background scan of a set of storage cells indicating a changed media characteristic, or the like.

In order to reduce the overhead associated with tracking configuration parameters for each storage cell, each page, each erase block, or the like, in one embodiment, the proactive configuration module 424 manages configuration parameters in groups or sets. For example, the proactive configuration module 424 may determine and manage configuration parameters for groups or sets of pages, physical erase blocks, logical erase blocks, wordlines, ECC chunks/codewords, chips, die, planes in a die, or other storage regions. The proactive configuration module 424 may group pages or other storage regions that have similar media characteristics, such as similar error rates (e.g., RBER, UBER), similar ages, similar program/erase counts, similar physical media locations, similar locations in a programming order, similar architectures, or the like, and determine different configuration parameter settings for the different groups. For example, the proactive configuration module 424, in certain embodiments, may group upper pages (e.g., MSB pages), lower pages (e.g., LSB pages), subsets of upper and/or lower pages, a set of the first N pages in a page programming order, a set of the middle N pages in a page programming order, a set of the last N pages in a page programming order, and/or other subsets of pages or other storage regions, and may manage configuration parameter settings by group or set.

In certain embodiments, the proactive configuration module 424 configures storage cells independently of the adjustments described above with regard to the adjustment module 408. For example, the proactive configuration module 424 may be separate from the configuration module 352, the proactive configuration module 424 may be part of a storage controller 104 without a configuration module 352, or the like. In other embodiments, the adjustment module 408 and the proactive configuration module 424 may cooperate. For example, the adjustment module 408 may make closed loop feedback based adjustments to one or more configuration parameters that the proactive configuration module 424 has set using an open loop model, or the like.

In one embodiment, the write voltage module 416 sets a write voltage level for writing data to the storage cells of the non-volatile memory media 110. The write voltage level is a programming voltage that specifies the minimum or maximum voltage used to program or change a state of a storage cell, a step magnitude for an incremental step pulse programming operation, a maximum number of iterations for an incremental step pulse programming operation, a program verify threshold for a program operation, an initial bias for an incremental step pulse programming operation, or the like. In one embodiment, the write voltage module 416 may be integrated with the configuration module 352 and/or the proactive configuration module 424.

For example, for NAND flash non-volatile memory, the write voltage and/or other program related configuration parameters, changes the state of a storage cell from a binary one to a binary zero. The write voltage module 416, in one embodiment, writes known patterns to the storage cells, then reads the pattern back determining the read voltage threshold, and adjusts the write threshold until the desired read threshold is met. The write voltage module 416, in a further embodiment, adjusts the write voltage level based on a mathematical model that specifies write voltage level values based on endurance and data retention requirements of a storage cell relative to an age of the storage cell. In one embodiment, the age of the storage cell is computed in terms of program and erase cycles. The write voltage module 416, in one embodiment, performs a test write to one or more storage cells, detects the read voltage of at least one of the storage cells, and adjusts the write voltage level until the read voltage meets a threshold value. The write voltage module 416, in a further embodiment, performs the test write by writing a data set with a known bias to the storage cells, and tests the read voltage by determining if a read bias of the read data set deviates from the known bias.

The write voltage module 416, in one embodiment, may begin with a minimum write voltage, and increase the write voltage until the read voltage meets a threshold value. In a further embodiment, the write voltage module 416 may begin with a maximum write voltage, and decrease the write voltage until the read voltage meets a threshold value. The write voltage module 416, in one embodiment, may select a write voltage level that balances the time to program the storage cells with a desired endurance and/or data retention for the storage cells.

Proactive Configuration

Figure 5:
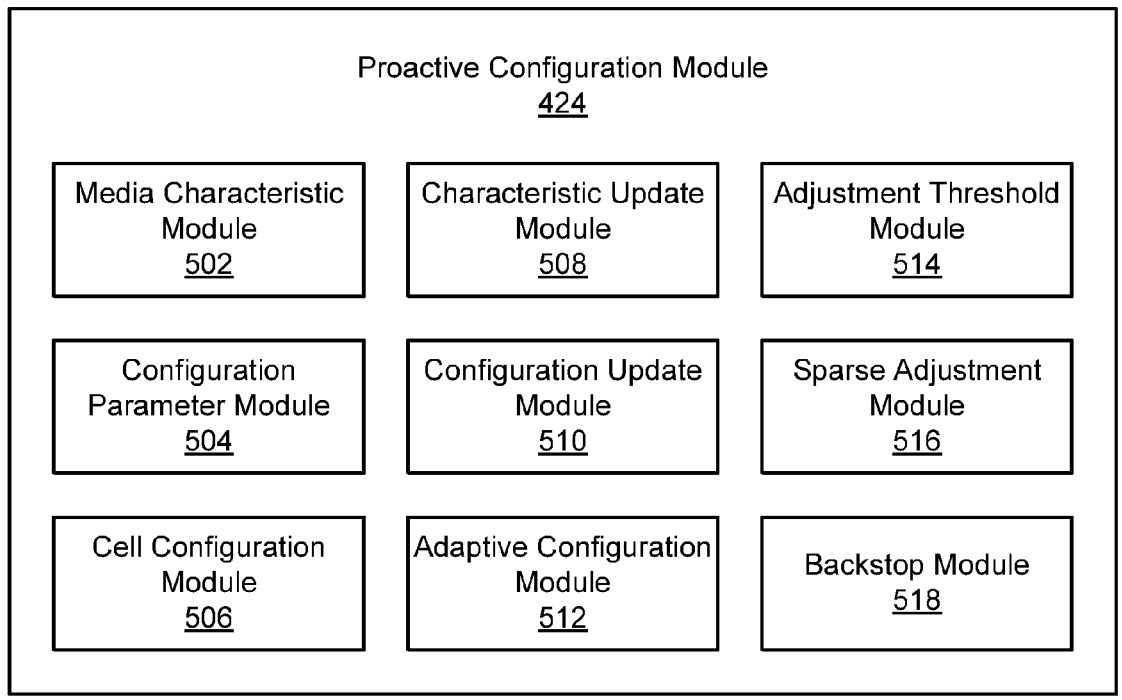
FIG. 5 is a schematic block diagram illustrating one embodiment of a proactive configuration module.

FIG. 5 depicts one embodiment of the proactive configuration module 424. The proactive configuration module 424, in certain embodiments, may be substantially similar to the proactive configuration module 424 described above with regard to FIG. 4. In the depicted embodiment, the proactive configuration module 424 includes a media characteristic module 502, a configuration parameter module 504, a cell configuration module 506, a characteristic update module 508, a configuration update module 510, an adaptive configuration module 512, an adjustment threshold module 514, a sparse adjustment module 516, and a backstop module 518.

At least a portion of the media characteristic module 502, the configuration parameter module 504, the cell configuration module 506, the characteristic update module 508, the configuration update module 510, the adaptive configuration module 512, the adjustment threshold module 514, the sparse adjustment module 516, and the backstop module 518 may be part of a device driver installed on the computer 112 or another host device for the non-volatile memory device 102 and/or part of hardware for the non-volatile memory device 102, such as firmware of an FPGA, an ASIC, or the like.

In one embodiment, the media characteristic module 502 references or otherwise determines one or more media characteristics for a set of storage cells of the non-volatile memory media 110, for abodes or storage states of a set of storage cells of the non-volatile memory media 110, or the like. The set of storage cells may comprise a single storage region, such as a physical page, a logical page, a physical erase block, a logical erase block, a wordline, an ECC chunk/codeword, a chip, a die, a plane in a die, or the like, or may comprise a set of multiple storage regions. In certain embodiments, different storage states, abodes, encoding digits (e.g., LSB, MSB) of the storage cells of the non-volatile memory media 110, as described in greater detail below with regard to FIGS. 6C and 6D, may have different media characteristics, and the media characteristic module 502 may monitor or otherwise determine the different media characteristics separately for different abodes/storage states, or the like.

The media characteristic module 502 may determine one or more media characteristics itself, may receive media characteristics from another module, may retrieve media characteristics from a media characteristic repository, or the like. As described above, a media characteristic is a statistic, heuristic, or other descriptor associated with an attribute of the non-volatile memory media 110. Media characteristics may include and/or relate to a make, a model, a manufacturer, a product version, or the like for the non-volatile memory device 102 and/or for the non-volatile memory media 110; an attribute or statistic for a set of storage cells; an environmental condition or a use case of the non-volatile memory device 102 and/or of the non-volatile memory media 110; and/or another statistic, heuristic, or other descriptor for an attribute of the non-volatile memory media 110.

A media characteristic for a set of storage cells affects or informs the determination of a configuration parameter for the set of storage cells. In one embodiment, the media characteristics include a program/erase cycle count for a set of storage cells. In another embodiment, the media characteristics include a read count for a set of storage cells. The media characteristics, in a further embodiment, include a retention time since a previous write for a set of storage cells. In an additional embodiment, the media characteristics include a temperature for a set of storage cells. The media characteristics, in certain embodiments, include a use case for a set of storage cells. In another embodiment, the media characteristics include an error statistic for a set of storage cells, such as an UBER, a RBER, or the like. In a further embodiment, the media characteristic may include previous or historical configuration parameters for a set of storage cells, configuration parameters or media characteristics for other sets of storage cells, or the like.

The media characteristic module 502, in certain embodiments, manages the collection of and/or maintenance of media characteristics. The media characteristic module 502 may maintain media characteristics in and/or retrieve media characteristics from a media characteristic repository. One example of a media characteristic repository is described in greater detail below with regard to FIGS. 7A and 7B. The media characteristic module 502, in certain embodiments, references, determines, and/or manages media characteristics for several different sets of storage cells, such as each storage region or storage division of the non-volatile memory device 102. A media region may include an erase block (logical or physical), a page (logical or physical), an ECC chunk/codeword, a division within a page, a set of pages, a die, a plane in a die, a chip, or the like.

In one embodiment, the media characteristic module 502 may be similar to, may work with, and/or may be integrated with the device factor module 354 described above with regard to FIG. 3B. For example, the media characteristics may include one or more of the statistics described above with regard to the device factor module 354, such as a temperature for the non-volatile memory device 102, an error rate for the non-volatile memory device 102 (such as an UBER, RBER, or the like), a program/erase cycle count for the non-volatile memory device 102, a storage request latency for the non-volatile memory device 102 (such as an average, maximum, or other storage request execution latency), an age of the non-volatile memory device 102, and/or other statistics or characteristics. The media characteristic module 502, in certain embodiments, may receive input, directly or indirectly, from the one or more sensors 356, from other modules or elements such as the ECC decoder 322, or the like.

In one embodiment, the configuration parameter module 504 determines a configuration parameter for a set of storage cells based on one or more media characteristics from the media characteristic module 502 for the set of storage cells. The set of storage cells for which the configuration parameter module 504 determines the configuration parameter may include an erase block (logical or physical), a page (logical or physical), an ECC chunk/codeword, a division within a page, a set of pages, a die, a plane in a die, a chip, or the like. The configuration parameter module 504 may determine different configuration parameters for different sets of storage cells, different sets of pages, different abodes/storage states of storage cells, or the like, based on the corresponding media characteristics. The configuration parameter module 504, in certain embodiments, determines configuration parameters dynamically during operation or runtime of the non-volatile memory device 102, as adjustments or updates to initial or default settings.

As described above, a configuration parameter is a parameter of a set of storage cells that is modifiable by way of an interface. Configuration parameters may relate to writing to or programming storage cells, reading from storage cells, erasing storage cells, and/or to another parameter for storage cells. The configuration parameter module 504 may determine a configuration parameter as an absolute data value, as an offset or adjustment to a data value, or as another parameter with which the cell configuration module 506 can configure a set of storage cells, as described below.

One embodiment of a configuration parameter for reading from storage cells is a read threshold such as a read voltage threshold, a resistivity threshold, or the like. Other embodiments of configuration parameters for reading from storage cells may include whether to perform a read retry in response to an error, whether to adjust a read threshold or other configuration parameter prior to a read retry, or the like. For example, the configuration parameter module 504 may determine a number of read retries to perform, a maximum number of read retries, configuration parameters for each read retry, or the like based on discovered or monitored media characteristics, media characteristics from a vendor or manufacturer, or the like.

Various embodiments of configuration parameters for writing/programming storage cells include a step magnitude for an incremental step pulse programming operation, a maximum number of iterations for an incremental step pulse programming operation, a program verify threshold for a program operation, an initial bias for an incremental step pulse programming operation, a duration for an incremental step pulse programming operation, or the like. A configuration parameter for erasing storage cells, in certain embodiments, may include a step magnitude for an incremental step pulse erase operation, a maximum number of iterations for an incremental step pulse erase operation, an erase verify threshold for an erase operation, an initial bias for an incremental step pulse erase operation, a duration for an incremental step pulse programming operation, or the like. One of skill in the art, in light of this specification, will recognize other configuration parameters for storage cells that may be modifiable by way of an interface.

A configuration parameter for managing, reading from, writing/programming to, and/or erasing storage cells, as described above, may generally be referred to as a storage threshold for the storage cells. For example, a storage threshold, in various embodiments, may include a read voltage threshold, a resistivity threshold, a number of read retries to perform, a maximum number of read retries, a step magnitude for an incremental step pulse programming operation, a maximum number of iterations for an incremental step pulse programming operation, a program verify threshold for a program operation, an initial bias for an incremental step pulse programming operation, a duration for an incremental step pulse programming operation, a step magnitude for an incremental step pulse erase operation, a maximum number of iterations for an incremental step pulse erase operation, an erase verify threshold for an erase operation, an initial bias for an incremental step pulse erase operation, a duration for an incremental step pulse programming operation, or another storage threshold.

The configuration parameter module 504 may base a configuration parameter on one or more media characteristics by entering the one or more media characteristics into an equation, into a mathematical model, into a lookup table ("LUT"), into a matrix, or the like; by performing a predefined transform or operation on the one or more media characteristics; or by otherwise referencing and/or manipulating the one or more media characteristics to determine the configuration parameter. A configuration parameter equation, mathematical model, LUT, matrix, or the like may be based on empirical data, such as test data, historical data, and the like. A design engineer or the like, in one embodiment, may test sets of storage cells with various media characteristics, such as non-volatile memory media from various manufacturers or the like, and determine optimal configuration parameters for storage cells with the various media characteristics. For example, an equation, mathematical model, LUT, matrix, or the like may indicate that non-volatile memory media 110 from manufacturer X tends to have Y amount of natural drift in cell values after 1,000 program/erase cycles such that a read threshold can be increased by Z volts to compensate, or the like.

In other embodiments, the configuration parameter module 504 may dynamically determine a configuration parameter; an equation, mathematical model, LUT, matrix, transform, or the like to define a configuration parameter; an adjustment to a configuration parameter; or the like during operation of the non-volatile memory device 102, as described above with regard to the adjustment module 408. For example, the configuration parameter module 504 may determine configuration parameters for various media characteristics initially based on trial and error, based on a direction from the direction module 406, or the like and may autonomously correlate the effectiveness of the configuration parameter, based on a change in an error rate such as RBER, UBER, or the like, to determine an equation, mathematical model, LUT, matrix, transform, or the like for determining subsequent configuration parameters and/or configuration parameter adjustments.

In one embodiment, the media characteristics for a set of storage cells include a temperature. A temperature for a set of storage cells may affect the speed of the effects of one or more other media characteristics on the set of storage cells. For example at higher temperatures, the rate of change for media characteristics relating to error statistic such as Raw Bit Error Rates (RBER) and data retention times may increase and certain adjustments to configuration parameters may mitigate the effect. In certain embodiments, the configuration parameter module 504 may adjust or scale a configuration parameter, a media characteristic, or the like by a temperature to compensate for the effects of temperature, normalizing the data for temperature. The temperature for a set of storage cells may be an average temperature, a temperature over a sliding window, a current temperature, a temperature for the non-volatile memory device 102, or another temperature measurement associated with one or more sets of storage cells.

The one or more media characteristics, in one embodiment, indicate to the configuration parameter module 504 a trend, an optimization, or the like for a configuration parameter and the configuration parameter module 504 determines a configuration parameter to satisfy the trend or optimization. For example, a magnitude of a program/erase cycle count, a read count, a UBER, a RBER, or another media characteristic may indicate an amount that a read voltage or other configuration parameter has drifted, and the configuration parameter module 504 may proactively determine a read voltage threshold or other configuration parameter based on the media characteristic, without direct feedback from the storage cells, such as a read, a read retry, or the like.

In one embodiment, the configuration parameter module 504 maintains configuration parameters for sets of storage cells of different storage regions or storage divisions of the non-volatile memory media 110, such as an erase block (logical or physical), a page (logical or physical), an ECC chunk/codeword, a division within a page, a set of pages, an abode/storage state, a die, a plane in a die, a chip, or the like, in a configuration parameter repository. One example of a configuration parameter repository is described in greater detail below with regard to FIGS. 8A and 8B. By determining and managing separate media characteristics and/or configuration parameters for different storage regions, for different abodes/storage states, or the like, the proactive configuration module 424, in certain embodiments, may customize configuration parameters for each storage region or abode/storage state individually, thereby reducing errors, extending the lifetime of the non-volatile memory media 110, or the like.

Different abodes/storage states of storage cells may have different media characteristics. For example, certain abodes/storage states, such as the L0 state described below with regard to FIG. 6C, may be more prone to program, read, or other disturbances. An abode or storage state, as used herein, is the range of read levels, such as a read voltage level for flash media, a read resistivity level for PCM media, or the like, associated with a particular set of data values. Read thresholds, such as a read voltage threshold, a read resistivity threshold, or the like, may separate abodes or storage states. One example of abodes or storage states is described below with regard to FIGS. 6C and 6D, where abode L0 corresponds to data values 11, L1 corresponds to 01, L2 corresponds to 00, and L3 corresponds to 10 and abodes L0, L1, L2, and L3 are divided by read voltage thresholds 662*a-c* in FIG. 6C and by adjusted read voltage thresholds 664*a-c* in FIG. 6D.

For a given storage cell or set of storage cells, in one embodiment, the configuration parameter module 504 may determine and manage multiple configuration parameters. In certain embodiments, the configuration parameter module 504 may individually determine and manage different settings or adjustments for configuration parameters for each storage state or abode of storage cells of the non-volatile memory media 110. For example, the configuration parameter module 504 may determine different read voltage threshold settings for abodes/storage states L0, L1, L2, and L3 as described below with regard to FIGS. 6C and 6D, may determine different settings or adjustments for read level R1, read level R2, and read level R3 for storage cells as described below with regard to FIGS. 8A and 8B, may determine an incremental step pulse programming parameter for a programming operation as described above, may determine an incremental step pulse erase parameter for an erase operation as described above, or the like. In this manner, the configuration parameter module 504 may optimize configuration parameter settings individually for different abodes/storage states.

In certain embodiments, to reduce the overhead of tracking media characteristics and/or configuration parameters at a fine grain, such as for each storage cell, each page, each erase block, or the like, the configuration parameter module 504 may determine, select, or otherwise manage configuration parameters in groups or sets. For example, the configuration parameter module 504 may determine and manage configuration parameters for groups or sets of pages, physical erase blocks, logical erase blocks, wordlines, ECC chunks/codewords, chips, die, planes in a die, or other storage regions. The configuration parameter module 504 may group pages or other storage regions that have similar media characteristics, such as similar error rates (e.g., RBER, UBER), similar ages, similar program/erase counts, similar physical media locations, similar architectures, or the like, and determine different configuration parameter settings for the different groups or sets.

For example, in one embodiment, even and odd pages may have different error rates, such as RBERs, UBERs, or the like, and the configuration parameter module 504 may determine a first configuration parameter for a set of even pages and a second configuration parameter for a set of odd pages. In another embodiment, upper and lower pages of multi-level storage cells may have different error rates, such as RBERs, UBERs, or the like, and the configuration parameter module 504 may determine a first configuration parameter for a set of lower pages and a second configuration parameter for a set of upper pages. In a further embodiment, one or more pages toward a first end of the upper pages and one or more pages toward a second end of the upper pages may have higher error rates, such as RBERs, UBERs, or the like, than the other upper pages, and the configuration parameter module 504 may determine a third configuration parameter for a set including the one or more pages toward the first end and the one or more pages toward the second end.

In general, pages or storage regions may be divided into groups or sets with similar media characteristics, such as error rates, ages, program/erase counts, physical media locations, architectures, or the like, and the configuration parameter module 504 may determine different configuration parameters for the different groups or sets. The configuration parameter module 504, in certain embodiments, may base a configuration parameter for a set of pages or other storage regions on an average media characteristic for the set, such as a mean, median, mode, or the like. Examples of sets of pages grouped by error rate are described below with regard to FIGS. 6E, 6F, and 6G. Even when managing or determining configuration parameters by sets, groups, or storage regions, in certain embodiments, the configuration parameter module 504 may also determine different configuration parameters for different abodes/storage states of the storage cells within the sets, groups, or storage regions.

For example, the configuration parameter module 504 may determine settings for the R1, R2, and R3 read voltage thresholds for a first set of pages and may determine different settings for the R1, R2, and R3 read voltage thresholds for a second set of pages, as described below with regard to FIG. 8B. In one embodiment, storage cells may be in more than one set of pages, such as a set of upper pages and a set of lower pages or the like, and the configuration parameter module 504 may determine different configuration parameters for the same storage cells depending on which page is being accessed or used. While the three read voltage thresholds R1, R2, R3 of FIG. 8 are provided as one example embodiment, in other embodiments, storage cells may have different numbers of storage states/abodes, read voltage thresholds, or other configuration parameters. For example, in one embodiment, certain 20 nm non-volatile memory media 110 may have ten different read voltage thresholds R1-R10, set using different registers or the like, and the configuration parameter module 504 may determine different values for R1-R10 for different sets, groups, storage regions, and/or different abodes/storage states.

In certain embodiments, the configuration parameter module 504 may determine a configuration parameter for one set of storage cells based on another target set of storage cells. The target set of storage cells may have known and/or controlled use characteristics (e.g., media characteristics or the like) that the configuration parameter module 504 uses to determine a configuration parameter for another set of storage cells. In particular, the configuration parameter module 504 may compare media characteristics of the target set of storage cells to media characteristics of a set of storage cells presently being configured. Such a comparison can be used to further optimize the determined configuration parameter for the set of storage cells. The target set of storage cells may store known data, such as metadata, system data, a known pattern of data, or the like, and the configuration parameter module 504 may determine a configuration parameter for another set of data based on the known data.

In another embodiment, the configuration parameter module 504 determines a configuration parameter for a set of storage cells based on a determined configuration parameter for a target set of storage cells, based on one or more media characteristics for a target set of storage cells, or the like. For example, the configuration parameter module 504 may use a configuration parameter for a target set of storage cells as a configuration parameter for another set of storage cells, may adjust a configuration parameter of a target set of storage cells for use in determining the configuration parameter for another set of storage cells, may use media characteristics for a target set of storage cells to determine a configuration parameter for another set of storage cells, or the like. In this manner, the target set of storage cells serves as a control group for use in managing other sets of storage cells. The target set of storage cells may be used in certain embodiments in a manner analogous to how "system tracks" have been used in hard disk drive technologies to make modifications to configuration parameters over the life of the storage device 102.

In a further embodiment, the configuration parameter module 504 compares one or more media characteristics for a set of storage cells to one or more media characteristics for a target set of storage cells and determines a configuration parameter for the set of storage cells based on a difference between the media characteristics.

The configuration parameter module 504, in certain embodiments, bases a configuration parameter for a set of storage cells on a target set of storage cells to bootstrap the configuration parameter in response to a lack of known media characteristics for the set of storage cells. The configuration parameter module 504 may bootstrap a configuration parameter for a set of storage cells during a startup operation or another operation where media characteristics for the set of storage cells may not yet be available, but media characteristics or other data may be available for a target set of storage cells. For example, metadata stored in a metadata region of the non-volatile memory media 110 may have a known or controlled program/erase count and the configuration parameter module 504 may base a configuration parameter for a region of the non-volatile memory media 110 storing user data on the known or controlled program/erase count for the metadata region.

In one embodiment, the cell configuration module 506 configures a set of storage cells to use a configuration parameter that the configuration parameter module 504 determines for the set of storage cells. As described above, a set of storage cells may include groups or sets of pages, physical erase blocks, logical erase blocks, wordlines, ECC chunks/codewords, chips, die, planes in a die, or other storage regions including one or more storage cells. The storage cell configuration module 506 may configure different sets of storage cells, different sets of pages, different storage states or abodes of storage cells, or the like to use different configuration parameters, as determined by the configuration parameter module 504. The cell configuration module 506, in one embodiment, configures storage cells to use a configuration parameter such that the configuration parameter is used for subsequent accesses to and/or operations on the storage cells.

The cell configuration module 506 uses an interface of a set of storage cells to configure the set of storage cells. The interface may comprise a publicly known interface or a proprietary interface. The configuration module 506 may configure a set of storage cells by setting a data register, by sending a command over a command interface of a control bus for the non-volatile memory media 110, by calling an API of a device driver of the non-volatile memory device 102, by setting a control parameter for the non-volatile memory controller 104, or otherwise configuring the set of storage cells. The cell configuration module 506 may use particular command instructions, a particular sequence of command instructions, and/or use particular parameters, register settings, or other differences from regular commands (general purpose commands) used to interface with the set of storage cells. The cell configuration module 506 may receive configuration parameters from the configuration parameter module 504, may retrieve configuration parameters from a configuration parameter repository, or the like.

The cell configuration module 506, in one embodiment, configures a set of storage cells to use a determined configuration parameter in response to a trigger. The trigger, in certain embodiments, is selected based on an architecture of the non-volatile memory device 102 and/or of the non-volatile memory media 110. For example, certain non-volatile memory devices 102 and/or non-volatile memory media 110 may retain a configuration parameter across multiple input/output operations, while another non-volatile memory device 102 and/or non-volatile memory media 110 may require a configuration parameter to be set with each input/output operation, or the like. The cell configuration module 506 may configure a set of storage cells once during initialization of the non-volatile memory media 110, dynamically with each command issued to the set of storage cells, during operation of the non-volatile memory media 110 in response to events or time intervals, in response to another trigger, or the like.

In one embodiment, a trigger for the cell configuration module 506 includes a change in a media characteristic for a set of storage cells, a change of a predefined magnitude in a media characteristic for the set of storage cells, or the like, and the cell configuration module 506 configures the set of storage cells in response to a change in the media characteristics. In another embodiment, a trigger for the cell configuration module 506 includes an input/output request for a set of storage cells, such as a read request, a write request, an erase request, or the like. For example, in certain embodiments, the cell configuration module 506 may configure a set of storage cells to use a read configuration parameter in response to a read request for the storage cells, may configure a set of storage cells to use a write configuration parameter in response to a write request for the storage cells, may configure a set of storage cells to use an erase configuration parameter in response to an erase request, or the like.

In a further embodiment, a startup operation for the non-volatile memory device 102, a regular shutdown operation for the non-volatile memory device 102, or the like is a trigger for the cell configuration module 506 to configure one or more sets of storage cells. In certain embodiments, once the cell configuration module 506 configures a set of storage cells with a configuration parameter in response to a startup operation, the set of storage cells retain the configuration parameter until a shutdown operation and a subsequent startup operation, or the like. How a set of storage cells retain configuration parameters may vary depending on the type of configuration parameter, the architecture of the set of storage cells, and the like.

The cell configuration module 506, in a further embodiment, may configure only a subset of one or more abodes/storage states of a set of storage cells to use a configuration parameter. For example, if a configuration parameter setting for an abode/storage state has little or no change from a previous configuration parameter setting, from a default configuration parameter setting, or the like, the cell configuration module 506 may configure one or more other abodes/storage states without configuring the abode/storage state with little or no change in the configuration parameter setting. In certain embodiments, configuration settings for different abodes/storage states of a set of storage cells may be set by writing the settings to different registers associated with the different abodes/storage states, and the cell configuration module 506 may write configuration settings, such as read voltage thresholds or the like, only to registers for which the configuration settings have changed. In other embodiments, the cell configuration module 506 may set configuration settings for each abode/storage state of a set of storage cells in response to each storage request or other trigger event.

The cell configuration module 506 may configure storage cells a storage region at a time, writing configuration parameter settings to registers for a group or set of pages, a physical erase block, a logical erase block, a wordline, an ECC chunk/codeword, a chip, a die, a plane in a die, or another storage region. In certain embodiments, the cell configuration module 506 may configure storage cells by storing configuration parameter settings in a bank cache such as a buffer 222 or the like for the non-volatile memory media 110. In a further embodiment, the cell configuration module 506 may configure storage cells using a configuration parameter override table or other override metadata configured, scaled, or otherwise structured according to an architecture of the non-volatile memory media 110.

In one embodiment, the characteristic update module 508 updates one or more media characteristics for a set of storage cells in response to an update event for the set of storage cells. An update event is a trigger, in response to which, the characteristic update module 508 updates media characteristics. Certain media characteristics, such as a make, a model, a manufacturer, a product version, or the like of the non-volatile memory device 102 and/or the non-volatile memory media 110 may be substantially static, and the characteristic update module 508, in certain embodiments, may not update such media characteristics, may update such media characteristics less frequently, or the like. Other media characteristics, such as a program/erase cycle counts, read counts, retention times, temperatures, use cases, error statistics, and the like may be dynamic and change frequently.

In one embodiment, a background scan of the non-volatile memory media 110 may be an update event. For example, the characteristic update module 508 may perform a background scan of the non-volatile memory media 110 and update records of media characteristics for sets of storage cells in response to scanning the sets of storage cells during the background scan. A background scan, in certain embodiments, may be informed by or optimized based on media characteristics of the non-volatile memory media, may be configured to determine media characteristics per abode/storage state, or the like.

In another embodiment, an input/output request for the set of storage cells or for a neighboring set of storage cells, such as a read request, a write request, an erase request, or the like, is an update event and the characteristic update module 508 updates media characteristics for a set of storage cells in response to the input/output request. An update event for the characteristic update module 508, in a further embodiment, may include a startup operation and/or shutdown operation for the non-volatile memory device 102. In certain embodiments, a garbage collection operation for a set of storage cells is an update event. For example, the characteristic update module 508 may update media characteristics for a set of storage cells as a garbage collection operation recovers storage capacity of the set of storage cells, or the like.

The characteristic update module 508, in one embodiment, updates media characteristics in cooperation with the media characteristic module 502, using the media characteristic module 502, or the like. In certain embodiments, the characteristic update module 508 may update media characteristics stored in a media characteristic repository, as described in greater detail below with regard to FIGS. 7A and 7B.

In one embodiment, the configuration update module 510 updates a configuration parameter for a set of storage cells. The configuration update module 510, in certain embodiments, updates a configuration parameter in response to a change in one or more media characteristics corresponding to the configuration parameter. The characteristic update module 508 may notify the configuration update module 510 that the characteristic update module 508 has updated a media characteristic, the configuration update module 510 may periodically scan media characteristics for changes, the configuration update module 510 may check media characteristics for changes in response to a configuration trigger for a set of storage cells, or the like.

In certain embodiments, the configuration update module 510 updates a configuration parameter in response to a change in a media characteristic that is greater than a predefined change threshold. The configuration update module 510, in one embodiment, updates configuration parameters in cooperation with the configuration parameter module 504, using the configuration parameter module 504, or the like. The configuration update module 510, in another embodiment, may update configuration parameters stored in a configuration parameter repository, as described in greater detail below with regard to FIGS. 8A and 8B.

In one embodiment, the adaptive configuration module 512 dynamically adjusts and adapts one or more configuration parameters, thresholds, management techniques, or the like for the non-volatile memory device 102 and/or for the non-volatile memory media 110. In certain embodiments, the adaptive configuration module 512 may adjust or adapt as the non-volatile memory device 102 ages, as a use case for the non-volatile memory device 102 changes, or the like. Examples of use cases may include a cache use case, an archival use case, a server use case, an enterprise use case, a consumer use case, or the like.

The adaptive configuration module 512, in one embodiment, bases adjustments or adaptations on a priori knowledge for the non-volatile memory device 102, collected run-time statistics for the non-volatile memory device 102, media characteristics for storage cells of the non-volatile memory device 102, or the like. Unlike magnetic storage, media attributes for non-volatile memory typically vary over a storage device's useful life. For example, storage regions of the non-volatile memory media 110 may be periodically processed for storage capacity recovery or garbage collection to manage the impact of read disturbs and to ensure reliable data retention.

In non-volatile memory media 110, an effect called read disturb can occur in unselected storage cells when adjacent storage cells are selected and read, causing charge to collect on the floating gates of the unselected storage cells making the unselected storage cells have an increased voltage that has not been deliberately applied. One approach to combating the effects of read disturb, is to move valid data out of the disturbed cells while the values in those cells are still determinable. The valid data may be re-written to a new physical location and the disturbed cells are erased to remove the effects of the read disturb. This approach is called a refresh and the time between refresh operations is referred to as a data refresh interval. A read disturb threshold is a number of reads of neighboring cells before remedial action is needed to mitigate the effects of read disturb. A data refresh interval at which storage regions are processed for storage capacity recovery and/or data refresh, that is appropriate for a non-volatile memory device 102 near an end of life may be too aggressive for a non-volatile memory device 102 at the beginning of use.

The adaptive configuration module 512, in various embodiments, may dynamically adjust or adapt a data refresh interval based on an age (in absolute time, in powered-on time, in an amount of user data written, or the like) of the non-volatile memory device 102, a read disturb threshold (e.g., a number of read operations before data is refreshed to mitigate effects of read disturb) based on wear of the non-volatile memory device 102, an erase block retirement policy based on an age of the non-volatile memory device 102, a garbage collection method for the non-volatile memory device 102 based on host workload, garbage collection by zone of the non-volatile memory device 102 based on levels of extent activity to minimize stir between active and inactive data, scrubbing intervals to increase scrubbing as the non-volatile memory device 102 ages, or the like.

In one embodiment, the adjustment threshold module 514 cooperates with the configuration parameter module 504 and/or the cell configuration module 506 to use a current configuration parameter setting for a set of storage cells in response to a target configuration parameter setting that the configuration parameter module 504 determines for the set of storage cells being within a threshold range of the current configuration parameter setting. For example, if a target configuration parameter, such as a read voltage threshold, is within a predefined range of a current setting for the configuration parameter, the adjustment threshold module 514 may determine not to adjust the configuration parameter to the target, but to use the current setting (e.g., a "no-op" or "gimme"). In certain embodiments, based on differences between target settings and current settings for a set of configuration parameters, the cell configuration module 506 may set one or more configuration parameters to their target settings, while leaving one or more other configuration parameters at their current settings. For example, the adjustment threshold module 514 may determine that the cell configuration module 506 sets one or two read voltage thresholds for a read operation, without setting the other read voltage thresholds for the particular read operation, because the target settings for the other read voltage thresholds may be within a threshold range of the current settings, or the like.

The threshold range for the adjustment threshold module 514 may be selected such that errors caused by the difference between the target setting and the current setting are minimal, are correctable, or the like. Configuring a set of storage cells to use a new configuration parameter setting, in certain embodiments, may incur overhead, increase latency of a storage operation, or the like. Continuing to use a current configuration parameter setting without reconfiguring the set of storage cells when a target setting is close to the current setting (e.g. within a threshold range) may remove the overhead or latency, thereby reducing a performance or latency impact of managing and adjusting configuration parameters.

The adjustment threshold module 514, in certain embodiments, may use different threshold ranges for different sets of pages, different abodes/storage states, or the like, customizing the threshold ranges. In one embodiment, the configuration parameter module 504 may determine a threshold range for the adjustment threshold module 514 as a configuration parameter based on one or more media characteristics, or the like. For example, a set of storage cells, abode, or the like that is more prone to errors, leakage, interference, with a higher RBER, or the like may have a smaller, narrower threshold range for adjustments than a set of storage cells, abode, or the like that is less prone to errors, leakage, interference, with a lower RBER, or the like. In certain embodiments, the configuration parameter module 504 and/or the cell configuration module 506 may override a threshold range of the adjustment threshold module 514 based on a storage media characteristic, a background scan, or the like.

In one embodiment, the sparse adjustment module 516 cooperates with the configuration parameter module 504, the cell configuration module 506, and/or the adaptive configuration module 512 to use a default configuration parameter setting for a set of storage cells until the non-volatile memory media 110 and/or the set of storage cells satisfy an age threshold. The default configuration parameter setting may include an initial setting, a previous setting, a current setting, a manufacturer recommended setting, or other default setting. The age threshold may be a predetermined program/erase count, a predetermined error rate, a predetermined temporal age, a predetermined powered-on time, or the like for the non-volatile memory device 102, the non-volatile memory media 110, and/or the set of storage cells.

The age threshold, in one embodiment, may be selected such that errors that occur prior to the age threshold being reached are minimal, correctable using ECC data, or the like. For example, in certain embodiments, the age threshold may be selected based on a number of bit errors that the ECC module 412 is configured to correct, so that the cell configuration module 506 does not adjust or reconfigure one or more configuration parameters during a period when an ECC of the ECC module 412 is sufficient to correct errors that are likely to occur. The configuration parameter module 504, in a further embodiment, may determine different age thresholds for different storage regions, sets of pages, abodes, or the like. In certain embodiments, the likelihood of errors, read disturb, voltage drift, and the like increases as the non-volatile memory media 110 ages. By using a default configuration parameter until the age threshold is satisfied instead of reconfiguring storage cells with new, adjusted configuration parameter settings, the sparse adjustment module 516 may remove or minimize the overhead and latency associated with reconfiguring the storage cells, while errors are typically infrequent and correctable.

In one embodiment, the backstop module 518, in cooperation with the adaptive configuration module 512 or the like, increases a frequency of storage capacity recovery operations, such as garbage collection or grooming, for at least a subset of the non-volatile memory media 110 over time. For example, the backstop module 518 may decrease the data refresh interval over time to combat the effects of read disturb as described above with regard to the adaptive configuration module 512. In one embodiment, the configuration parameter module 504 may determine a data refresh interval for a set of storage cells as a configuration parameter based on media characteristics for the set of storage cells, such that different sets of storage cells have different storage capacity recovery frequencies.

In this manner, in certain embodiments, the backstop module 518 may provide variable grooming, garbage collection, or other storage capacity recovery thresholds or frequencies overtime as the non-volatile memory media 110 ages. In one embodiment, the backstop module 518 may manage a single frequency of storage capacity recovery operations for the entire non-volatile memory device 102. In a further embodiment, the backstop module 518 may manage frequencies of storage capacity recovery operations individually for logical or physical erase blocks of the non-volatile memory media 110. The backstop module 518, in another embodiment, may manage frequencies of storage capacity recovery operations by group or set of logical or physical erase blocks of the non-volatile memory media 110.

Increasing the frequency of storage capacity recovery operations, in certain embodiments, ensures that configuration parameter settings for storage cells of the non-volatile memory media 110 are not adjusted beyond a backstop value. For example, in some embodiments, the non-volatile memory media 110 may become more susceptible to the effects of read disturb over time, in some cases by a factor of ten or more. Instead of adjusting a configuration parameter such as a read voltage threshold further and further over time to compensate for the increasing effects of read disturb, by increasing the frequency of storage capacity recovery options, the backstop module 518 places a backstop value or cap on the configuration parameter adjustments used. Providing a backstop value or cap, in certain embodiments, may decrease bit errors, make data storage more reliable, or the like.

FIG. 6A is a schematic block diagram illustrating one embodiment of an array 600 of N number of storage elements 606. In the depicted embodiment, an ECC chunk 616 includes data 612 from several storage elements 606. In a further embodiment, ECC checkbits for the ECC chunk 616 are also stored across several storage elements 606.

The array 600 of storage elements 606, in one embodiment, includes N number of storage elements 606a, 606b, 606c, . . . 606n. Each storage element 606 may comprise a device, a chip, a portion of a chip, a die, a plane in a die, or the like. In the depicted embodiment, the storage elements 606a-n form a bank 602a. The array 600, in one embodiment, includes several banks 602a . . . 602m. The banks 602a-m, in the depicted embodiment, include several channels 604a, 604b, 604c, . . . , 604n. In one embodiment, a packet or data set is written across the several channels 604a-n and data is read separately from each channel 604a-n and reassembled into the packet. In another embodiment, an ECC chunk 616, packet, or data set is written across the several channels 604a-n and data is read in parallel from all the channels 604a-n. One read operation on a bank 602a may read a whole ECC chunk 616, packet, or data set or a portion of an ECC chunk 616, packet, or data set that is reassembled into a whole ECC chunk 616, packet, or data set. In the depicted embodiment, each channel includes at least one storage element 606 in each bank 602.

Furthermore, in one embodiment each storage element 606 includes a physical erase block or "PEB" 608. For example, storage element one 606a includes PEB one 608a. A physical erase block is typically an erase block located on one die, chip, or other storage element 606. Each PEB 608 includes m physical pages 610. For example, PEB one 608a includes page 0 610a . . . page m 614a, PEB 2 608b includes page 0 610b . . . page m 614b, PEB 3 608c includes page 0 610c . . . page m 614c, and PEB m 608m includes page 0 610m . . . page m 614m. Each physical page 610a stores a portion of data ("D 0, D 1, . . . , D m") 612 and ECC checkbits distributed with the data 612.

In one embodiment, a group of PEBs (PEB 1 608a-PEB m 608m) forms a logical erase block ("LEB"). An LEB may span the array of N storage elements 600. In certain embodiments, an LEB is sized to fit within a bank 602a-m, with one PEB 608a-m from each storage element 606a-n or the like. In other embodiments, a LEB may span different banks 602a-m and may include one or more PEBs 608a-m from multiple banks 602a-m. Furthermore, in an embodiment, a logical page ("LP") spans a plurality of physical pages 610 in a row. In another embodiment a logical page spans N storage elements 606a-n.

In one embodiment, the ECC is a block code that is distributed with the data. Furthermore, the data and the ECC may not align with any particular physical hardware boundary. As a result, error correction with the ECC codes is not dependent on a particular hardware configuration. Therefore, the ECC and corresponding data may form an ECC chunk 616 and the ECC chunk 616 may be divided and stored on one or more of the N storage elements 606a-n. An ECC chunk 616 typically spans at least a portion of a plurality of physical pages 610 of a logical page where the data and ECC generated from the data 612a, 612b, . . . 612m are spread across the N storage elements 606a-n. In one embodiment, a LP includes a plurality of ECC chunks 616. A physical page 610 may contain one or more data bytes of the ECC chunk 616. An ECC chunk 616 may span multiple rows within a physical page 610 and a physical page 610 may include a plurality of ECC chunks 616.

Because, in the depicted embodiment, the ECC checkbits for the ECC chunk 616 are distributed across several storage elements 606a-n and channels 604a-n, when a data error occurs due to a read voltage shift in one or more of the storage elements 606a-n, the ECC module 412 may not be able to determine which storage elements 606 have an error that is correctable by adjusting the read voltage threshold. In one embodiment, the distribution module 414 determines which storage elements 606 or channels 604 have data with a read bias that is outside an expected distribution of the known bias, and the configuration module 352 adjusts the read voltage thresholds of the storage elements 606 determined by the distribution module 414.

In one embodiment, the deviation module 404, the ECC module 412, and/or the distribution module 414 determines that a data set has an error or a read bias that deviates from the known bias, and the data set source module 422 determines from which storage element 606 the data set was read. For example, in one embodiment, the array 600 may have 24 channels 604, and 8 bytes may be read in parallel from 24 storage elements 606 of a single bank 602 during a read operation for a total of 192 bytes per read operation. Based on this information, the data set source module 422, in one embodiment, can determine from which storage element 606 a data set was read based on the position of an 8 byte data set within the 192 bytes. In one embodiment, the 192 bytes comprise the ECC chunk 616.

By comparing read biases of data from each of the channels 604a-n to the known bias, the configuration module 352 can correct data errors that occur due to changes in read voltages for particular channel(s) even without the use of ECC checkbits. Without comparing the read biases of data from the channels 604a-n to the known bias, adjustment of the read voltage thresholds would require a large number of trial-and-error tests adjusting and testing every possible read voltage threshold adjustment for each possible combination of channels 604a-n. By comparing the read biases of data from the channels 604a-n to the known bias, the configuration module 352 can determine exactly which channel 604 to adjust. By determining the direction of deviation for those channels, the configuration module 352 further decreases the search space for the read voltage thresholds for those channels by half.

To illustrate the potential size of the search space for a suitable adjusted read voltage threshold, suppose an ECC chunk 616 (e.g., ECC code word—comprising both data and the corresponding ECC checkbits) is stored on the storage elements 606a-606n. Further suppose that the storage elements 606a-606n in a row of the array 600 that stores the ECC chunk 616 each have an independent adjustable read voltage threshold. For example, in one embodiment, the number of different combinations of read voltage threshold settings for the array 600 with η channels 604a-n, λ number of levels at which the read voltage threshold can be set per channel, and x number of channels that have a read voltage threshold that needs to be adjusted is given by equation 1:

$$f(x, \eta, \lambda) = \binom{\eta}{x} \cdot \lambda^x \qquad (1)$$

The number of different combinations of read voltage threshold settings for the array 600 with all permutations of up to η channels 604a-n, in one embodiment is given by equation 2:

$$g(x,\eta,\lambda)=\Sigma_{i=1}^{x} f(i,\eta,\lambda) \qquad (2)$$

Using equation 1, for example, if there are twenty-four channels 606a-n (η=24), eight possible read voltage threshold settings for each channel 606 (λ=8), and only two of the twenty-four channels 606a-n have read voltage thresholds that need to be adjusted (x=2), there are 17,644 total different combinations of read voltage threshold settings. If the number of channels 606 with read voltage thresholds that need adjusting increases to three, the number of different combinations increases to 1,036,288. The configuration module 352 drastically reduces these numbers by detecting which channels 606a-n have read voltage thresholds that need adjusting. In addition, comparing the known bias of the data on the media in a storage grouping to the current bias indicates the direction to adjust the read voltage thresholds. Knowing the direction in which to adjust the read voltage threshold greatly reduces the search space for a suitable voltage in the channels known to have a data error.

Consequently, the number of combinations that may need to be attempted changes from 17,644 where x=2 to 32 and from 1,036,288 where x=3 to 256, because the configuration module 352 uses the known bias to determine which channels have read voltage thresholds that need adjusting and the direction of the adjustment. However, each of these combinations may not need to be tried because as the adjustments are iteratively made, the known bias of the data continues to indicate which direction to make each subsequent adjustment, potentially cutting the search space at least in half with each iteration. Various search algorithms can be used to quickly identify a suitable adjusted read voltage threshold. (e.g., a binary search).

FIG. 6B is a schematic block diagram illustrating one embodiment of an array 650 of N storage elements 606. The array 650, in the depicted embodiment, is substantially similar to the array 600 of FIG. 6A, but with the ECC chunk 652 including data 612a in a single storage element 606a, instead of across several storage elements 606a-n. In one embodiment, ECC checkbits for the ECC chunk 652 are stored in the single storage element 606a. Because each storage element 606a-n or channel 604a-n has separate ECC checkbits, in one embodiment, the ECC module 412 uses the separate ECC checkbits to determine in which storage elements 606a-n or channels 604a-n an error has occurred, and the configuration module 352 adjusts the read voltage thresholds of the particular storage element(s) 606 determined by the ECC module 412.

Figure 6C:
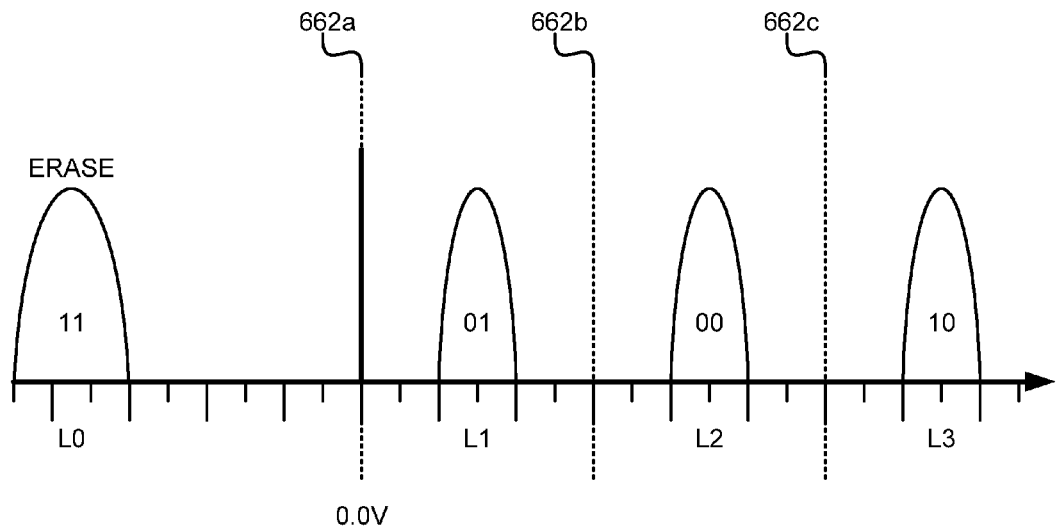
FIG. 6C is a schematic block diagram illustrating one embodiment of configuration parameters for a set of multi-level storage cells of non-volatile memory media.

FIG. 6C shows one embodiment of configuration parameters 662a-c for a set of multi-level storage cells, such as MLC NAND flash storage cells, or the like, with an example encoding or programming model. Any limitations inherent in the represented encoding model do not necessarily apply to all other encoding models, and the present disclosure should not be construed as inherently containing any such limitations. The read voltage states, in the depicted embodiment, are encoded using a Gray code encoding model, with binary values for adjacent states differing by a single bit in the encoding.

FIG. 6C shows that the value "11" is associated with the lowest read voltage state (labeled L0, an "erase" state), the value "01" is associated with the next lowest read voltage state (labeled L1), the value "00" is associated with the next highest read voltage state (labeled L2), and the value "10" is associated with the highest read voltage state (labeled L3). In FIG. 6C, the lowest read voltage state L0 is depicted as a negative voltage below the depicted 0.0V. Values, magnitudes, sizes, and the like of read voltages may vary by manufacturer and type of non-volatile memory cell, each of which are encompassed by the present disclosure. The configuration parameters 662, in the depicted embodiment, are read voltage thresholds 662 that separate states L0, L1, L2, and L3, as described above.

The non-volatile memory controller 104 interprets the four discrete levels of voltage stored in the multi-level storage cell as representing two binary bits one represented by a most significant bit (MSB) in the cell encoding and one represented by a least significant bit (LSB) in the cell encoding. As explained above, other programming and encoding models may be used. Also, certain non-volatile memory media 110 may have more than four possible states, allowing more than two binary values to be stored in a single multi-level storage cell. The voltage levels L0, L1, L2, and L3 may or may not be contiguous; for example, in certain embodiments, the voltage levels are separated by band gaps known as guard band. For example, L0 and L1 may be separated by 0.3V.

In one embodiment, the LSB corresponds to a lower page of data and the MSB corresponds to an upper page of data. In certain embodiments, the multi-level storage cell may adhere to a two-phase programming model, described below, which requires that the LSB be written to before the MSB can be written or vice versa. In another embodiment, the LSB and MSB may be programmed separately by the non-volatile memory controller 104. Such an approach may be taken due to vendor or manufacturer requirements for page pairing (e.g., a LSB bit of MLC cell is paired with an MSB bit of a different MLC cell) and page addressing (e.g., LSB page must be programmed before the MSB page or vice versa). In certain instances, the LSB must be written before the MSB is written, the MSB must be written before the LSB is written, or the like.

In certain embodiments, the non-volatile memory media 110 may employ a two-phase programming model. In such a model, a binary value is first written to the LSB by way of a first write command to the lower page. The write command causes the multi-level storage cell to move from its initial state (for example, a 11 state in L0) to an intermediate state (the lower-to-middle LM state—between L1 and L2) configured such that a 00 state is subsequently read. For example, writing a "0" to the lower page causes the multi-level storage cell to change from the L0 state (where both the LSB and the MSB are 1) to the L2 state (where the LSB is changed to a 0). A subsequent write of a "0" to the upper page moves the multi-level storage cell from the intermediate state (typically between the L1 state and the L2 state) to L2 state such that both bits of the MLC are "0". Thus, in such an embodiment, two writes (one to the lower page and one to the upper page) are needed to move the multi-level cell from L0 to L2, since the cell transitions through the intermediate state and the MLC device requires that the lower page be programmed before the upper page and does not allow partial programming of a page without an intervening erase operation. Writing a "1" to either of the upper page or lower page will cause the MLC to transition to either L1 or L3 depending on the binary value of the lower page at the time. In addition, certain non-volatile memory media vendors may impose a requirement that the lower page must be written to before the upper page, or the like. In other embodiments, the non-volatile memory media 110 may employ a two-phase programming model where a binary value is first written to the MSB by way of a first write command to the upper page.

In certain embodiments, the configuration parameter module 504 determines and manages read voltage thresholds 662 or other configuration parameters individually for one or more of the abodes L0, L1, L2, L3, determining different settings or adjustments to configuration parameters in different abodes L0, L1, L2, L3. In one embodiment, the configuration module 352 adjusts one or more read voltage thresholds 662 based on a subset of binary data that multi-level storage cells store, such as just an upper page, just a lower page, or the like. In such embodiments, examining the state changes for the LSB bit(s) indicate the direction the voltage in the multi-level storage cell is changing. For both Gray code encoding (as depicted in FIG. 6C) and binary code encoding of bit values, the LSB of a multi-level storage cell transitions between a binary zero and a binary one between the middle two abodes or states, the L1 state and the L2 state in the depicted embodiment.

For other encoding models, the MSB may transition between a binary zero and a binary one between the middle two abodes or states, or the like. For Gray code or binary code encoding models, the LSB has a value of "1" for read voltages in a lower range (including the lower two states or abodes, L0 and L1) and the LSB has a value of "0" for read voltages in an upper range (including the upper two states or abodes, L2 and L3). By using just the LSB of MLC storage cells to determine whether a read bias deviates from a known bias, the configuration module 352, in one embodiment, may make the determination in a substantially similar manner to determining whether a read bias for SLC storage cells deviates from a known bias, by counting or tallying binary ones and/or binary zeroes of an LSB data set, or the like.

For certain types of multi-level storage cells, the middle read voltage threshold 662b and the adjacent L1 and L2 states may be more sensitive to read disturb or other factors that can cause read voltages to drift. Further, as described above, in certain embodiments, the LSB and the MSB of a single multi-level storage cell may represent data stored in different physical pages. Using a single bit from each of a plurality of multi-level storage cell as a data set, in one embodiment, may reduce a number of read operations to retrieve the data set. In other embodiments, use of a single bit from each of a plurality of multi-level storage cells in the lower page simplifies a process of detecting a deviation and direction of a read bias from a known bias for multi-level storage cells.

In one embodiment, the direction module 406 determines a direction of deviation for a grouping of multi-level storage cells based on a data set that includes data from one or more lower pages of the multi-level storage cells. Because the lower pages include the LSBs, in certain embodiments, the direction module 406 determines that a read voltage threshold 662 deviates toward a larger read voltage in response to a difference between a read bias for the lower pages and a known bias for the lower pages indicating that storage cell values for the LSBs have transitioned from a binary one to a binary zero. For an LSB to transition from a binary one to a binary zero, a read voltage for a multi-level storage cell using the encoding model of FIG. 6C must drift from either an L0 or L1 state to an L2 or L3 state, indicating that one or more of the read voltage thresholds 662 should be increased, to place the read voltage back in the original L0 or L1 state.

Similarly, in certain embodiments, the direction module 406 determines that a read voltage threshold 662 deviates toward a smaller read voltage in response to a difference between a read bias for the lower pages and a known bias for the lower pages indicating that storage cell values for the LSBs have transitioned from a binary zero to a binary one. For an LSB to transition from a binary zero to a binary one, a read voltage for a multi-level storage cell using the encoding model of FIG. 6C must drift from either an L3 or L2 state to an L1 or L0 state, indicating that one or more of the read voltage thresholds 662 should be decreased, to place the read voltage back in the original L3 or L2 state. In certain embodiments, a deviation across multiple states may be unlikely, and deviations detectable using LSBs may be between the L1 and L2 states, indicating a clear direction of deviation in either direction.

In another embodiment, the direction module 406 determines a direction of deviation based at least partially on an encoding type used for storage cells of the non-volatile memory media 110, a physical and/or electrical architecture of the storage cells of the non-volatile memory media 110, or the like. For example, based on the encoding model of FIG. 6C, the direction module 406 may determine a direction of deviation based on a 2-bit MLC media type, based on whether the data set includes an upper page or a lower page, based on the depicted Gray code encoding type, based on a magnitude of the determined deviation, or the like. In a further embodiment, the direction module 406 may transform or combine LSBs and MSBs from separate or disparate addresses, such as different physical pages or the like, into a single data set or may otherwise coordinate LSBs and MSBs to determine a direction of deviation.

Using each bit stored in multi-level storage cells to determine a read voltage threshold adjustment, in certain embodiments, can increase the accuracy of the read voltage threshold adjustment, but may increase the number of read operations or add complexity to the determination. In one embodiment, if the ECC decoder 322 detects a data error in an upper page of a grouping of multi-level storage cells, the data set read module 402 retrieves one or more lower pages for the grouping and the configuration module 352 adjusts a read voltage threshold for the grouping based on the lower pages.

Figure 6D:
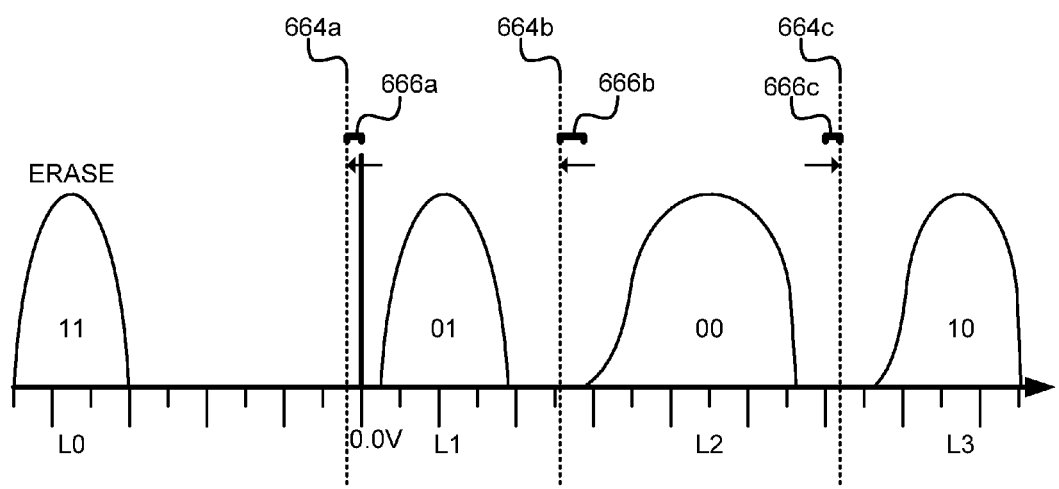
FIG. 6D is a schematic block diagram illustrating one embodiment of adjusted configuration parameters for a set of multi-level storage cells of non-volatile memory media.

FIG. 6D depicts one embodiment of adjusted configuration parameters 664a-c for a set of multi-level storage cells of non-volatile memory media 110. In certain embodiments, the configuration parameters 662a-c of FIG. 6C are default configuration parameters, set by a manufacturer, a vendor, or the like and the configuration module 352 and/or the proactive configuration module 424 adjust or configure the default configuration parameters 662a-c to the adjusted configuration parameters 664a-c. The configuration parameter module 504, in one embodiment, determines different adjustments 666a-c to the default configuration parameters 662a-c resulting in the different adjusted configuration parameters 664a-c. In the depicted embodiment, the configuration parameter module 504 determines the different adjustments 666a-c individually for the different abodes L0, L1, L2, L3, with different magnitudes, different directions, and the like, customizing the different adjusted configuration parameters 664a-c individually to media characteristics of the different abodes L0, L1, L2, L3.

The adjusted configuration parameters 664a-c more closely match the actual distributions of storage cell states of FIG. 6D than do the default configuration parameters 662a-c. Were a corresponding set of storage cells to use the default configuration parameters 662a-c with the distributions of storage cell states of FIG. 6D, the portions of the distributions that have drifted past the locations of the default configuration parameters 662a-c would register data errors. Similarly, because the charge levels of the different abodes L0, L1, L2, L3 have drifted, leaked, been disturbed, or the like by different amounts and in different directions, using the same adjustment 664 for each abode L0, L1, L2, L3, in certain embodiments, may register data errors. By configuring the corresponding set of storage cells to use the individually adjusted configuration parameters 664a-c, the configuration module 352 and the configuration parameter module 504 prevent, avoid, or correct the potential data errors.

In one embodiment, the configuration module 352 determines the adjusted configuration parameters 664a-c reactively using the deviation module 404, the direction module 406, the adjustment module 408, or the like, as described above. In another embodiment, the configuration module 352 determines the adjusted configuration parameters 664a-c proactively using the proactive configuration module 424, the media characteristic module 502, and the configuration parameter module 504, based on media characteristics for a corresponding set of storage cells, as described above.

Figure 6E:
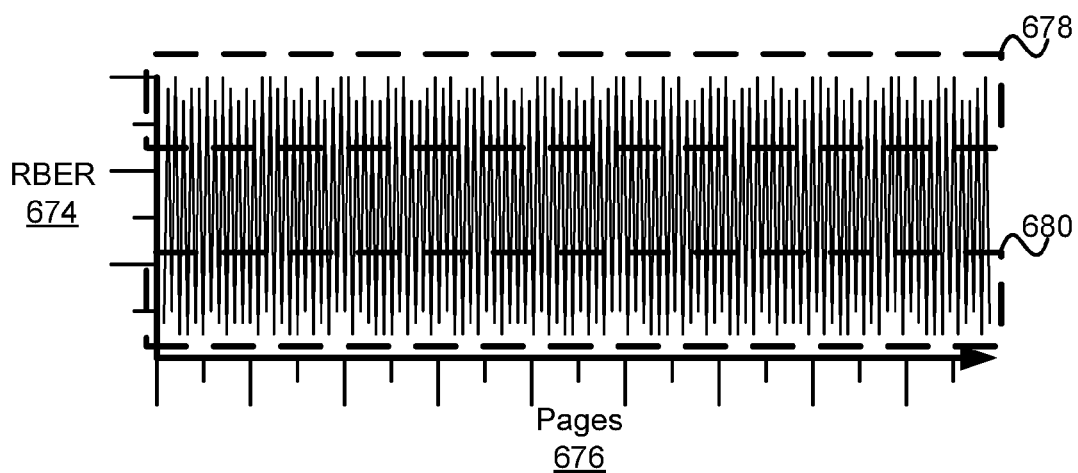
FIG. 6E is a graph illustrating one embodiment of a bit error rate and sets of pages.
Figure 6F:
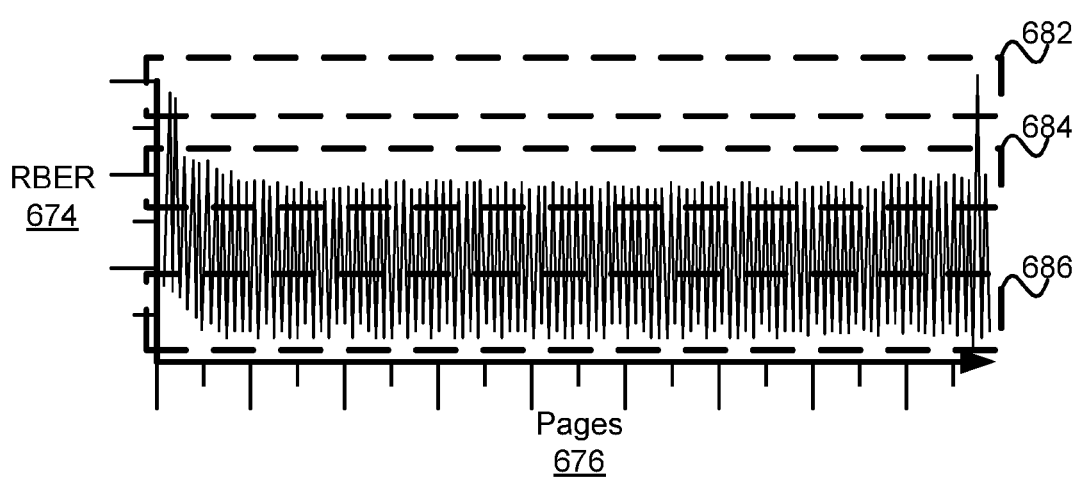
FIG. 6F is a graph illustrating another embodiment of a bit error rate and sets of pages.

FIG. 6E depicts one embodiment of raw bit error rates ("RBERs") 674 for pages 676 after a retention time has passed. In the graphs of FIGS. 6E through 6F, the peaks or extremities of the waveforms represent the RBER 674 for a page 676, as the RBERs 674 alternate or oscillate between even and odd pages 676, upper (e.g. MSB) and lower (e.g. LSB) pages 676, or the like, in the depicted embodiments. Certain non-volatile memory media 110, such as all-bit-line media, may have RBERs 674 that vary between upper and lower pages 676 but not between even and odd pages 676. Other non-volatile memory media 110 may have RBERs 674 that vary for both upper and lower pages 676 and for even and odd pages 676, just for even and odd pages 676, or the like. In further embodiments, RBERs 674 for pages 676 may be substantially smooth, with little or no oscillation between pages 676.

The pages 676 of FIG. 6E are grouped into a first set 678 of pages 676 and a second set 680 of pages 676 based on the RBERs 674 of the pages 676. In the embodiment depicted in FIG. 6E, the first set 678 of pages 676 have higher RBERs 674 than the second set 680 of pages 676. The first set 678 of pages 676, for example, may include even pages with higher RBERs 674 than odd pages in the second set 680 of pages 676, or vice versa. Even pages may have higher RBERs 674 than odd pages, or vice versa, due to the effects of program disturb or the like. In another embodiment, the first set 678 of pages 676, for example, may include upper pages of multi-level storage cells with higher RBERs 674 than lower pages of the multi-level storage cells in the second set 680 of pages 676, or the like. The media characteristic module 502 may reference, determine, or maintain different media characteristics for the different sets 678, 680 of pages 676 and the configuration parameter module 504 may determine different configuration parameter settings for the different sets 678, 670 of pages 676 based on the different media characteristics, such as the different RBERs 674 or the like.

FIG. 6F depicts another embodiment of RBERs 674 for pages 676 after a retention time has passed. In FIG. 6F, the pages 676 are grouped into a first set 682 of pages 676, a second set 684 of pages 676, and a third set 686 of pages 676 based on the RBERs 674 of the pages 676. The RBERs 674 for the pages 676 in the embodiment of FIG. 6F are substantially similar to the embodiment of FIG. 6E, except one or more pages 676 toward each end of the pages 676 have higher RBERs 674.

In FIG. 6F, the one or more pages 676 toward each end of the pages 676 with the highest RBERs 674 are part of the first set 682. In certain embodiments, the pages 676 of the first set 682 may comprise one or more pages toward a first end of the upper pages of multi-level storage cells and one or more pages toward a second end of the upper pages, such as the first two upper pages and the second-to-last upper page, or the like. The second set 684 of pages 676 may include the rest of the upper pages, while the third set 686 of pages 676 may include the lower pages of the multi-level storage cells, or the like. The media characteristic module 502 may reference, determine, or maintain different media characteristics for the different sets 682, 684, 686 of pages 676 and the configuration parameter module 504 may determine different configu-ration parameter settings for the different sets 682, 684, 686 of pages 676 based on the different media characteristics, such as the different RBERs 674 or the like.

Figure 6G:
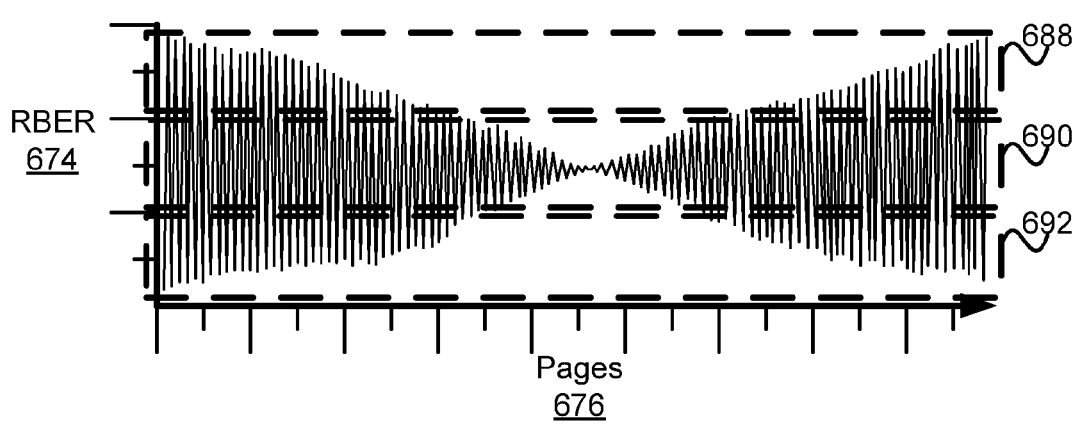
FIG. 6G is a graph illustrating a further embodiment of a bit error rate and sets of pages.

FIG. 6G depicts another embodiment of RBERs 674 for pages 676 after a retention time has passed. The pages 676 of FIG. 6G are grouped into a first set 688 of pages 676, a second set 690 of pages 676, and a third set 688 of pages 676 based on the RBERs 674 of the pages 676. The RBERs 674, in the embodiment depicted in FIG. 6G, have a teeter-totter configuration and the pages 676 are chopped or divided into the sets 688, 690, 692 of pages 676 based on contiguous ranges of RBERs 674. The depicted sets 688, 690, 692 of pages 676, in further embodiments, may be subdivided into additional sets of pages 676, and the configuration parameter module 504 may determine different configuration parameters for the additional subdivided sets. For example, the pages 676 toward the middle of the set 690, at the center of the depicted teeter-totter configuration, may comprise a separate set of pages 676 for which the configuration parameter module 504 determines a different configuration parameter or the like. In certain embodiments, the configuration parameter module 504 may use an average RBER 674 for the pages 676 of a set 688, 690, 692 to determine a configuration parameter for the pages 676 of the set 688, 690, 692.

The example embodiments depicted in FIGS. 6E, 6F, and 6G are for purposes of illustration and are non-limiting. The RBERs 674 for pages 676 may vary based on vendor, architecture and geometry of the non-volatile memory media 110, usage patterns, or the like, and other embodiments may have different amounts of sets of pages, different configurations for sets of pages, or the like.

Figures 7A, 7B:
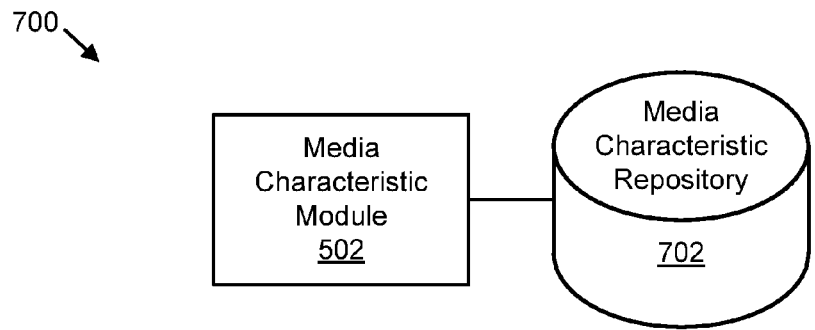
FIG. 7A is a schematic block diagram illustrating one embodiment of a media characteristic module and a media characteristic repository.
FIG. 7B is a schematic block diagram illustrating one embodiment of a media characteristic repository.

FIG. 7A depicts one embodiment of the media characteristic module 502 and a media characteristic repository 702. In the depicted embodiment, the media characteristic module 502 stores and maintains media characteristics for a plurality of different sets of storage cells in a media characteristic repository 702. The media characteristic repository 702 stores entries reciting media characteristics for sets of storage cells of the non-volatile memory media 110. The media characteristic repository 702 may be embodied by one or more of a table, a matrix, an array, a database, a file, or another data structure that stores media characteristics.

The media characteristic module 502 may store the media characteristic repository 702 in one or more of a metadata area of the non-volatile memory media 110, in volatile memory of the non-volatile memory device 102 and/or of the computer 112, in a configuration file for the non-volatile memory device 102 stored in other non-volatile storage of the computer 112, in dedicated non-volatile storage of the non-volatile memory device 102, or the like. The media characteristic module 502 may store the media characteristic repository 702 and/or media characteristics in a single location, or may divide storage between multiple locations.

For example, in one embodiment, the media characteristic module 502 may access static media characteristics such as a make, a model, a manufacturer, a product version, or the like for the non-volatile memory device 102 and/or the non-volatile memory media 110 from nonvolatile storage of the non-volatile memory device 102, such as in a programmable read only memory ("PROM") or the like that is programmed by a manufacturer or vendor. The media characteristic module 502 may store dynamic media characteristics, such as a program/erase cycle counts, read counts, retention times, temperatures, use cases, error statistics, and the like in volatile memory of the non-volatile memory device 102 and/or of the computer 112, metadata on the non-volatile memory media 110, or the like. If the media characteristic module 502 stores at least a portion of the media characteristic repository 702 in volatile memory, in certain embodiments, the media characteristic module 502 may periodically save data of the media characteristic repository 702 to the non-volatile memory media 110 or to other nonvolatile storage so that the media characteristic module 502 may rebuild a media characteristic repository 702 in response to a power failure, an improper shutdown, or the like.

FIG. 7B depicts another embodiment of the media characteristic repository 702. The media characteristic repository 702 includes a plurality of entries 708 for sets of storage cells. The sets of storage cells, in the depicted embodiment, are organized by storage region 706, with an entry 708 in the media characteristic repository 702 for each storage region 706 from LEB 0 through LEB N. While the storage regions 706 in the depicted embodiment are illustrated as logical erase blocks LEB 0 through LEB N, as described above, in other embodiments, a storage region 706 may include a physical erase block, a page (logical or physical), a set of pages, an ECC chunk/codeword, a division within a page, a storage state of a storage cell, an abode of a storage cell, a die, a plane in a die, a chip, or the like.

Each entry 708 further includes media characteristics 704 for the corresponding storage region 706. The media characteristics 704, in the depicted embodiment, include a program/erase ("P/E") cycle count 704a, a read count 704b, a retention time 704c, a temperature 704d, and a bit error rate 704e. The characteristic update module 508 may cooperate with the media characteristic module 502 to update the media characteristic repository 702 as described above.

In the depicted embodiment, the P/E cycle count 704a varies between 0.7 k and 2.0 k, (i.e., between 700 and 2000, "k" representing 1000). Similarly, the read count 704b varies between 0.5 k and 4.1 k (i.e., between 500 and 4100). The retention time 704c varies from 10 min (minutes) to 100 min, and the temperature 704d varies from 43° C. (degrees Celsius) to 48° C. Lastly, the bit error rate 704(e) varies between 9.7E-5 (9.7 times 10 to the −5th power or 0.000097) and 2.5E-4 (2.5 times 10 to the −4th power or 0.00025). The depicted storage media characteristics 704 are representative examples, and are not limiting; in light of this disclosure it is clear that storage media characteristics 704 outside the depicted ranges are possible, as well as other types of storage media characteristics 704 not depicted in FIG. 7B.

Figures 8A, 8B:
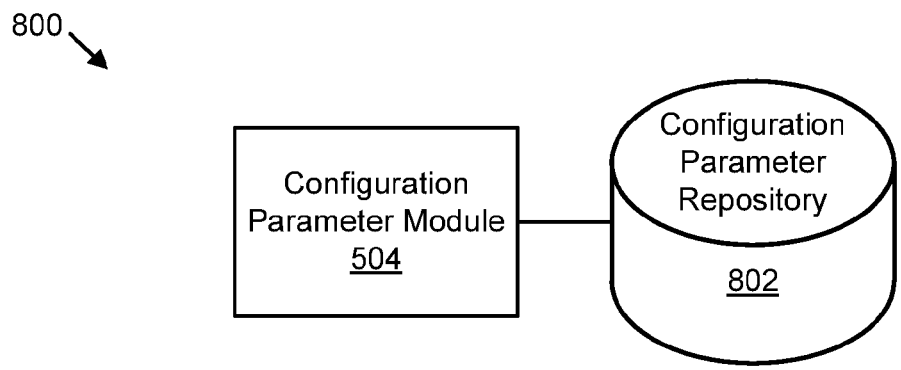
FIG. 8A is a schematic block diagram illustrating one embodiment of a configuration parameter module and a configuration parameter repository.
FIG. 8B is a schematic block diagram illustrating one embodiment of a configuration parameter repository.

FIG. 8A depicts one embodiment of the configuration parameter module 504 and a configuration parameter repository 802. In the depicted embodiment, the configuration parameter module 504 stores and maintains configuration parameters for a plurality of different sets of storage cells in a configuration parameter repository 802. In certain embodiments, the configuration parameter repository 802 may be integrated with the media characteristic repository 702 in a single repository 702, 802. The configuration parameter repository 802 stores entries reciting configuration parameters for sets of storage cells of the non-volatile memory media 110. The configuration parameter repository 802 may be embodied by one or more of a table, a matrix, an array, a database, a file, or another data structure that stores configuration parameters.

FIG. 8B depicts another embodiment of a configuration parameter repository 802. The configuration parameter repository 802 includes a plurality of entries 808 for sets of storage cells. The sets of storage cells, in the depicted embodiment, are organized by storage region 706, and the entries 808 correspond to storage regions 706 from LEB 0 through LEB N. Each entry 808 further includes configuration parameters 804 for the corresponding storage region 706.

The configuration parameters 804, in the depicted embodiment, include read voltage threshold adjustments 804a-c for read level R1 804a, read level R2 804b, and read level R3 804c, with each entry as a hexadecimal offset from default read voltage thresholds. For example, in the depicted embodiment, the read voltage threshold adjustments 804a-c vary between FAh (a hexadecimal number corresponding to decimal number −6, in a two's complement representation where "h" represents hexadecimal) and 05h (a hexadecimal number corresponding to decimal number 5), including values such as 01h, 02h, 04h, FEh, FCh, FDh, FAh, 03h, and 05h.

While the configuration parameters 804 in the depicted embodiment are illustrated as read voltage threshold adjustments, as described above, in other embodiments, configuration parameters 804 may include resistivity thresholds, write or program thresholds, erase thresholds, and/or other modifiable parameters of the non-volatile memory media 110. Further, the three configuration parameters 804a-c are provided by way of example and, in other embodiments, other amounts and types of configuration parameters may be included. For example, in one embodiment, certain 20 nm non-volatile memory media 110, or the like, may have ten different read voltage thresholds R1-R10, set using different registers or the like, and the configuration parameter module 504 may determine different values for R1-R10 for different sets, groups, storage regions, and/or different abodes/storage states. As described above, a configuration parameter 804 may include an absolute data value, an offset or adjustment to a data value, or another parameter. The configuration update module 510 may cooperate with the configuration parameter module 504 to update the configuration parameter repository 802 as described above.

Flow Chart

Figure 9:
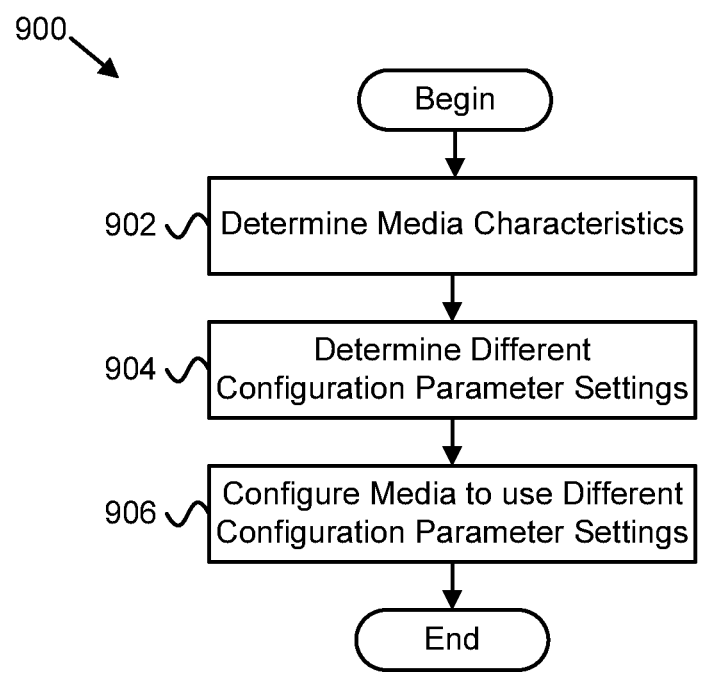
FIG. 9 is a schematic flow chart diagram illustrating one embodiment of a method for managing non-volatile media.

FIG. 9 depicts one embodiment of a method 900 for managing non-volatile memory media 110. The method 900 begins and the media characteristic module 502 references or otherwise determines 902 one or more media characteristics for non-volatile memory media 110, such as an erase block (logical or physical), a page (logical or physical), a set of pages, an ECC chunk/codeword, a division within a page, a storage state of a storage cell, an abode of a storage cell, a die, a plane in a die, a chip, or the like. The configuration parameter module 504 determines 904 different configuration parameter settings for different sets of pages, different abodes/storage states, or the like of the non-volatile memory media 110 to use the different configuration parameter settings and the method 900 ends.

Figure 10:
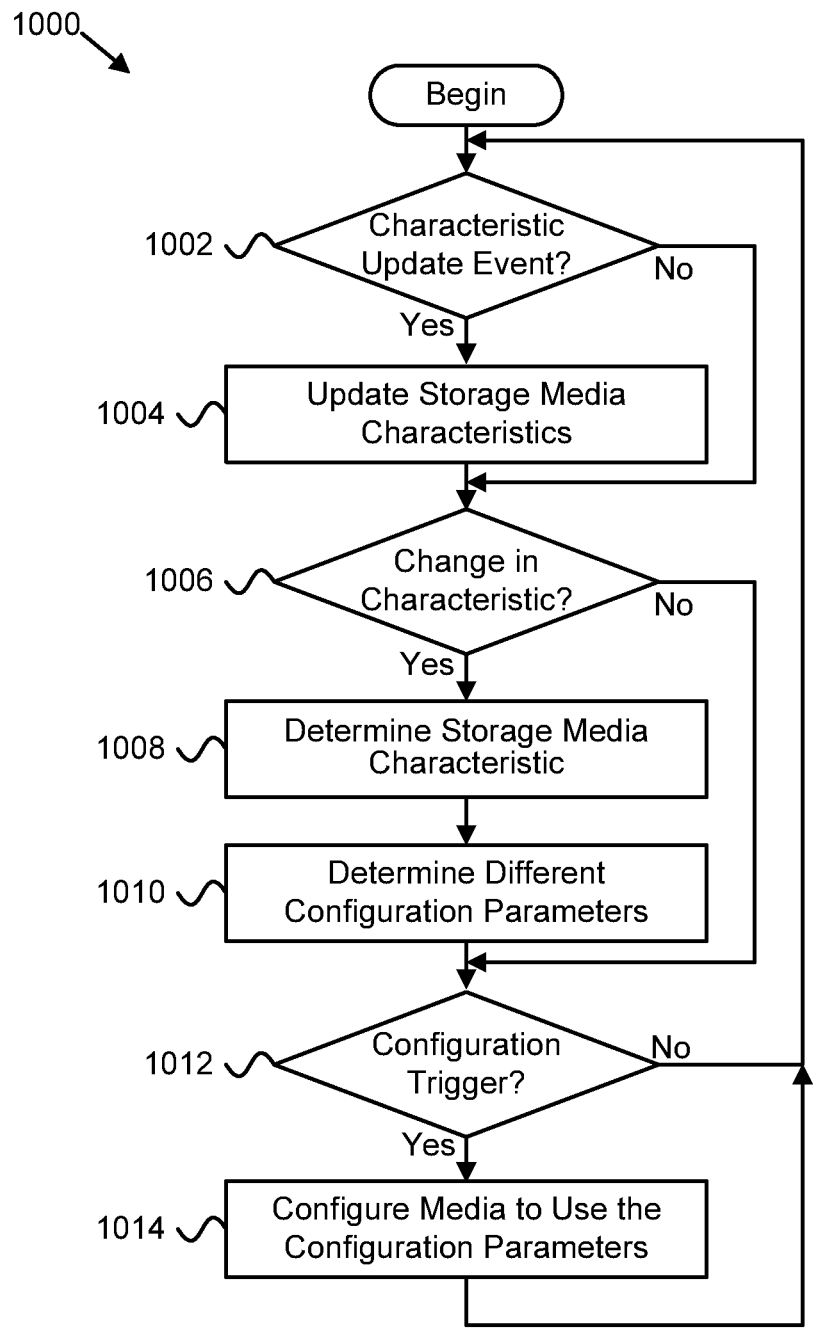
FIG. 10 is a schematic flow chart diagram illustrating another embodiment of a method for managing non-volatile media.

FIG. 10 depicts another embodiment of a method 1000 for managing non-volatile memory media 110. The method 1000 begins and the characteristic update module 508 determines 1002 whether or not an update event has occurred for a set of storage cells of the non-volatile memory media 110, such as an erase block (logical or physical), a page (logical or physical), a set of pages, an ECC chunk/codeword, a division within a page, a storage state of a storage cell, an abode of a storage cell, a die, a plane in a die, a chip, or the like. If the characteristic update module 508 determines 1002 that an update event has occurred, the characteristic update module 508 updates 1004 one or more media characteristics for the non-volatile memory media 110, in a media characteristic repository 702 or the like. If the characteristic update module 508 determines 1002 that an update event has not occurred, the characteristic update module 508 does not update 1004 the one or more media characteristics.

The configuration update module 510 determines 1006 whether or not there is a change in one or more media characteristics, due to the characteristic update module 508 updating 1004 the one or more media characteristics or the like. If the configuration update module 510 determines 1006 that there is a change in the one or more media characteristics, the media characteristic module 502 determines 1008 one or more media characteristics for the non-volatile memory media 110 and the configuration parameter module 504 and/or the configuration update module 510 determines 1010 different configuration parameters for different divisions of the non-volatile memory media 110, such as different erase blocks (logical or physical), pages (logical or physical), sets of pages, ECC chunks/codewords, abodes/storage states of storage cells, die, planes in a die, chips, or the like. If the configuration update module 510 determines 1006 that there is no change in the one or more media characteristics for the non-volatile memory media 110, the method 1000 skips the referencing 1008 step and the determining/updating step 1010.

The cell configuration module 506 determines 1012 whether or not a configuration trigger has occurred. If the cell configuration module 506 determines 1012 that a configuration trigger has occurred, the cell configuration module 506 configures 1014 the non-volatile memory media 110 to use the determined 1010 different configuration parameter settings and the method 1000 repeats. If the cell configuration module 506 determines 1012 that no configuration trigger has occurred, the method 1000 repeats.

A means for determining media characteristics for non-volatile memory media 110, in various embodiments, may include a non-volatile memory controller 104, a non-volatile memory device controller 202, a device factor module 354, an inverse bias module 332, an ECC decoder 322, a configuration module 352, a proactive configuration module 424, a media characteristic module 502, a characteristic update module 508, a media characteristic repository 702, other logic hardware, and/or other executable code stored on a computer readable storage medium. Other embodiments may include similar or equivalent means for determining media characteristics for non-volatile memory media 110.

A means for determining different configuration parameter settings for different sets of pages of non-volatile memory media 110 based on media characteristics, in various embodiments, may include a non-volatile memory controller 104, a non-volatile memory device controller 202, a configuration module 352, a direction module 406, an adjustment module 408, a proactive configuration module 424, a configuration parameter module 504, a configuration update module 510, an adjustment threshold module 514, a sparse adjustment module 516, a backstop module 518, a configuration parameter repository 802, other logic hardware, and/or other executable code stored on a computer readable storage medium. Other embodiments may include similar or equivalent means for determining different configuration parameter settings for different sets of pages of non-volatile memory media 110 based on media characteristics.

A means for configuring non-volatile memory media 110 to use the different configuration parameter settings for different sets of pages, in various embodiments, may include a non-volatile memory controller 104, a non-volatile memory device controller 202, a configuration module 352, an adjustment module 408, a write voltage module 416, a proactive configuration module 424, a cell configuration module 506, other logic hardware, and/or other executable code stored on a computer readable storage medium. Other embodiments may include similar or equivalent means for configuring non-volatile memory media 110 to use the different configuration parameter settings for different sets of pages.

A means for using a default setting for a set of pages in response to one or more of a target setting being within a threshold range of the default setting and the set of pages failing to satisfy an age threshold, in various embodiments, may include a non-volatile memory controller 104, a non-volatile memory device controller 202, a configuration module 352, a proactive configuration module 424, a configuration parameter module 504, a configuration update module 510, an adjustment threshold module 514, a sparse adjustment module 516, a backstop module 518, a configuration parameter repository 802, other logic hardware, and/or other executable code stored on a computer readable storage medium. Other embodiments may include similar or equivalent means for using a default setting for a set of pages in response to one or more of a target setting being within a threshold range of the default setting and the set of pages failing to satisfy an age threshold.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus to improve the utility of solid-state storage media, the apparatus comprising:
    a media characteristic module that references one or more storage media characteristics for a set of storage cells of solid-state storage media;
    a configuration parameter module that determines a configuration parameter for the set of storage cells based on the one or more storage media characteristics; and
    a storage cell configuration module that configures the set of storage cells to use the determined configuration parameter, wherein configuring the set of storage cells to use the determined configuration parameter comprises communicating with a device driver executing on a host device external to the apparatus.

2. The apparatus of claim 1, further comprising a characteristic update module that updates the one or more storage media characteristics for the set of storage cells in response to an update event.

3. The apparatus of claim 1, further comprising a configuration update module that updates the configuration parameter for the set of storage cells in response to a change in the one or more storage media characteristics.

4. The apparatus of claim 1, wherein the media characteristic module maintains the one or more storage media characteristics for the set of storage cells in a storage media characteristic repository comprising storage media characteristics for a plurality of different sets of storage cells of the solid-state storage media.

5. The apparatus of claim 1, wherein the configuration parameter module maintains the determined configuration parameter for the set of storage cells in a configuration parameter repository comprising configuration parameters for a plurality of different sets of storage cells of the solid-state storage media.

6. The apparatus of claim 1, wherein the one or more storage media characteristics comprise one or more of a program/erase cycle count for the set of storage cells, a read count for the set of storage cells, a retention time since a previous write for the set of storage cells, a temperature for the set of storage cells, a use case for the set of storage cells, and an error statistic for the set of storage cells.

7. The apparatus of claim 1, wherein the storage cell configuration module communicates with the device driver by calling an Application Programming Interface (API) of the device driver.

8. A system to improve the utility of solid-state storage media, the system comprising:
a solid-state storage device, the solid-state storage device comprising solid-state storage media;
a media characteristic module that references one or more storage media characteristics for a set of storage cells of the solid-state storage media;
a configuration parameter module that determines a configuration parameter for the set of storage cells based on the one or more storage media characteristics; and
a storage cell configuration module that configures the set of storage cells to use the determined configuration parameter,
wherein the storage cell configuration module uses an interface of the set of storage cells to configure the set of storage cells by communicating with a device driver installed on a host device in communication with the solid-state storage device.

9. The system of claim 8, wherein the storage cell configuration module communicates with the device driver by calling an Application Programming Interface (API) of the device driver.

10. A method to improve the utility of solid-state storage media comprised within a solid state storage device, the method comprising:
referencing one or more storage media characteristics for a set of storage cells of the solid-state storage media;
determining a configuration parameter for the set of storage cells based on the one or more storage media characteristics; and
configuring the set of storage cells to use the determined configuration parameter wherein the configuration parameter comprises a parameter of the set of storage cells modifiable by a module external to the solid-state storage device by way of an interface, wherein the module external to the solid-state storage device comprises a device driver executing on a host device.

11. The method of claim 10, further comprising updating the one or more storage media characteristics for the set of storage cells in response to an update event.

12. The method of claim 11, wherein the update event comprises one or more of a background scan of the solid-state storage media comprising the set of storage cells, a read request for the set of storage cells, a read request for neighboring storage cells of the set of storage cells, a startup operation for a device comprising the set of storage cells, a shutdown operation for a device comprising the set of storage cells, and a garbage collection operation for the set of storage cells.

13. The method of claim 10, further comprising updating the configuration parameter for the set of storage cells in response to a change in the one or more storage media characteristics.

14. The method of claim 10, further comprising determining a plurality of additional configuration parameters for a plurality of different sets of storage cells of the solid-state storage media based on storage media characteristics for the plurality of different sets of storage cells and configuring the plurality of different sets of storage cells to use the plurality of additional configuration parameters.

15. The method of claim 10, wherein the configuration parameter comprises a parameter of the set of storage cells modifiable by way of an interface, the configuration parameter selected from the group comprising a read voltage, a step magnitude for an incremental step pulse programming operation, a maximum number of iterations for an incremental step pulse programming operation, a program verify threshold for a program operation, an initial bias for an incremental step pulse programming operation, a step magnitude for an incremental step pulse erase operation, a maximum number of iterations for an incremental step pulse erase operation, an erase verify threshold for an erase operation, and an initial bias for an incremental step pulse erase operation.

16. The method of claim 10, wherein configuring the set of storage cells to use the determined configuration parameter further comprises configuring the set of storage cells to use the determined configuration parameter in response to a trigger.

17. The method of claim 16, wherein the trigger comprises one of, a change in the one or more storage media characteristics, a read request for the set of storage cells, a startup operation for a device comprising the set of storage cells, and a regular shutdown operation for a device comprising the set of storage cells.

18. The method of claim 10, wherein the one or more storage media characteristics comprise one or more of a program/erase cycle count for the set of storage cells, a read count for the set of storage cells, a retention time since a previous write for the set of storage cells, a temperature for the set of storage cells, a use case for the set of storage cells, and an error statistic for the set of storage cells.

19. The method of claim 10, wherein the determined configuration parameter is based on a target set of storage cells, the target set of storage cells having controlled use characteristics.

20. The method of claim 19, wherein the determined configuration parameter for the set of storage cells is based on one of a determined configuration parameter for the target set of storage cells and one or more storage media characteristics for the target set of storage cells.

21. The method of claim 19, wherein determining the configuration parameter for the set of storage cells comprises,
comparing the at least one of the one or more storage media characteristics for the set of storage cells to at least one storage media characteristic for the target set of storage cells; and
determining the configuration parameter for the set of storage cells based on a difference between the at least one storage media characteristic for the set of storage cells and the at least one storage media characteristic for the target set of storage cells.

22. The method of claim 10, wherein configuring the set of storage cells to use the determined configuration parameter comprises calling an Application Programming Interface (API) of the device driver.

23. The method of claim 10, further comprising the device driver modifying the configuration parameter of the set of storage cells.

24. The method of claim 10, wherein the referencing, determining and configuring are performed by a storage controller comprised within the solid-state storage media.

* * * * *